US011917888B2

(12) United States Patent
Cancel Olmo et al.

(10) Patent No.: US 11,917,888 B2
(45) Date of Patent: Feb. 27, 2024

(54) IN-DISPLAY SENSORS AND VIEWING ANGLE ADJUSTMENT MICROASSEMBLIES

(71) Applicant: Intel Corporation, Santa Clara, CA (US)

(72) Inventors: Ramon C. Cancel Olmo, Hillsboro, OR (US); Evrim Binboga, Pleasanton, CA (US); Vivek Paranjape, Portland, OR (US); Satish Prathaban, Beaverton, OR (US); Shantanu D. Kulkarni, Hillsboro, OR (US); Kunjal S. Parikh, Fremont, CA (US); Siddhartha Saxena, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/520,562

(22) Filed: Nov. 5, 2021

(65) Prior Publication Data
US 2022/0059625 A1 Feb. 24, 2022

Related U.S. Application Data

(63) Continuation of application No. 16/866,515, filed on May 4, 2020, now Pat. No. 11,211,433.

(51) Int. Cl.
G09G 5/00 (2006.01)
H10K 59/65 (2023.01)
(Continued)

(52) U.S. Cl.
CPC ............. *H10K 59/65* (2023.02); *G06F 3/01* (2013.01); *G06F 3/011* (2013.01); *H04N 5/89* (2013.01)

(58) Field of Classification Search
CPC ..... H01L 27/3234; H01L 27/146; H04N 5/89; G09G 2370/10; G09G 2370/16;
(Continued)

(56) References Cited

U.S. PATENT DOCUMENTS 6,741,279 B1   5/2004  Allen
9,749,562 B2   8/2017  Goto et al.
(Continued)

FOREIGN PATENT DOCUMENTS

JP   2014207493 A   10/2014
JP   2017005401 A   1/2017
(Continued)

OTHER PUBLICATIONS

USPTO Advisory Action in U.S. Appl. No. 15/400,744 dated Sep. 28, 2020 (4 pages).
(Continued)

*Primary Examiner* — Jennifer T Nguyen
(74) *Attorney, Agent, or Firm* — Alliance IP, LLC

(57) ABSTRACT

Cameras are located within the display area of a display. In-display cameras allow for thinner display bezels. In-display cameras allow for the creation of ultra-high resolution images. The ability to capture an object from multiple perspectives allows for holographic image recording and playback. Multiple views of an image can be captured with varying depths of focus, allowing an image's depth of field to be adjusted during post processing. In-display cameras can also be used for user authentication, touch detection and three-dimensional gesture recognition. Thermal sensors located within the display area allow for control of the display temperature, improved control over system performance, and compensation for micro-LED degradation that can occur due to aging or increased temperature. Microlens assemblies located above pixels can adjust the viewing cone
(Continued)

angle of the display or a portion of the display and microassemblies located under individual pixels or pixel arrays can adjust a viewing angle.

23 Claims, 25 Drawing Sheets

(51) Int. Cl.
*H04N 5/89* (2006.01)
*G06F 3/01* (2006.01)

(58) Field of Classification Search
CPC ...... G06F 3/0484; G06F 3/04815; G06F 3/01; G06F 3/011; H10K 59/65
USPC .......................................................... 345/156
See application file for complete search history.

(56) References Cited

U.S. PATENT DOCUMENTS

| | | | |
|---|---|---|---|
| 10,958,841 B2 | 3/2021 | Takagi et al. | |
| 2007/0279407 A1* | 12/2007 | Vasquez | G09G 5/006 345/213 |
| 2009/0278048 A1 | 11/2009 | Choe et al. | |
| 2009/0315869 A1 | 12/2009 | Sugihara et al. | |
| 2010/0066800 A1 | 3/2010 | Ryf et al. | |
| 2012/0236044 A1* | 9/2012 | Nagashima | G09G 3/3426 345/690 |
| 2012/0307123 A1 | 12/2012 | Cok et al. | |
| 2013/0002882 A1 | 1/2013 | Onozawa et al. | |
| 2013/0063367 A1* | 3/2013 | Jang | G06F 3/0416 345/173 |
| 2013/0241942 A1* | 9/2013 | Bennett | G09G 5/363 345/522 |
| 2014/0169399 A1* | 6/2014 | Bayramoglu | G06F 3/041 29/850 |
| 2014/0351073 A1 | 11/2014 | Murphy et al. | |
| 2015/0268754 A1 | 9/2015 | Chang et al. | |
| 2016/0041663 A1 | 2/2016 | Chen et al. | |
| 2016/0203607 A1 | 7/2016 | Müller et al. | |
| 2016/0255286 A1 | 9/2016 | Tsukada | |
| 2018/0198980 A1 | 7/2018 | Takagi et al. | |
| 2019/0361222 A1 | 11/2019 | Gurin | |
| 2020/0296327 A1 | 9/2020 | Karafin et al. | |
| 2021/0021784 A1 | 1/2021 | Cutler | |
| 2021/0125554 A1* | 4/2021 | Lee | G06F 1/20 |
| 2021/0281762 A1 | 9/2021 | Takagi et al. | |
| 2021/0335251 A1* | 10/2021 | Liu | G09G 3/3233 |
| 2022/0182523 A1* | 6/2022 | Ito | H01L 27/146 |

FOREIGN PATENT DOCUMENTS

| | | |
|---|---|---|
| WO | 2013027340 A1 | 2/2013 |
| WO | 2015059897 A1 | 4/2015 |
| WO | 2016199573 A1 | 12/2016 |

OTHER PUBLICATIONS

USPTO Final Office Action in U.S. Appl. No. 15/400,744 dated Jul. 7, 2020 (17 pages).
USPTO Final Office Action in U.S. Appl. No. 15/400,744 dated Sep. 28, 2018 (15 pages).
USPTO Non-Final Office Action in U.S. Appl. No. 15/400,744 dated Dec. 12, 2019 (15 pages).
USPTO Non-Final Office Action in U.S. Appl. No. 15/400,744 dated Feb. 21, 2018 (14 pages).
USPTO Non-Final Office Action in U.S. Appl. No. 15/400,744 dated Mar. 26, 2019 (15 pages).
USPTO Notice of Allowance in U.S. Appl. No. 15/400,744 dated Nov. 3, 2020 (10 pages).
USPTO Non-Final Office Action in U.S. Appl. No. 17/209,911 dated Dec. 12, 2022 (12 pages).
PCT International Search Report and Written Opinion in PCT International Application Serial No. PCT/JP2018/000083 dated Mar. 20, 2018, including translation (16 pages).

\* cited by examiner

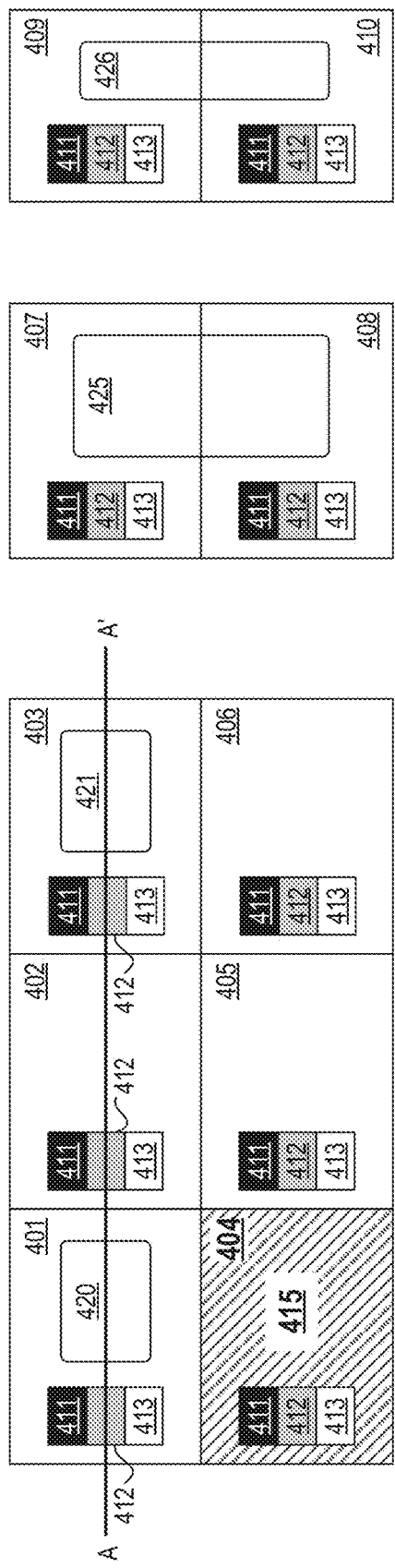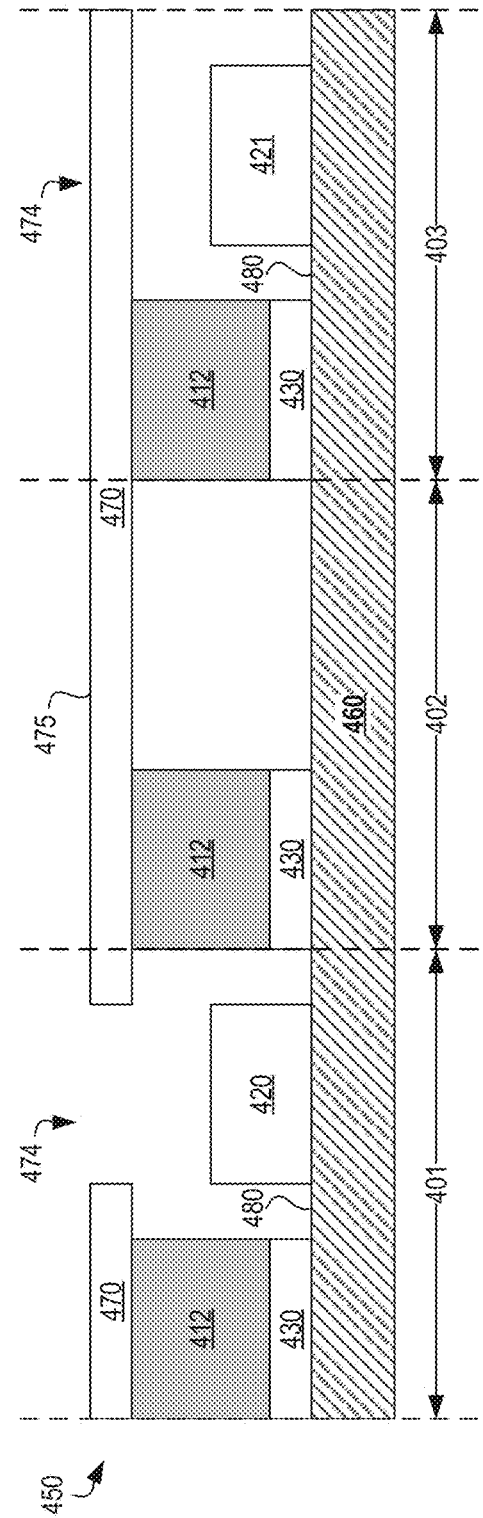
FIG. 4A
FIG. 4C
FIG. 4D
FIG. 4B

700

GENERATE COMPOSITE IMAGE OR VIDEO FROM IMAGE SENSOR DATA
GENERATED BY TWO OR MORE IN-DISPLAY CAMERAS
710

STORE COMPOSITE IMAGE OR VIDEO.
720

┌─────────────────────────────────────────────────────────────┐
│ CAPTURE ORIGINAL VERSIONS OF IMAGE OR VIDEO WITH DIFFERENT DEPTHS │
│                         OF FIELD                              │
│                                                          810  │
└─────────────────────────────────────────────────────────────┘
                              │
                              ▼
┌─────────────────────────────────────────────────────────────┐
│        STORE ORIGINAL VERSIONS OF THE IMAGE OR VIDEO          │
│                                                          820  │
└─────────────────────────────────────────────────────────────┘

┌─────────────────────────────────────────────────────────────────────┐
│ PROMPT USER TO TOUCH ONE OR MORE FINGERS, ONE OR MORE THUMBS, OR    │
│ PALM AGAINST DISPLAY                                                │
│                                                                1110 │
└─────────────────────────────────────────────────────────────────────┘
                                    │
                                    ▼
┌─────────────────────────────────────────────────────────────────────┐
│ CAPTURING ONE OR MORE FINGERPRINTS, ONE OR MORE THUMBPRINTS OR A    │
│ PALMPRINT                                                           │
│                                                                1120 │
└─────────────────────────────────────────────────────────────────────┘
                                    │
                                    ▼
┌─────────────────────────────────────────────────────────────────────┐
│ AUTHENTICATE USER BASED ON CAPTURED PRINT(S)                        │
│                                                                1130 │
└─────────────────────────────────────────────────────────────────────┘
                                    │
                                    ▼
┌─────────────────────────────────────────────────────────────────────┐
│ GRANT PRIVILEGE TO AUTHENTICATED USER                               │
│                                                                1140 │
└─────────────────────────────────────────────────────────────────────┘
```

DETECT SELECTION OF OBJECT BY DETECTING PINCH GESTURE ON DISPLAY
BASED ON IMAGE SENSOR DATA GENERATED BY IN-DISPLAY CAMERAS
1410

CAUSE APPEARANCE OF SELECTED OBJECT TO CHANGE FROM UNSELECTED
APPEARANCE TO SELECTED APPEARANCE
1420

DETECT PINCHED FINGERS MOVING ALONG PATH FROM PINCH LOCATION TO
DESTINATION LOCATION BASED ON IMAGE SENSOR DATA
1430

DETECT PORTION OF PATH ALONG WHICH PINCHED FINGERS ARE NOT IN
CONTACT WITH DISPLAY
1440

CAUSE SELECTED OBJECT TO MOVE FROM PINCHED LOCATION TO
DESTINATION LOCATION
1450

DETECT UNPINCHING GESTURE ON DISPLAY AT DESTINATION LOCATION
1460

CAUSE APPEARANCE OF OBJECT TO CHANGE FROM SELECTED APPEARANCE
TO UNSELECTED APPEARANCE
1470

```
┌─────────────────────────────────────────────────────────────────┐
│ DETERMINE BASED AT LEAST IN PART ON DISPLAY THERMAL SENSOR DATA │
│ AND ADDITIONAL THERMAL DATA GENERATED BY ADDITIONAL THERMAL     │
│ SENSORS THAT PERFORMANCE OF DISPLAY OR ADDITIONAL SYSTEM        │
│ COMPONENTS CAN BE INCREASED WITHOUT EXCEEDING A SYSTEM          │
│ PERFORMANCE THRESHOLD                                      1610 │
└─────────────────────────────────────────────────────────────────┘
                                 │
                                 ▼
┌─────────────────────────────────────────────────────────────────┐
│ INCREASE PERFORMANCE OF DISPLAY OR ADDITIONAL SYSTEM COMPONENTS │
│                                                            1620 │
└─────────────────────────────────────────────────────────────────┘
```

MONITOR USAGE TIME FOR MONITORED PIXEL
1710

ADJUST BRIGHTNESS OF DISPLAY ELEMENTS OF MONITORED PIXEL
1720

FIG. 17

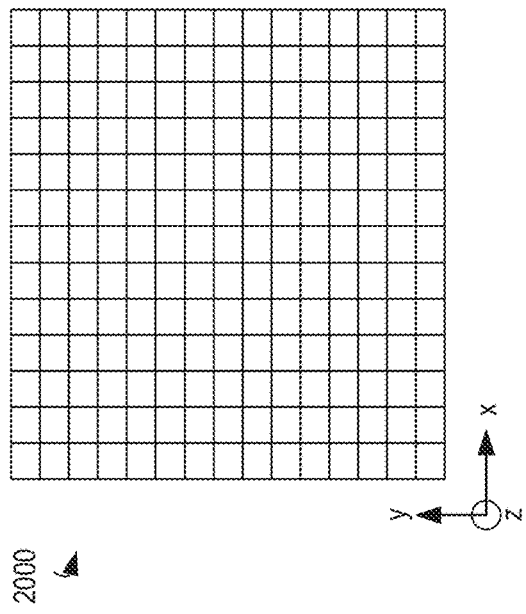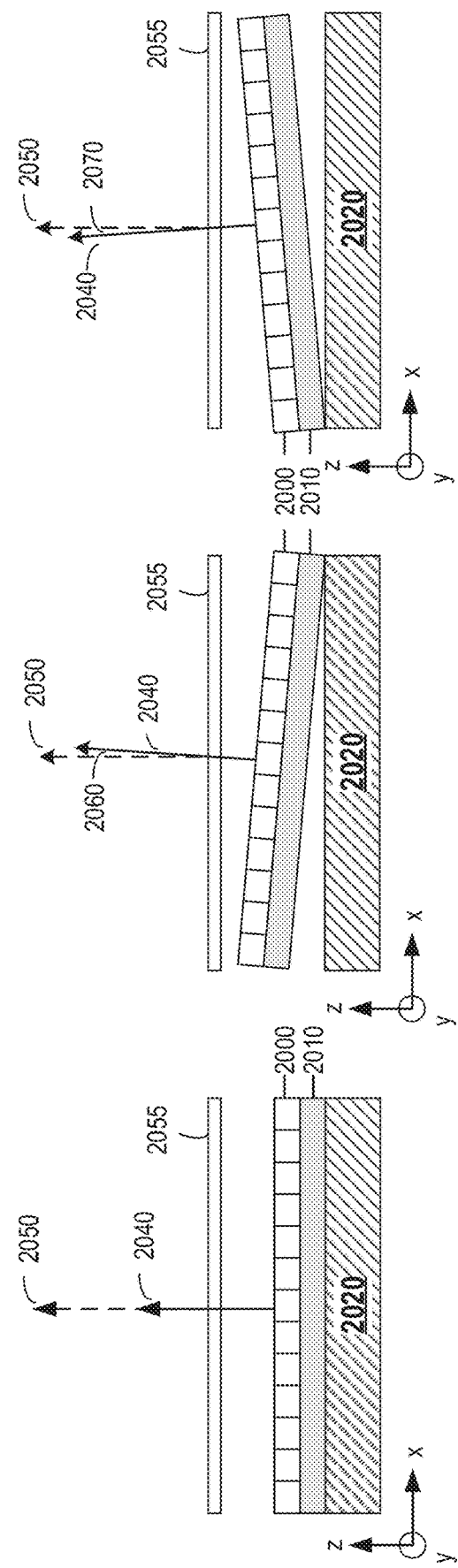

2100

DETERMINE CONTENT TO BE DISPLAYED ON A DISPLAY OF A COMPUTING SYSTEM WITH REDUCED VIEWABILITY
2110

CAUSE MICROASSEMBLIES TO REDUCE VIEWABILITY BY REDUCING PIXEL VIEWING CONE ANGLE
2120

```
┌─────────────────────────────────────────────────────────────────┐
│   RECEIVE USER INDICATION THAT CONTENT IS TO BE DISPLAYED WITH  │
│                      REDUCED VIEWABILITY                        │
│                                                          2210   │
└─────────────────────────────────────────────────────────────────┘
                                 │
                                 ▼
┌─────────────────────────────────────────────────────────────────┐
│  CAUSE MICROASSEMBLIES TO REDUCE VIEWABILITY BY REDUCING PIXEL  │
│                       VIEWING CONE ANGLE                        │
│                                                          2220   │
└─────────────────────────────────────────────────────────────────┘
```

FIG. 22 ns and micromotors
IN-DISPLAY SENSORS AND VIEWING ANGLE ADJUSTMENT MICROASSEMBLIES

CROSS-REFERENCE TO RELATED APPLICATIONS

This application is a continuation (and claims the benefit of priority under 35 U.S.C. § 120) of U.S. application Ser. No. 16/866,515, filed May 4, 2020, and entitled "IN-DISPLAY SENSORS AND VIEWING ANGLE ADJUSTMENT MICROASSEMBLIES". The disclosure of the prior application is considered part of and is incorporated by reference in the disclosure of this application.

BACKGROUND

Many mobile computing devices, such as laptops, tablets, and smartphones employ front-facing (facing the user) cameras for the purposes of self-photography and video conferencing. These cameras typically comprise a camera module containing an image sensor, microlenses, and micromotors (if the lenses are adjustable). Computing devices capable of capturing a user's fingerprint or thumbprint typically do so through the use of a dedicated sensor. Touch-capable computing devices typically comprise touchscreens, which add thickness to a display.

Content displayed on a mobile computing device can be viewed by people other than the person operating the device. A physical privacy panel or filter (typically a polarized piece of plastic) can be attached to a device to display to limit the ability of others to view content displayed on the device.

BRIEF DESCRIPTION OF THE DRAWINGS

FIG. 4A illustrates a set of exemplary pixels with in-display cameras.

FIG. 4B illustrates a cross-section of the exemplary pixels of FIG. 4A taken along the line A-A'.

FIGS. 4C-4D illustrate exemplary cameras that span multiple pixels.

FIG. 7 illustrates an exemplary image or video generation method.

FIG. 8 illustrates an exemplary image or video generation method.

FIG. 11 illustrates an exemplary authentication method.

FIG. 14 illustrates an exemplary object movement method.

FIG. 16 illustrates an exemplary system performance management method.

FIG. 17 illustrates an exemplary display performance adjustment method.

FIG. 20A illustrates a simplified top view of a pixel array with an adjustable viewing angle.

FIGS. 20B-D illustrate simplified side views of a pixel array located on a microassembly that can adjust the viewing angle of the pixel array.

FIG. 21 is a first exemplary viewing angle adjustment method.

FIG. 22 is a second exemplary viewing angle adjustment method.

DETAILED DESCRIPTION

Figure 1:
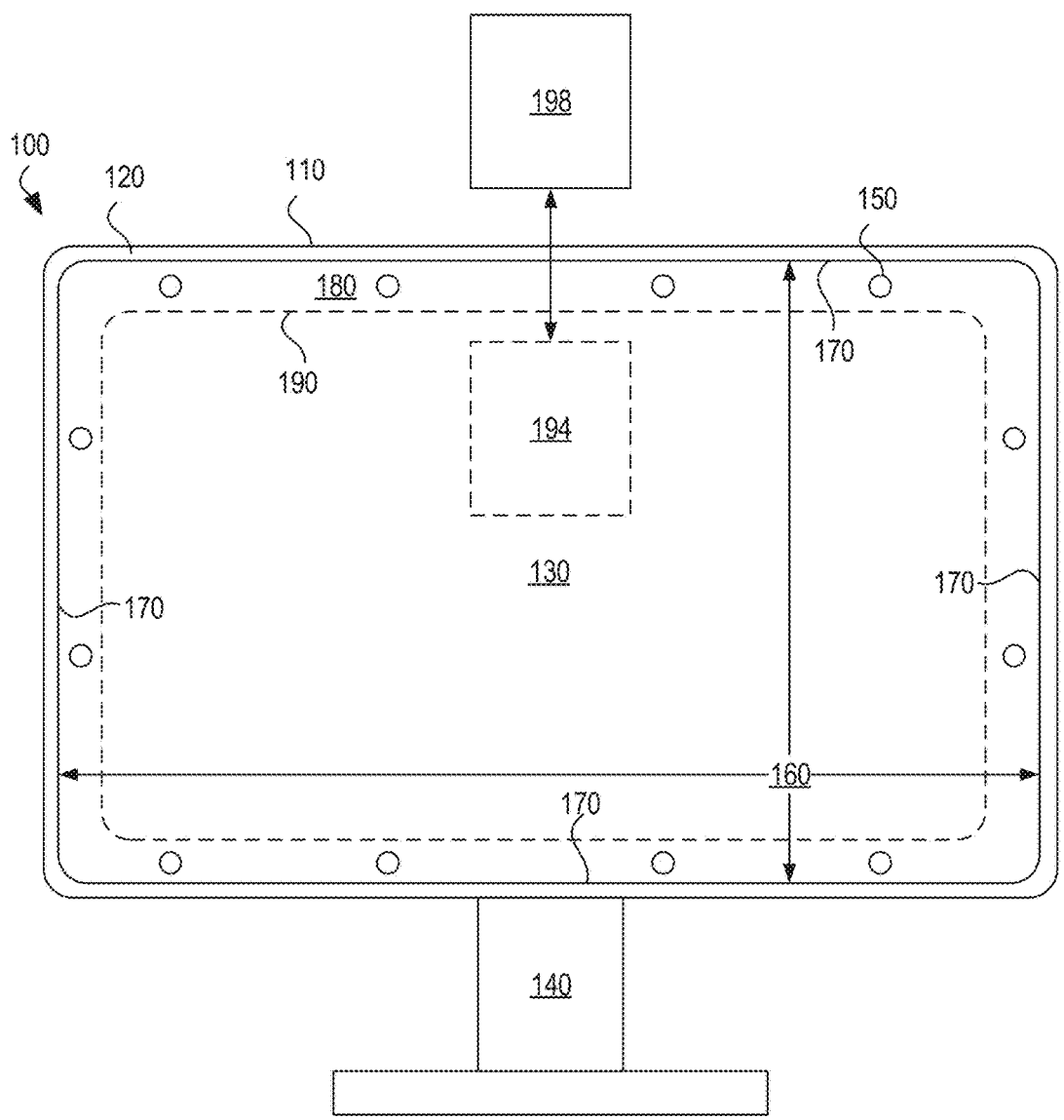
FIG. 1 illustrates an exemplary display.

Mobile device sensors are typically limited to where they can be placed and how many of a particular sensor type can be placed in a device. For example, laptop and notebook cameras are typically placed in the bezel of the display and are usually limited to just a few in number. The low number of cameras and constraints on their placement limits the image and video capture capabilities of these devices. For example, having only a few cameras limits the number of perspectives of an object that can be captured. To include more cameras in these devices may enable increased image and video capture functionality but would likely do so at the expense of an increased bezel width, which can impact system aesthetics. Adding more cameras in the bezel may also increase system complexity and cost due to the routing of additional signals from the cameras to image or video processing components.

The size of the display elements responsible for generating light in a display pixel or allowing for the transmission of light through pixel size continues to shrink over time. Even at the higher resolutions used in existing consumer electronics displays (e.g., 1920×1080 (Full HD), 3840×2160 (4K HD)), display elements can take up only a portion of the area of a pixel (pixel area). If the black matrix area of a display (the area of the front side of the display substrate not occupied by display elements) has enough unused space, additional elements, such as cameras, can be incorporated into individual pixels. Moving cameras from the display bezel to the display area can allow for a reduced bezel width and for many cameras to be incorporated into a display. A large number of cameras distributed across a display's viewing area can allow for improved and additional functionality, such as the ability to capture images of objects located in front of the display from a greater number of perspectives, which can allow for depth sensing and holographic image recording and playback, the generation of high resolution composite images and video, user authentication, touch detection and touch location determination, and the capture of three-dimensional gestures.

Another type of sensor that can be incorporated in black matrix area is thermal sensors. The incorporation of thermal sensors into the display area of a display can allow for improved control of the display temperature, improved control of system performance, the ability to compensate for the reduction in micro-LED performance due to age or increased operating temperatures, and thermal-based touch detection.

Microassemblies capable of adjusting the viewing cone angle or viewing angle of pixels in a display can be incorporated into the display area as well. Microlens assemblies can be located over the display elements of a pixel and are capable of adjusting the viewing cone angle of the pixel. Another type of microassembly can be located under individual pixels or pixels array that is capable of tilting the pixels or pixel arrays to adjust their viewing angle. These microassemblies can allow for the dynamic selection of content to be shown with restricted viewability on a display. All or a portion of the content shown on a display can be shown with restricted viewability. Content can be selected to be shown with restricted viewability via user selection or automatically by a device based on the device's location, the content to be displayed, by tracking a user's gaze, or other factors.

In the following description, specific details are set forth, but embodiments of the technologies described herein may be practiced without these specific details. Well-known circuits, structures, and techniques have not been shown in detail to avoid obscuring an understanding of this description. "An embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or in any other manner. "Connected" may indicate elements are in direct physical or electrical contact with each other and "coupled" may indicate elements co-operate or interact with each other, but they may or may not be in direct physical or electrical contact. Terms modified by the word "substantially" include arrangements, orientations, spacings or positions that vary slightly from the meaning of the unmodified term. For example, a camera located substantially at the center of a display includes cameras located within a few pixels of the center of the display.

The description may use the phrases "in an embodiment," "in embodiments," "in some embodiments," and "in various embodiments," each of which may refer to one or more of the same or different embodiments. Furthermore, the terms "comprising," "including," "having," and the like, as used with respect to embodiments of the present disclosure, are synonymous.

Reference is now made to the drawings, wherein similar or same numbers may be used to designate the same or similar parts in different figures. The use of similar or same numbers in different figures does not mean all figures including similar or same numbers constitute a single or same embodiment. In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives within the scope of the claims.

In-Display Cameras

FIG. 1 illustrates an exemplary display. The display 100 comprises a housing 110, a bezel 120, a display surface 130, and a display base 140. The display 100 has a display area 160 within which content can be displayed. Located within the display area are cameras 150. The display 100 can be any type of display in which the display elements responsible for generating light or allowing for the transmission of light are located within each pixel. Such displays include TFT LCD (thin-film-transistor liquid crystal display), micro-LED (micro-light emitting diode), OLED (organic LED), and QLED (quantum dot LED) displays. The housing 110 comprises the bezel 120, which borders the display surface 130. Display 100 comprises a display substrate (not shown in FIG. 1) on which a plurality of pixels (also not shown) is located. The pixels define a display area 160 within which images, videos, and other content can be displayed. In display 100, the pixels extend to interior edges 170 of the bezel 120 and the display area 160 thus extends from one interior bezel edge 170 to the opposite bezel edge 170 in both the horizontal and vertical directions. The cameras 150 are located on the front side of the display substrate and within the display area 160. Being located on the front side of the display substrate, the cameras 150 share real estate with the pixel display elements, as will be discussed in greater detail below.

The cameras 150 are located within a peripheral region 180 of the display area, the boundary of which is represented by dashed line 190. The peripheral region 180 is not defined as a set distance from the edge of the bezel 120 but is rather defined generally as the region of the display area near the bezel 120. In some embodiments, holes are made in the display surface 130 where the cameras 150 are located. In such embodiments, locating the cameras 150 in the peripheral area 180 of the display 100 may create a more pleasant user experience. However, the presence of holes in the display to allow light to reach the cameras 150 without having to pass through the transparent layers of the display located in front of the pixels does not limit the location of cameras to the periphery of a display. Cameras can be placed at any location within a display area.

In some embodiments, the display 100 further comprises one or more processors 194 which can be responsible for controlling, for example, aspects of camera behavior, image processing, and video processing. For example, the processors 194 can control when any of the individual cameras 150 are to take a picture or capture video and can receive image sensor data, images, or videos generated by the cameras. The processors 194 are communicatively coupled to processors 198 external to the display 100 and can, for example, send images or videos to the processors 198 for further processing and receive instructions from the processors 198 for controlling the cameras 150.

As used herein, the term "communicatively coupled" when referring to two or more devices, systems, or components therein means the two or more devices, systems, or components are in or capable of being in communication with each other. The devices can be in communication via wired or wireless connection. Devices or systems communicatively coupled with each other include devices that communicate with each other through one or more intermediate devices. Thus, devices that are in or capable of being in communication with each other over a (local, regional, global) network connection are considered to communicatively coupled to each other. For example, a smartphone in communication with a cloud-based server is communicatively coupled to the server.

Additional camera control operations and image processing can be performed by the in-display processors 194. For example, the processors 194 can comprise one or more digital signal processors (DSP) that perform functions such as noise reduction, gamma correction, image and video compression, video coding, feature extraction, and pattern recognition. As such, the processors 194 can offload camera control and image and video processing from the processors external to the display. The cameras 150 (and processors 194) are communicatively coupled to one or more processors 198 located external to the display 100.

The display 100 is shown as a stand-alone display and as such the processors 194 can be in wired or wireless communication with one or more central processor units (CPUs), graphic processing units (GPUs), image processors, or systems-on-a-chip (SOCs) located in a laptop, tablet, notebook, smartphone, desktop, workstation or other computing device. As used herein, the term "system" includes a stand-alone display. As used herein, the term "device" and "system" can be used interchangeably. In other embodiments, the display 100 is located in a mobile device such as a smartphone, tablet, mobile gaming system or other devices in which the display is located within a housing that also houses the system's components. In such embodiments, the cameras 150 are in communication with processors 198 incorporated within the mobile device. In still other embodiments, the display 100 is laptop, tablet computer, a 2-in-1 convertible, or any other system where the display 100 is located within a first housing that is communicatively coupled to one or more additional housings that house the system's central processing unit, memory and other components. In yet other embodiments, the display 100 can be an embedded display such as in an in-vehicle infotainment (IVI) system, a kiosk, or a display in any other of a wide variety of consumer or commercial electronic devices, such as television sets, commercial display installations (trade shows, stadiums, shopping malls, etc.), and navigation systems.

Additional processors or devices can be incorporated into the display 100 to support additional functionality. For example, wireless communication functionality can be incorporated into the display to allow for image or video processing functionality (such as object recognition) to be offloaded to a remote server or cloud-based service.

Figure 2A:
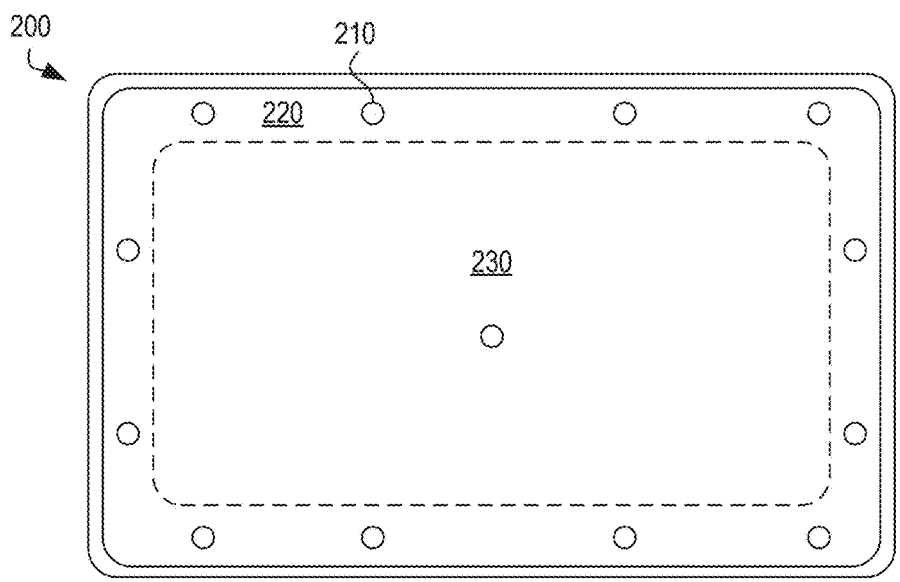
FIGS. 2A-2C illustrate exemplary arrangements of cameras in a display.
Figure 2B:
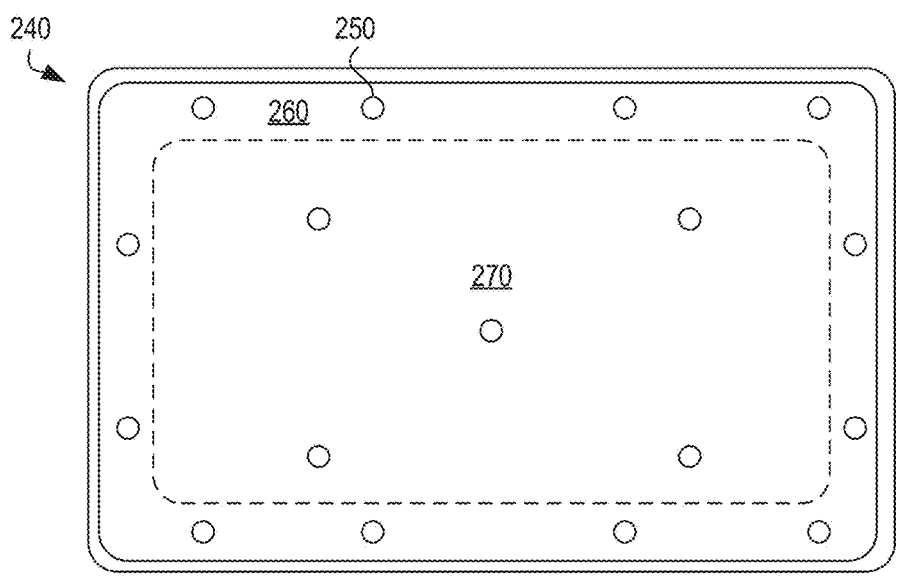
Figure 2C:
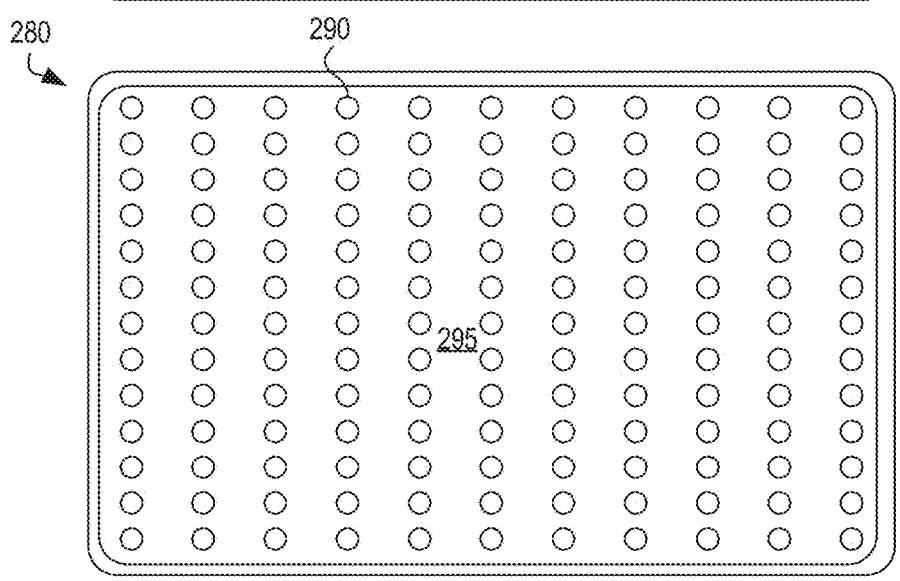

FIGS. 2A-2C illustrate exemplary arrangements of cameras in a display. FIG. 2A illustrates a display 200 in which cameras 210 include a set of cameras located in a peripheral region 220 of a display area 230 and a camera located substantially in the center of the display area 230. FIG. 2B illustrates a display 240 in which cameras 250 include a set of cameras located in a peripheral region 260 of display area 270 and a set of cameras located inside the peripheral region 260 of the display area 270. FIG. 2C illustrates a display 280 in which an array of a large number of cameras 290 is located within display area 295 of the display 280. In other embodiments, a display can have a plurality of cameras that vary in number and arrangement from the exemplary configurations shown in FIGS. 1 and 2A-2C.

Figure 3A:
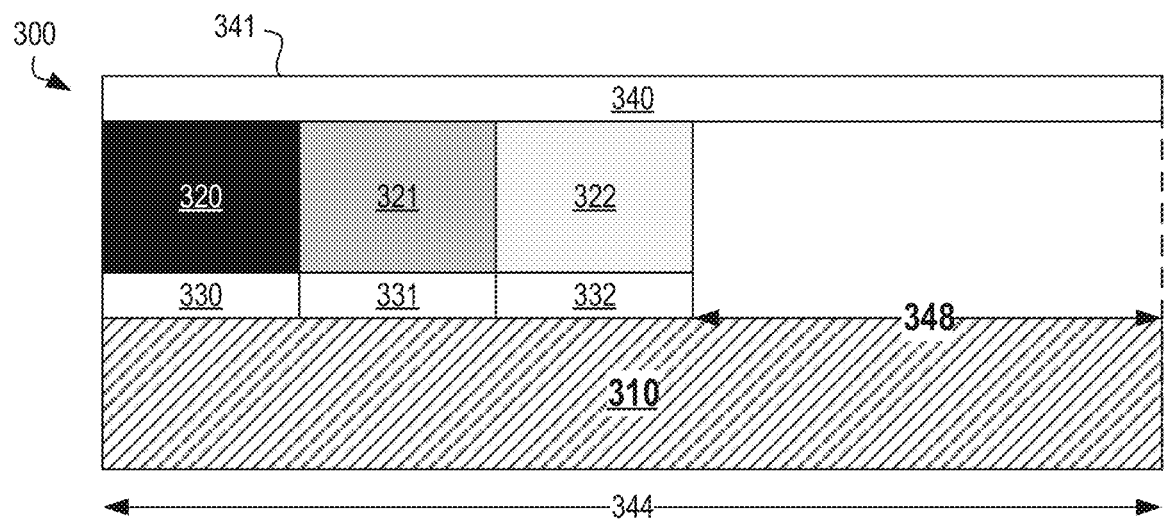
FIGS. 3A-3B illustrate simplified cross-sections of exemplary pixels in displays.
Figure 3B:
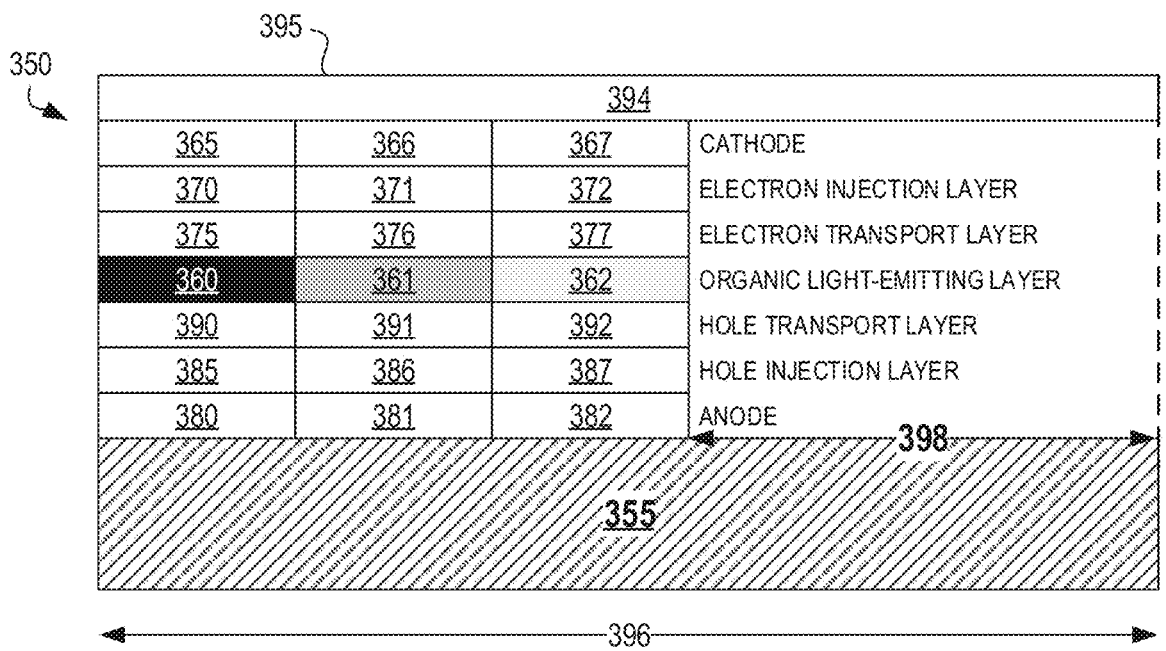

FIGS. 3A-3B illustrate simplified cross-sections of pixels in exemplary displays. FIG. 3A is a simplified illustration of the cross-section of a pixel in an exemplary micro-LED display. Micro-LED pixel 300 comprises a display substrate 310, a red LED 320, a green LED 321, a blue LED 322, electrodes 330-332, and a transparent display medium 340 having a surface 341. The LEDs 320-322 are the individual light-producing elements for the pixel 300, with the amount of light produced by each LED 320-322 being controlled by the associated electrode 330-332.

The LED stacks (red LED stack (layers 320 and 330), green LED stack (layers 321 and 331) and blue LED stack (layers 322 and 332)) can be manufactured on a substrate using microelectronic manufacturing technologies. In some embodiments, the display substrate 310 is a substrate different from the substrate upon which the LEDs stacks are manufactured and the LED stacks are transferred from the manufacturing substrate to the display substrate 310. In other embodiments, the LED stacks are grown directly on the display substrate 310. In both sets of embodiments, multiple pixels can be located on a single display substrate and multiple display substrates can be assembled to achieve a display of a desired size.

The pixel 300 has a pixel width 344, which can depend on, for example, display resolution and display size. For example, for a given display resolution, the pixel width 344 can increase with display size. For a given display size, the pixel width 344 can decrease with increased resolution. The pixel 300 has an unused pixel area 348, which is part of the black matrix area of a display. In some displays, the combination of LED size, display size, and display resolution can be such that the unused pixel area 348 can be large enough to accommodate the integration of components, such as cameras, within a pixel.

FIG. 3B is a simplified illustration of the cross-section of a pixel in an exemplary OLED display. OLED pixel 350 comprises a display substrate 355, organic light-emitting layers 360-362, which are capable of producing red (layer 360), green (layer 361) and blue (layer 362) light, respectively. The OLED pixel 350 further comprises cathode layers 365-367, electron injection layers 370-372, electron transport layers 375-377, anode layers 380-382, hole injections layers 385-387, hole transport layers 390-392, and a transparent display medium 394 having a surface 395. The OLED pixel 350 generates light through application of a voltage across the cathode layers 365-367 and anode layers 380-382, which results in the injection of electrons and holes into electron injection layers 370-372 and hole injection layers 384-386, respectively. The injected electrons and holes traverse the electron transport layers 375-377 and hole transport layers 390-392, respectively, and electron-hole pairs recombine in the organic light-emitting layers 360-362 to generate light.

Similar to the LED stacks in micro-LED displays, OLED stacks (red OLED stack (layers 365, 370, 375, 360, 390, 385, 380), green OLED stack (layers 366, 371, 376, 361, 391, 386, 381), and blue OLED stack (layers 367, 372, 377, 362, 392, 386, 382), can be manufactured on a substrate separate from the display substrate 355. In some embodiments, the display substrate 355 is a substrate different from the substrate upon which the OLED stacks are transferred from the manufacturing substrate to the display substrate 355. In other embodiments, the OLED stacks are directly grown on the display substrate 355. In both types of embodiments, multiple display substrate components may need to be assembled in order to achieve a desired display size. The transparent display mediums 340 and 394 can be any transparent medium such as glass, plastic or a film. In some embodiments, the transparent display medium can comprise a touchscreen.

Again, similar to the micro-LED pixel 300, the OLED pixel 350 has a pixel width 396 that can depend on factors such as display resolution and display size. The OLED pixel 350 has an unused pixel area 398 and in some displays, the combination of OLED stack widths, display size, and display resolution can be such that the unused pixel area 398 is large enough to accommodate the integration of components, such as cameras, within a pixel.

As used herein, the term "display substrate" can refer to any substrate used in a display and upon which pixel display elements are manufactured or placed. For example, the display substrate can be a backplane manufactured separately from the pixel display elements (e.g., micro-LED/ OLEDs in pixels 300 and 350) and upon which pixel display elements are attached, or a substrate upon which pixel display elements are manufactured.

FIG. 4A illustrates a set of exemplary pixels with in-display cameras. Pixels 401-406 each have a red display element 411, green display element 412, and blue display element 413. In some embodiments, these display elements are micro-LEDs or OLEDs. Each of the pixels 401-406 occupies a pixel area. For example, the pixel 404 occupies pixel area 415. The amount of pixel area occupied by the display elements 411-413 in each pixel leaves enough remaining black matrix area for the inclusion of miniature cameras or other sensors. Pixels 401 and 403 contain cameras 420 and 421, respectively, located alongside the display elements 411-413. As used herein, the term "in-display camera" refers to a camera that is located in the pixel area of one or more pixels within a display. Cameras 420 and 421 are in-display cameras.

FIG. 4B illustrates a cross-section of the exemplary pixels of FIG. 4A taken along the line A-A'. Cross-section 450 illustrates a cross-section of pixels 401-403. The red display elements 412 and the corresponding electrodes 430 for the pixels 401-403 are located on display substrate 460 and are located behind a transparent display medium 470. A camera located in a display area can receive light that passes or does not pass through a transparent display medium. For example, the region of the transparent display medium 470 above the camera 420 has a hole in it to allow for light to hit the image sensor of the camera 420 without having to pass through the transparent display medium. The region of the transparent display medium 470 above the camera 421 does not have a hole and the light reaching the image sensor in the camera 421 passes through the transparent display medium.

In some embodiments, in-display cameras can be discrete cameras manufactured independently from pixel display elements and the discrete cameras are attached to a display substrate after they are manufactured. In other embodiments, one or more camera components, such as the image sensor can be fabricated directly on a display substrate. Although the cameras 420-421 are shown as being located on a front surface 480 of the display substrate 460 in FIG. 4B, in embodiments where camera components are fabricated on a display substrate, the cameras can reside at least partially within the display substrate.

As used herein, the term "located on" in reference to any sensors or components (e.g., cameras, thermal sensors) with respect to the display substrate refers to sensors or components that are physically coupled to the display substrate in any manner, such as discrete sensors or other components that are directly attached to the substrate, discrete sensors or components that are attached to the substrate via one or more intervening layers, and sensors or components that have been fabricated on the display substrate. As used herein, the term "located on" in reference to LEDs with respect to the display substrate similarly refers to LEDs that are physically coupled to the display substrate in any manner, such as discrete LEDs that are directly attached to the substrate, discrete LEDs that are attached to the substrate via one or more intervening layers, and LEDs that have been fabricated on the display substrate.

Although cameras 420 and 421 are shown as each residing within one pixel in FIGS. 4A and 4B, in other embodiments, in-display cameras can span multiple pixels. This can allow, for example, for the integration of larger cameras into a display area or for cameras to be integrated into a display with pixels having a smaller black matrix area. FIGS. 4C-4D illustrate exemplary cameras that span multiple pixels. FIG. 4C illustrates adjacent pixels 407 and 408 having the same size as pixels 401-406 and a camera 425 that is bigger than cameras 420-421 and that occupies a portion of the pixel area in the pixels 407-408. FIG. 4D illustrates adjacent pixels 409 and 410 that are narrower in width than pixels 401-406 and a camera 426 that spans both pixels. Using larger cameras can allow for an improved image or video capture, such as for allowing the capture of higher-resolution images and video at individual cameras.

As cameras can be integrated into individual pixels or across several pixels, a wide variety of camera configurations can be incorporated into a display. FIGS. 1, 2A-2C, and 4A-4D show just a few camera configurations and many more are possible. In some embodiments, thousands of cameras could be located in the display area. Displays that have a plurality of in-display cameras distributed across the display area can have image and video capture capabilities exceeding those of displays having just one or a few cameras located in a bezel.

The in-display cameras described herein generate image sensor data that is sent to one or more processors located in a display, such as processor 194 in FIG. 1 or processing components located external to the display. Image sensor data is the data that is output from the camera to other components. Image sensor data can be image data, which is data representing an image or video data, which is data representing video. Image data or video data can be in compressed or uncompressed form. Image sensor data can also be data from which image data or video data is generated by another component (e.g., processor 194 or 198).

Processors located within a display are typically located on the back side of the display substrate. In some embodiments, image sensor data generated by multiple cameras is sent to the same processors. In other embodiments, image sensor data generated by different sets of cameras are provided to different processors. The interconnections providing the image sensor data from the cameras to image processing components can be located on the display substrate. The interconnections can be fabricated on the display substrate, attached to the display substrate, or physically coupled to the display substrate in any other manner. In some embodiments, display manufacture comprises manufacturing individual display substrate portions to which pixels are attached and assembling the display substrate portions together to achieve a desired display size.

Figure 5:
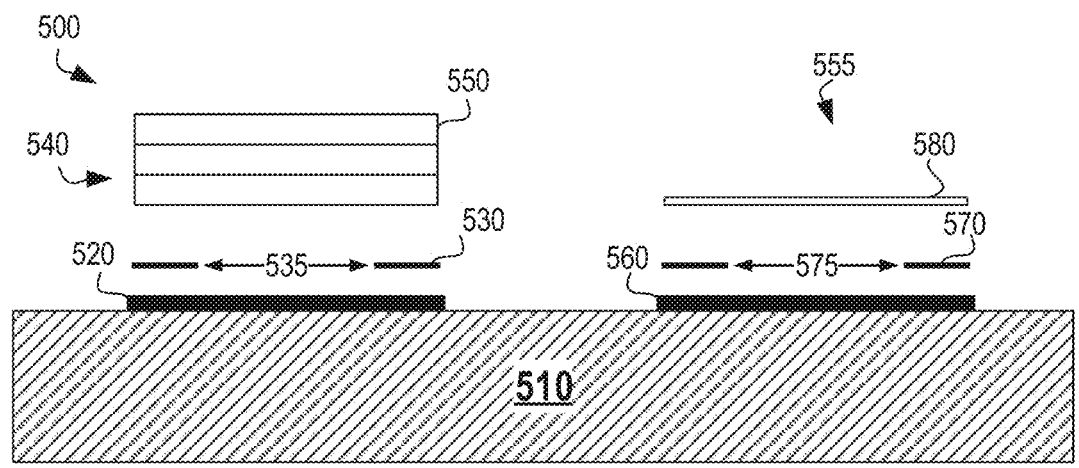
FIG. 5 illustrates exemplary in-display cameras.

FIG. 5 illustrates exemplary cameras that can be incorporated into a display. A camera 500 is located on a display substrate 510 and comprises an image sensor 520, an aperture 530, and a microlens assembly 540. The image sensor 520 can be a CMOS photodetector or any other type of photodetector. The image sensor 520 comprises a number of camera pixels, the individual elements used for capturing light in a camera, and the number of pixels in the camera can be used as a measure of the camera's resolution (e.g., 12 megapixels, 20 megapixels). The aperture 530 has an opening width 535. The microlens assembly 540 comprises one or more microlenses 550 that focus light to a focal point and which can be made of glass, plastic, or other transparent material. The microlens assembly 540 typically comprises multiple microlenses 555 to account for various types of aberrations (such as chromatic aberration) and distortions.

A camera 555 is also located on display substrate 510 and comprises an image sensor 560, an aperture 570 and a metalens 580. The camera 555 is similar to camera 500 except for the use of a metalens instead of a microlens assembly as the focusing element. Generally, a metalens is a planar lens comprising physical structures on its surface that act to manipulate different wavelengths of light such they reach the same focal point. Metalenses do not produce the chromatic aberration that can occur with a single conventional microlens. Metalenses can be much thinner than glass, plastic or other types of microlenses and can be fabricated using MEMS (microelectromechanical systems) or NEMS (nanoelectromechanical systems) approaches. As such, a camera comprising a single, thin metalens, such as the camera 555 can be thinner than a camera comprising a microlens assembly comprising multiple microlenses, such as the camera 555. The aperture 570 has an opening width 575.

The distance from the microlens assembly 540 to image sensor the 520 and from the metalens 580 to the image sensor 560 defines the focal length of the cameras 500 and 550, respectively, and the ratio of the focal length to the aperture opening width (535, 575) defines the f-stop for the camera, a measure of the amount of light that reaches the surface of the image sensor. The f-stop is also a measure of the camera's depth of field, with small f-stop cameras having shallower depths of field and large f-stop cameras having deeper depths of field. The depth of field can have a dramatic effect on a captured image. In an image with a shallow depth of field it is often only the subject of the picture that is in focus whereas in an image with a deep depth of field, all objects are typically in focus.

In some embodiments, the cameras 500 and 550 are fixed-focus cameras. That is, their focal length is not adjustable. In other embodiments, the focal length of cameras 500 and 550 can be adjusted by moving the microlens assembly 540 or the metalens 580 either closer to or further away from the associated image sensor. In some embodiments, the distance of the microlens assembly 540 or the metalens 580 to their respective image sensors can be adjusted by MEMS-based actuators or other approaches.

In-display cameras can be distributed across a display area in various densities. For example, cameras can be located every 100 pixels, every 10 pixels, every pixel, or in other densities. A certain level of camera density (how many cameras there are per unit area for a region of the display) may be desirable for a particular use case. For example, if the cameras are to be used for image and video capture, a lower camera density may suffice than if the cameras are to be used for touch detection or touch location determination.

In some embodiments, image data corresponding to images captured by multiple individual cameras can be utilized to generate a composite image. The composite image can have a higher resolution than any image capable of being captured by the individual cameras. For example, a system can utilize image data corresponding to images captured by several 3-megapixel cameras to produce a 6-megapixel image. In some embodiments, composite images or videos generated from images or videos captured by individual in-display cameras could have ultra-high resolution, such as in the gigapixel range. Composite images and videos could be used for ultra-high resolution self-photography and videos, ultra-high resolution security monitors, or other applications.

The generation of higher-resolution images from image data corresponding to images captured by multiple individual cameras can allow for individual cameras with lower megapixel counts to be located in the individual pixels. This can allow for cameras to be integrated into higher resolution displays for a given screen size or in smaller displays for a given resolution (where there are more pixels per unit area of display size and thus less free pixel area available to accommodate the integration of cameras at the pixel level). Composite images can be generated in real time as images are captured, with only the image data for the composite image being stored, or the image data for e images captured by the individual cameras can be stored and a composite image can be generated during post-processing. Composite video can be similarly generated using video data corresponding to videos generated by multiple individual cameras, with the composite video being generated in real time or during post-processing.

In some embodiments, a display can comprise a plurality of fixed-focus cameras having groups of cameras with different depths of field. For example, a first group of cameras can have a first depth of field, a second group of cameras can have a second depth of field, and so on. Groups of cameras having different depths of field allow multiple versions of an image to be captured simultaneously, each version being captured by one or more cameras in a different camera group. By storing the different original versions of an image, with each original image version having a different depth of field, new versions of the images with new depths of field different from those of the original versions can be generated. For example, a display with four groups of in-display cameras distributed across a display area with each camera group having a different fixed depth of field can capture four original versions of an image, each original version having a different depth of field. New versions of the image can be generated having depths of field different from the cameras used to capture the original versions of the image. In some embodiments, the depth of field of a new image can be determined based on the user selection of an object in an original version desired to be in focus. The new version of the image can be generated with the selected object in focus based on one or more original versions of the image. New versions of videos with depths of field different from those of the groups of cameras can similarly be generated using one or more original versions of videos.

Displays comprising in-display cameras can capture an image of an object from various perspectives. For example, among a set of in-display cameras distributed across the display area of a computer monitor, the cameras located near the top, bottom, left, and right edges of the display provide different views of a user sitting in front of the display. The degree of difference between the perspectives various cameras can provide depends on factors such as the location of the cameras in the display, how close the object is to the display, and how big the display is. For example, cameras located near the left and right edges of a large display will provide perspectives that have a greater degree of difference than those provided by cameras located just to the left or right of the center of the display. Similarly, a greater range of perspectives of an object can be captured as an object gets closer to the display or if the object is in front of a larger display.

The capability to capture multiple images of an object with each view providing a different perspective of the object allows for the recording and playback of holographic images. A holographic image comprises multiple views, and each view can be a separate image. In some embodiments, the individual views comprising the holographic image of an object are taken from different viewing angles. When the holographic image is displayed, the view of the holographic image displayed can depend on the position of a viewer relative to the display so that the holographic image can appear to provide a three-dimensional view of the object when displayed.

Each view of a holographic image can be associated with view location information indicating where on the display used to capture the view (capturing display) the camera capturing the view was located. View location information can be in Cartesian coordinates relative to an origin (e.g., bottom left corner, center, another camera), an indication where within the display the camera is generally located (center, left, right, top, bottom, top-left, top-right, etc.), or any other information indicating the location of an in-display camera within a display. A holographic image, along with associated view location information, can be stored at a system comprising the capturing display or at any other system or computer-readable media.

In some embodiments, a holographic image is shown on a display or a system communicatively coupled to a display capable of tracking the position of a viewing user's feature (e.g., head, face, one or both eyes, one or both eyebrows, mouth, nose, chin). The view of a holographic image shown on the display (viewing display) varies depending on the tracked position of the tracked user feature. For example, if a system is tracking a viewing user's head and the viewer's head is positioned in front of the center of the viewing display, the view of a holographic image captured by a camera located at or near the center of the capturing display used in recording the holographic image will be shown on the viewing display. If the viewer moves their head to the right of the center of the viewing display, the change in position of the viewer's head will be tracked and a view of the holographic image captured by a camera located to the right of the center of the capturing display can be shown on the viewing display. As the viewer moves their head further to the right, an image captured by a camera further to the right of the center of the capturing display can be presented.

Similarly, as the viewer moves their head to the left of center of the viewing display, views of the holographic image captured by camera to the left of center of the capturing display can be shown on the viewing display, depending on how far the viewer has moved their head to the left of center of the viewing display. Similarly, if the viewer moves their head below the center of the viewing display, a view of the holographic image captured by a camera located below the center of the capturing display will be shown. If the viewer moves their head above the center of the viewing display, a view of the holographic image captured by a camera located above the center of the capturing display will be shown. Thus, as a viewer of a holographic image moves their head to different positions relative to the viewing display, different views of the holographic image will appear, giving the viewer the illusion of viewing a three-dimension image on a two-dimensional display.

Figure 6C:
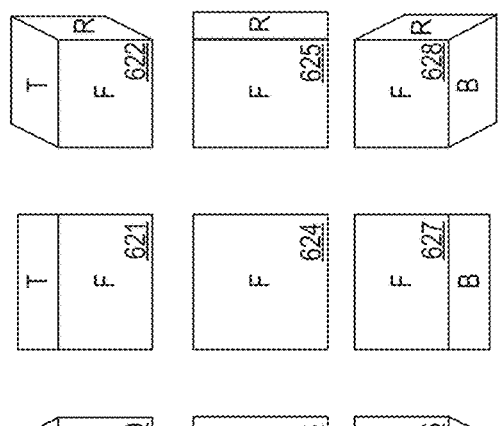
FIGS. 6A-6G illustrate an exemplary holographic image recording and display.
Figure 6B:
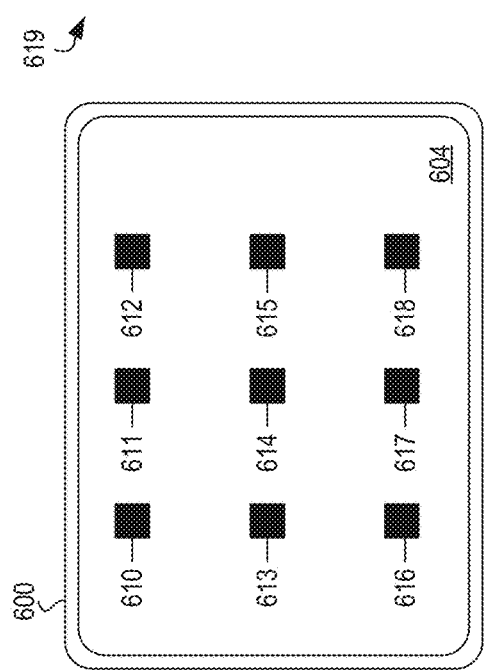
Figure 6A:
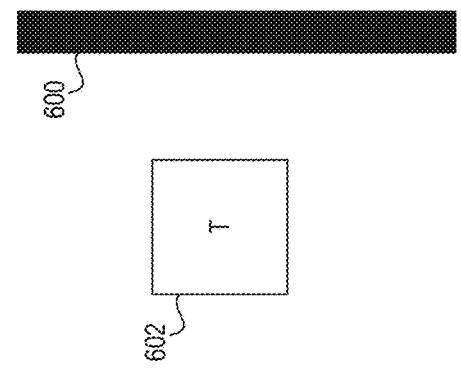

FIGS. 6A-6G illustrate an exemplary holographic image recording and display. FIG. 6A illustrates a top-down view of an exemplary display 600 with in-display cameras that can be used to generate a holographic image of an object 602. The object 602 is a cube labelled with the letters "T", "L", "R", "F", and "B" on the top, left, right, front, and bottom faces, respectively. FIG. 6B illustrates an exemplary front view of the display 600 with nine cameras 610-618 arranged in a 3×3 array (the display 600 could have many more in-display cameras) in the display area 604. FIG. 6C illustrates an exemplary holographic image 619 comprising nine views 620-628 of the object 602 captured by the cameras 610-618. The views 620-628 are arranged in FIG. 6C according to the arrangement of the cameras 610-618 in FIG. 6B. That is, view 620 is a view captured by camera 610, view 621 is a view captured by camera 611, and so on. As can be seen, each of the views 620-628 provides a different perspective of the object 602.

Figure 6G:
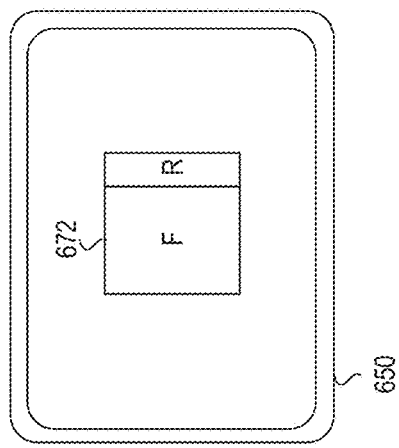
Figure 6F:
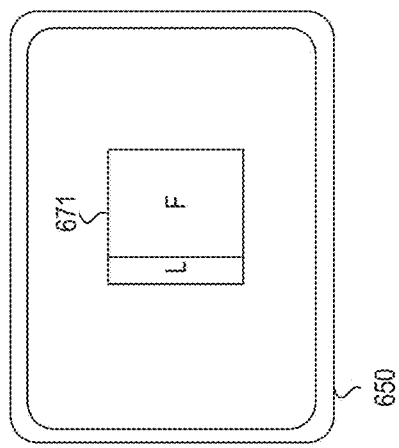
Figure 6E:
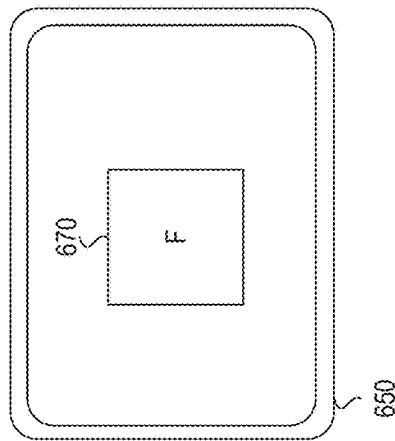
Figure 6D:
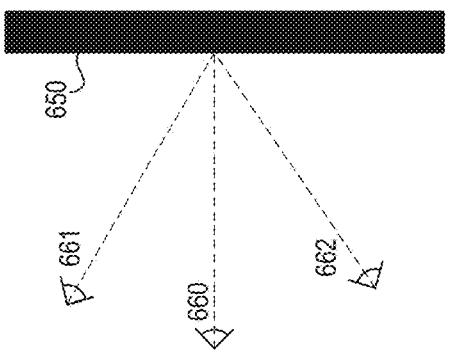

FIG. 6D illustrates a top view of a user viewing a display showing a holographic image. The viewing display 650, which can be the same as the capturing display 600 or a different display shows a holographic image. The display 650 (or a system communicatively coupled to the display 650) is capable of tracking the position of the viewer's head, face, eyes or other body part or feature and displays a view of the holographic image that is based at least in part on the tracked position. FIG. 6D illustrates three viewer positions, a head-on viewing position 660, a viewing position 661 to the left of center and a viewing position 662 to the right of center.

FIG. 6E through FIG. 6G show holographic image views displayed in response to tracking the viewer at each of the viewing positions 660-662. FIG. 6E shows a head-on view 670 of the holographic image displayed when the viewer is at viewing position 660. The head-on view 670 corresponds to the view 624 captured by the camera 614 located at the center of the camera array shown in FIG. 6B. FIG. 6F shows a view 671 of the holographic image displayed when the viewer is looking at the display 650 from viewing location 661, to the left of center. The view 671 corresponds to the view 623 captured by camera 613. FIG. 6G shows a view 672 of the holographic image displayed when the viewer is at viewing location 662, to the right of center. The view 672 corresponds to the view 625 captured by camera 615.

In some embodiments, holographic image views can be generated from images captured by two or more individual cameras. For example, a holographic view corresponding to a position between cameras 614 and 615 could be generated based on the image data corresponding to views 624 and 625. Such a view could be displayed to a viewer when they are viewing the viewing display 650 at a position between viewing positions 660 and 662. Generating additional holographic image views based on the views captured by individual cameras can allow for a more pleasant holographic image viewing experience as more views can be shown to a viewer as they change their viewing position. With more views to a present to a user, the holographic image can appear to change more fluidly than if fewer views were available. In some embodiments, a holographic image captured using in-display cameras can be shown on a display that does not comprise in-display cameras and uses cameras or other sensors external to the display to track a viewer's feature.

In other embodiments, a holographic image can be utilized in virtual reality environments. For example, a holographic image can be shown on the display of a head mounted display (HMD), and the view of the holographic image can change as the position and orientation of the head mounted display changes. Further, an HMD system or a system communicatively coupled to an HMD can change the depth of field of an image displayed at the HMD by tracking the user's gaze using eye tracking technology incorporated into the HMD, determining an object shown in the display that the user is focusing on, and showing a view of the holographic image with the object the user is focusing upon being shown in focus. If a view of the holographic image with the object focused upon by the user is not part of the holographic image, the HMD or other system communicatively coupled to the HMD can generate the view with the object in focus from other views already part of the holographic image as described above.

In some embodiments, holographic videos can similarly be recorded and played back using in displays with in-display cameras. Referring back to FIGS. 6A-6G, instead of recording multiple static views of an object, each camera can record a video to generate a holographic video. During playback, video views with difference perspectives can be shown on the viewing display depending on the tracked location of a viewer.

In some embodiments, the technologies described herein can allow for holographic telepresence. For example, a system with in-display cameras being used by a first participant in a video call can transmit data corresponding to multiple views of the first participant to the system being used by a second call participant. The data corresponding to multiple views of the first participant can be transmitted to the second participant's system in real time as the multiple views of the first participant are captured to allow for real-time video interaction between call participants. The view of the first participant shown to the second participant can vary depending on the tracked location of the second participant.

In some embodiments, only one view of a holographic video is transmitted from a first participant to a second call participant. The view being transmitted can be selected based at least in part on information indicating the tracked position of a user feature of the second participant. The second participant's system can send information indicating the tracked position of the second participant's user feature to the first participant's system and the system being used by the first participant can select a view of holographic video to transmit to the second participant's system based at least on the information indicating the tracked position of the second participant's user feature and the view location information associated with the holographic video views. The selected view transmitted to the remote system can be shown on a display of the first participant's system as a feedback view so that the first participant can see the holographic video being shown to the second participant. In some embodiments, the feedback view occupies only a portion of the display.

In some embodiments, in-display cameras can be used in the generation of holographic avatars to be used in real-time video or other communication between systems. A user can select an avatar, build their own avatar or have a computing device automatically select or generate an avatar to be used during communication with another user. During real-time video communication with another party, a calling user can indicate to their system that they wish their avatar to be shown in place of over their head in the video presented to a called party. During the video communication, the calling user's device captures video of the calling user from one or more in-display cameras, extracts facial features from the video and converts the facial features into one or more avatar parameters that can be used to animate the user's avatar. The user's system can determine avatar parameters for each of the views of the calling user captured by the user's system. In some embodiments, the avatar parameters for each view are determined from the facial features extracted from the video of each view. That is, the calling user's system generates avatar parameters for multiple views of the user taken from multiple cameras. The calling user's system sends the avatar parameters and view location information for the multiple views to the called party's system. At the called party's system, a first view of the calling user's avatar is shown based on the received avatar parameters for the multiple views of the calling user. The view of the calling user shown on the display of the called user's system is based on a tracked position of a user feature of the called party and the view location information for the multiple views of the calling user. The tracked position of the called party can be determined by the called party's system based on image sensor data generated by in-display cameras or based on data generated by other sensors of the called party's system. Thus, a called user can view a holographic avatar of the calling user, the view of the calling user's holographic avatar changing as the called user moves their head (or other tracked feature) relative to their system's display.

In some embodiments, views of the calling user can be captured by two or more cameras. In some embodiments, the calling user's system generates a three-dimensional mesh of the user for each view of the calling user. The three-dimensional mesh for each view can track the dimensions, shape and facial expressions of the user. The calling user's system can extract facial features such as the eyes, ears, nose, mouth, eyebrows, jaw, etc. of the user. The avatar parameters sent to the calling system can comprise a variety of parameters, such as facial feature locations, sizes, or poses. Facial feature poses can comprise information that indicates how a facial feature is oriented. For example, avatar parameters indicating the pose of a user's eyebrow can indicate how much the outside of a user's eyebrow is raised or lowered, and avatar parameters indicating the pose of a user's mouth can indicate how much a corner of the user's mouth is raised up or down. In some embodiments, the calling user's holographic avatar can be displayed on the display on the calling user's system as a feedback avatar so that the caller can see how their avatar is being shown to the called user. The views of the feedback avatar shown on the calling user's system can be based on the tracked position on the called user's feature that is being tracked by the called user's system to determine which view of the calling user's avatar is to be shown on the called user's system, in which case the calling user's system receives information from the called user's system indicating the location of the tracked user feature of the called user. In some embodiments, the view of the feedback holographic avatar can be based on a tracked feature of the calling user.

In some embodiments, in-display cameras can be used as part of authenticating a user before granting the user a privilege, such as access to the device, an application, content (e.g., web site, data, documents, music, video) or other resource or information. For example, a device can prompt a user to place one or both thumbs, one or more fingers, or a palm against the display and image sensor data generated by one or more in-display cameras can be utilized to generate one or more thumbprints, one or more fingerprints or a palmprint that can be used for user authentication. A thumb-, finger-, or palmprint generated by a system can be an image or data extracted from a thumb-, finger-, or palmprint image, such as the location and type of various characteristics (e.g., whorls, arches, loops) of a print. In some embodiments, the display prompts the user to press a finger, thumb or palm against the display in an indicated area and captures an image upon detecting a touch to the indicated area. The touch can be detected using touchscreen technology or by using the in-display cameras, as will be discussed in greater detail below. In other embodiments, the prompt to have a user place their finger, thumb, or palm against the display does not include an instruction to touch a specific part of the display. That is, a thumbprint, fingerprint, or palmprint can be captured anywhere within the display area.

Using in-display cameras for authentication can avoid the need for a dedicated fingerprint or thumbprint image sensor and allow for the capability to capture a larger print, such as a palmprint. In some embodiments, multiple prints can be captured simultaneously, such as multiple fingerprints from the same hand. The in-display cameras described herein can be used for capturing thumb-, finger-, or palmprints anywhere in the display area while still being available for general camera usage. The use of in-display cameras for authentication, which can be located anywhere in a display area thus provide advantages over a display that has a dedicated fingerprint or thumbprint sensor located external to the display area or located in a specific area of the display.

In some embodiments, in-display cameras can be used in place of touchscreens to detect an object (e.g., finger, stylus) touching the display surface and determining where on the display the touch has occurred. Some existing touchscreen technologies (e.g., resistance-based, capacitance-based) can add thickness to a display though the addition of multiple layers on top of a transparent display medium while others use in-cell or on-cell touch technologies to reduce display thickness. As used herein, the term "transparent display medium" includes touchscreen layers, regardless of whether the touchscreen layers are located on top of a transparent display medium or a transparent display medium is used as a touchscreen layer. Some existing touchscreen technologies employ transparent conductive surfaces laminated together with an isolation layer separating them. These additional layers add thickness to a display and can reduce the transmittance of light through the display. Eliminating the use of separate touchscreen layers can reduce display expense as the transparent conductors used in touchscreens are typically made of indium tin oxide, which can be expensive.

Touch detection and touch location determination can be performed using in-display cameras by, for example, detecting the occlusion of visible or infrared light caused by an object touching or being in close proximity to the display. A touch detection module, which can be located in the display or otherwise communicatively coupled to the display can receive images captured by in-display cameras and process the image data to detect one or more touches to the display surface and determine the location of the touches. Touch detection can be done by, for example, determining whether image sensor data indicates that the received light at an image sensor has dropped below a threshold. In another example, touch detection can be performed by determining whether image sensor data indicates that the received light at a camera has dropped by a determined percentage or amount. In yet another example, touch detection can be performed by determining whether image sensor data indicates that the received light at a camera has dropped by a predetermined percentage or amount within a predetermined amount of time.

Touch location determination can be done, for example, by using the location of the camera whose associated image sensor data indicates that a touch has been detected at the display (i.e., the associated image sensor data indicates that the received light at an image sensor of the camera has dropped below a threshold, dropped by a predetermined percentage or amount, or dropped by a predetermined percentage or amount in a predetermined amount of time) as the touch location. In some embodiments, the touch location is based on the location within an image sensor at which the lowest level of light is received. If the image sensor data associated with multiple neighboring cameras indicate a touch, the touch location can be determined by determining the centroid of the locations of the multiple neighboring cameras.

In some embodiments, touch-enabled displays that utilize in-display cameras for touch detection and touch location determination can have a camera density greater than displays comprising in-displays cameras that are not touch-enabled. However, it is not necessary that displays that are touch-enabled through the use of in-display cameras have cameras located in every pixel. The touch detection module can utilize image sensor data from one or more cameras to determine a touch location. The density of in-display cameras can also depend in part on the touch detection algorithms used.

Information indicating the presence of a touch and touch location information can be provided to an operating system, an application, or any other software or hardware component of a system comprising a display or communicatively coupled to the display. Multiple touches can be detected as well. In some embodiments, in-display cameras provide updated image sensor data to the touch detection module at a frequency sufficient to provide for the kind of touch display experience that users have come to expect of modern touch-enabled devices. The touch detection capabilities of a display can be temporarily disabled as in-display cameras are utilized for other purposes as described herein.

In some embodiments, if a touch is detected by the system in the context of the system having prompted the user to touch their finger, thumb, or palm against the display to authenticate a user, the system can cause the one or more pixel display elements located at or in the vicinity of where a touch has been detected to emit light to allow the region where a user's finger, thumb, or palm is touching to be illuminated. This illumination may allow for the capture of a fingerprint, thumbprint, or palmprint in which print characteristics may be more discernible or easily extractible by the system or device.

The use of in-display cameras allows for the detection of a touch to the display surface by a wider variety of objects than can be detected by existing capacitive touchscreen technologies. Capacitive touchscreens detect a touch to the display by detecting a local change in the electrostatic field generated by the capacitive touchscreen. As such, capacitive touchscreens can detect a conductive object touching or in close proximity to the display surface, such as a finger or metallic stylus. Because in-display cameras rely on the occlusion of light to detect touches and not on sensing a change in capacitance at the display surface, in-display camera-based approaches for touch sensing can detect the touch of a wide variety of objects, including passive styluses. There are no limitations that the touching object be conductive or otherwise able to generate a change in a display's electrostatic field.

In some embodiments, in-display cameras can be used to detect gestures that can be used by a user to interface with a system or device. A display incorporating in-display cameras can allow for the recognition of two-dimensional (2D) gestures (e.g., swipe, tap, pinch, unpinch) made by one or more fingers or other objects on a display surface or of three-dimensional (3D) gestures made by a stylus, finger, hand, or another object in the volume of space in front of a display. As used herein, the phrase "3D gesture" describes a gesture, at least a portion of which, is made in the volume of space in front of a display and without touching the display surface.

For example, a system can use in-display cameras to identify a "twist" gesture, wherein a user holding a physical object in front of the display rotates the physical object about its longitudinal axis by, for example, rotating the physical object between their finger and thumb. The system can detect the twist gesture by detecting the rotation of the physical object by a user and detecting by how much the physical object has been rotated. The physical object can be any object, such as a pencil, pen, or stylus. In some embodiments, a twist gesture can be the tip of a stylus being moved in a circular or twisting motion in space. Such a twist motion could be determined from a movement of the tip of the stylus extracted from images or video captured by multiple in-display cameras capturing the stylus from various angles.

The twist gesture can be mapped to an operation to be performed by an operating system or an application executing on the system. For example, a twist gesture can cause the manipulation of an object in a CAD (computer-aided design) application. For instance, a twist gesture can cause a selected object in the CAD application to be deformed by the application keeping one end of the object fixed and rotating the opposite end of the object by an amount corresponding to a determined amount of twisting of the physical object by the user. For example, a 3D cylinder in a CAD program can be selected and be twisted about its longitudinal axis in response to the system detecting a user twisting a stylus in front of the display. The resulting deformed cylinder can look like a piece of twisted licorice candy. The amount of rotation, distortion, or other manipulation that a selected object undergoes in response to the detection of a physical object being in front of the display being rotated does not need to have a one-to-one correspondence with the amount of detected rotation of the physical object. For example, in response to detecting that a stylus is rotated 360 degrees, a selected object can be rotated 180 degrees (one-half of the detected amount of rotation), 720 degrees (twice the detected amount of rotation), or any other amount proportional to the amount of detected rotation of the physical object.

Systems incorporating a display or communicatively coupled to a display with in-display cameras are capable of capturing 3D gestures over a greater volume of space in front of the display than what can be captured by only a small number of cameras located in a display bezel. This is due to in-display cameras being capable of being located across a display collectively have a wider viewing area relative to the collective viewing area of a few bezel cameras. If a display contains only one or more cameras located in a display bezel, those cameras will be less likely to capture 3D gestures made away from the bezel (i.e., in the center region of the display) or 3D gestures made close to the display surface. Multiple cameras located in a display area can also be used to capture depth information for a 3D gesture.

The ability to recognize 3D gestures in front of the display area allows for the detection and recognition of gestures not possible with displays comprising resistive or capacitive touchscreens or bezel cameras. For example, systems incorporating in-display cameras can detect 3D gestures that start or end with a touch to the display. For example, a "pick-up-move-place" gesture can comprise a user performing a pinch gesture on the display surface to select an object shown at or in the vicinity of the location where the pinched fingers come together (pinch location), picking up the object by moving their pinched fingers away from the display surface, moving the object by moving their pinched fingers along a path from the pinched location to a destination location, placing the object by moving their pinched finger back towards the display surface until the pinched fingers touch the display surface and unpinching their fingers at the destination location.

During a "pick-up-move-place" gesture, the selected object can change from an unselected appearance to a selected appearance in response to detection of the pinch portion of the gesture, the selected object can be moved across the display from the pinch location to the destination location in response to detection of the move portion of the gesture, and the selected object can change back to an unselected appearance in response to detecting the placing portion of the gesture. Such a gesture could be used for the manipulation of objects in a three-dimensional environment rendered on a display. Such a three-dimensional environment could be part of a CAD application or a game. The three-dimension nature of this gesture could manifest itself by, for example, the selected object not interacting with other objects in the environment located along the path traveled by the selected objected as it is moved between the pinched location and the destination location. That is, the selected object is being picked up and lifted over the other objects in the application via the 3D "pick-up-move-place" gesture.

Variations of this gesture could also be recognized. For example, a "pick-up-and-drop" gesture could comprise a user picking up an object by moving their pinched fingers away from the display surface after grabbing the object with a pinch gesture and then "dropping" the object by unpinching their fingers while they are located above the display. An application could generate a response to detecting that a picked-up object has been dropped. The magnitude of the response could correspond to the "height" from which the object was dropped, the height corresponding to a distance from the display surface that the pinched fingers were determined to be positioned when they were unpinched. In some embodiments, the response of the application to an object being dropped can correspond to one or more attributes of the dropped object, such as its weight.

For example, in a gaming application, the system could detect a user picking up a boulder by detecting a pinch gesture at the location where the boulder is shown on the display, detect that the user has moved their pinched fingers a distance from the display surface, and detect that the user has unpinched their pinched fingers at a distance from the display surface. The application can interpret the unpinching of the pinched fingers at a distance away from the display surface as the boulder being dropped from a height. The gaming application can alter the gaming environment to a degree that corresponds to the "height" from which the boulder was dropped, the height corresponding to a distance from the display surface at which the system determined the pinched fingers to have been unpinched and the weight of the boulder. For example, if the boulder was dropped from a small height, a small crater may be created in the environment, and the application can generate a soft thud noise as the boulder hits the ground. If the boulder is dropped from a greater height, a larger crater can be formed, nearby trees could be knocked over, and the application could generate a loud crashing sound as the boulder hits the ground. In other embodiments, the application can take into account attributes of the boulder, such as its weight, in determining the magnitude of the response, a heavier boulder creating a greater alternation in the game environment when dropped.

In some embodiments, a measure of the distance of unpinched or pinched fingers from the display surface can be determined by the size of fingertips extracted from image sensor data generated by in-display cameras, with larger extracted fingertip sizes indicating that the fingertips are closer to the display surface. The determined distance of pinched or unpinched fingers does not need to be determined according to a standardized measurement system (e.g., metric, imperial), and can be any metric wherein fingers located further away from the display surface are a greater distance away from the display surface than fingers located nearer the display surface.

In some embodiments, displays with in-display cameras can be utilized in the non-invasive monitoring of physiological traits of a user. In one example, in-display cameras can be used in the detection of a user's heart rate by, for example, detecting small variations that occur in the color of a user's skin as the user's capillaries dilate with each heartbeat or by detecting small movements in points on the user's face (e.g., points on the face where light is reflecting) that occur with every heartbeat. Analysis of a recorded heart rate values over time can allow for the determination of heart rate variability. In another example, the respiratory rate of a user can be determined using in-display cameras by monitoring movement of the chest area (e.g., rise and fall of the shoulders, expansion of the chest) with each breath. In yet another example, facial blood flow patterns can be determined from video captured by in-display cameras and matched against trained models to determine a user's blood pressure.

A system utilizing in-display cameras to determine the values of one or more physiological traits of a user can employ the physiological trait values in various manners. In one example, the extracted physiological traits can be tracked over time and stored in a user's health profile stored locally or remotely. The system can monitor the user's historical physiological data over time and notify the user of historical trends, such as whether the values of physiological trait has risen above or dropped below a threshold, has increased or decreased more than a certain percentage over a period of time, or analyzed to possess another characteristic. For example, a system could alert a user if their resting heart rate is above 110 beats per minute, their resting heart rate has dropped by 10% over the past month, or if either their systolic or diastolic blood pressures have increased or dropped by 20% over the past month. The system can provide recommendations along with such events, such as providing encouragement to the user that improved physiological trait numbers (e.g., reduced heart rate or blood pressure) indicate improved health or that worsening numbers are an indication that the user may want to exercise more, eat better, or see a medical professional.

In some embodiments, the system can provide alerts or other feedback to a user in response to analyzing physiological traits in real time. For example, a system monitoring a user's heart rate in real time can alert the user if their heart rate rises above or drops below predetermined thresholds, shows a variability that exceeds a threshold, or increases or drops by a threshold percentage. If the system detects that the user may be experiencing an acute cardiac event, such as a heart attack, it can query the user if the system should attempt to contact someone, such as a community-based emergency responder (e.g., by making a 911 call), the user's emergency contact or co-workers, or a local emergency response team (e.g., a response team where the user works). Alternatively, the system can contact an emergency response team automatically in response to detecting an acute cardiac event.

In some embodiments, a system can use images or videos captured by in-display cameras to determine a user's facial expression, body posture, emotional state, or mood. The system can provide image sensor data generated by one or more in-display cameras to a local application, cloud-based application, or operating system feature capable of detecting a facial expression, body posture, emotional state, or mood from images or videos. The system can alert or provide any other type of communication (e.g., pop-up window, sound, or a combination thereof) to the user in response to detecting a facial expression, body posture, emotional state, or mood. For example, if a system detects a facial expression, body posture, emotional state, or mood indicating the user may be sad, stressed, or exhibiting another negative emotion or mood, the system can suggest that the user take a break from using the computer and engage is some sort of physical activity (walk, stretch, go for a run) in attempt to improve their emotional state or mood. In another example, the system can use a detected facial expression, body posture, emotional state, or mood to determine that a user needs medical attention. For example, if a user's facial expression is one that indicates the user is likely in pain or discomfort and there is a sudden change in the user's breathing or heart rate, the system may present a message on the display suggesting that the user seek medical attention. In another example, if a system detects from a user's body posture that the user has suddenly slumped in their chair, the system could prompt the user to confirm that the user is okay and if the user does not respond, the system can automatically attempt to alert an emergency response team.

The use of in-display cameras to extract physiological traits, facial expressions, body postures, emotional states, or moods of a user can provide enhanced detection of these traits and features over systems or devices that do not have cameras located within the display area. For example, systems comprising a display or communicatively coupled to displays comprising in-display cameras can provide higher resolution images or videos, or more perspectives of a user than possible with systems or devices that only have cameras located outside of their display area. For example, a system with a plurality of in-display cameras can stitch together images from multiple in-display cameras to allow for an improved ability to track the color variation in the skin of a user's face with each heartbeat. In another example, a system can monitor images or videos captured taken by in-display cameras located across the display to determine the rise and fall of a user's shoulders to determine a respiratory rate.

In some embodiments, a system can examine images or videos from multiple in-display cameras and determine which cameras from among them provide the best perspective for determining a physiological trait and use images or videos from the selected cameras for further physiological trait extraction and processing. Which in-display cameras are best for determining a physiological trait, facial expression, emotional state, or mood can depend on conditions such as lighting, the user's body position (standing, sitting, lying down), and the distance between the user and the display and can change in real time as conditions change. In some embodiments, a detected emotional state, body posture, mood, or facial expression of a user can be provided as input to an application such as an interactive storytelling, gaming or job training applications or an operating system.

Displays comprising the in-display cameras described herein have advantages over displays that do not comprise in-display cameras. Displays with in-display cameras may have narrower bezels. A display can contain many in-display cameras, which can allow for the display to capture images of objects in front of the display front various perspectives, which in turn allows for depth sensing in images and videos, and holographic image recording and playback. Groups of in-display cameras with different depths of field in a display can allow for capturing versions of images that have different depths of field, which allow for depth of field adjustment of an image after the image has been captured. Images or videos captured by multiple in-display cameras can be stitched together to create high-resolution composite images or videos (either in real time or post processing). In-display cameras can allow for user authentication by capturing an image of a user's thumb-, finger-, or palmprint anywhere on a display. In-display cameras can be used for purposes other than imaging, such as detecting a touch to a display without the use of touchscreens. Systems incorporating in-display cameras can also be capable of detecting three-dimensional gestures.

FIGS. 7-14 illustrate various methods that can be performed by systems or devices having a plurality of in-display cameras. That is, a plurality of cameras located on the front side of a display substrate of a display of the system or device and within the display area of the display, the display area defined by a plurality of pixels that are also located on the front side of the display substrate.

FIG. 7 illustrates an exemplary image or video generation method. The method 700 can be performed, for example, by a laptop computer having a plurality of two megapixel in-display cameras. At 710, a composite image or video is generated from image sensor data generated by two or more in-display cameras. In the example, a composite image is generated from image sensor data generated by four in-display cameras in the laptop. At 720, the composite image or video is stored. In the example, the composite image is stored locally in laptop storage. In some embodiments, the composite image or video has a resolution greater than the highest resolution of an image or video capable of being captured by any of the in-display cameras. In the example, the composite image has a resolution of six megapixels.

FIG. 8 illustrates an exemplary image or video generation method. The method 800 can be performed, for example, by a laptop computer connected to an external computer monitor having three groups of in-display cameras, each camera group having a different depth of field. At 810, a plurality of original versions of an image or video is captured, the individual original versions of the image or video based on image sensor data generated by one or more of the in-display cameras, the individual original versions of the image or video having a depth of field different from the depths of field of the other original versions of the image. In the example, the laptop captures three versions of an image of a user positioned in front of the computer monitor. The three versions of the image are captured by a camera in each of the three camera groups, the three versions of the image each having a different depth of field. In 820, the original versions of the image or video are stored. In the example, the three versions of the image are stored in the laptop.

In other embodiments, the method 800 can comprise fewer, alternative, or more actions. For example, in some embodiments, the method 800 can further generate a new version of the image or video based on one or more of the original versions of the image or video, the new version having a new depth of field different from the depths of field of the original versions, and store the new version of the image or video. The method 800 can further receive a user selection of an object in one of the original versions of the image or video and determine the new depth of field based at least in part on the selected object. In the example, a user can bring up one of the original views of the image and select a second person in the image located just behind the user as an object to bring into focus. The laptop determines a new depth of field that would bring the second person in focus and generates a new version of the image of the user with the second person in focus based on a version of the image with the user in focus and a version of the image with objects behind the second user in focus.

Figure 9:
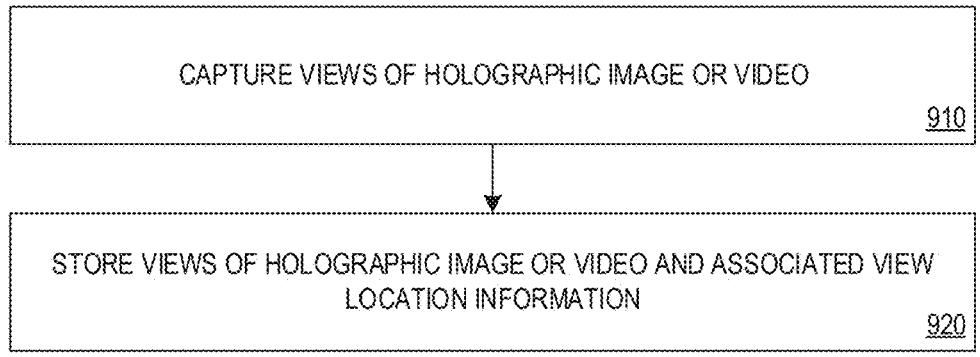
FIG. 9 illustrates an exemplary holographic recording method.

FIG. 9 illustrates an exemplary holographic recording method. The method 900 can be performed, for example, by a 2-in-1 convertible laptop with a display comprising in-display cameras. At 910, a plurality of views of a holographic image or video is captured, the individual views having associated view location information indicating the location of the different cameras that captured each individual view. In the example, the 2-in-1 convertible captures 25 different views of the user from 25 different in-display cameras. At 920, the views of the holographic image or video and the associated view location information are stored. In the example, the holographic image of the user comprises the 25 views captured by the 2-in-1 convertible laptop camera and the holographic image is stored at the convertible laptop.

In other embodiments, the method 900 can comprise fewer, alternative, or more actions. For example, in some embodiments where a holographic video has been captured, the method 900 can receive information from a second system indicating a position of a feature of a user of the second system, select one of the holographic video views based at least in part on the second user's position information and the view location information associated with the holographic video views, and transmit the selected holographic video view to the second system. In the example, the user of the 2-in-1 convertible can be in a video call with a second user. The user's 2-in-1 receives information from the second user's system indicating that the second user's head is positioned to the left of the center of the display of the second user's system. The user's 2-in-1 laptop selects a view of the holographic video that was captured by a camera to the left of center of the display of the 2-in-1 laptop based on the received user feature position information and the view location information of the holographic videos views, and then transmits the selected view of the holographic video to the second user's system. The selected view of the holographic video is shown in a small window in the lower left of the display of the 2-in-1 laptop to provide the user with a feedback view, the holographic video of the user being viewed by the second user.

Figure 10:
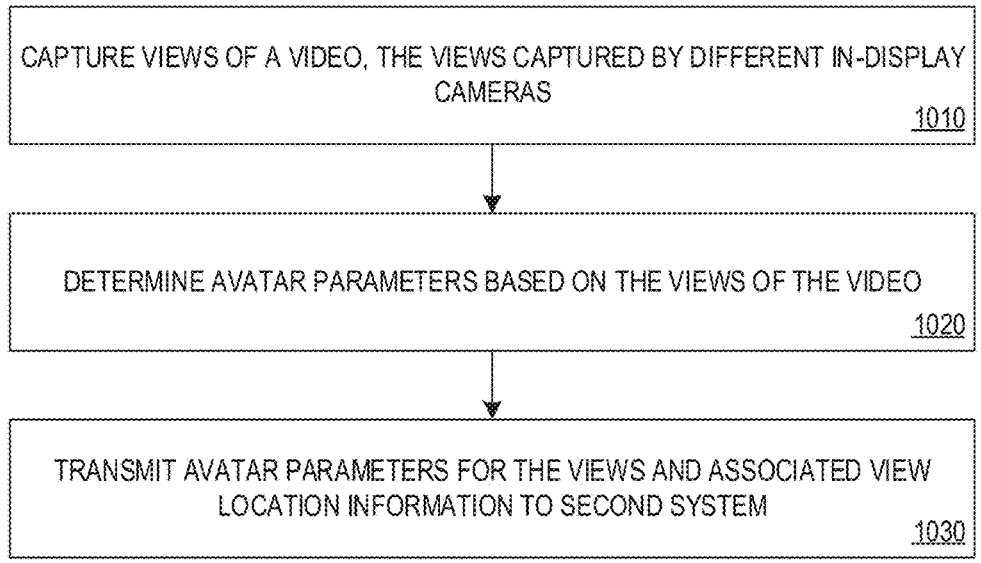
FIG. 10 illustrates an exemplary holographic avatar method.

FIG. 10 illustrates an exemplary holographic avatar method. The method 1000 can be performed, for example, by a tablet having a display with in-display cameras. A video call application is operating on the tablet user has selected that their avatar be shown to the other party during the call. At 1010, a plurality of views of a video are captured, the individual views comprising image sensor data generated by one of the in-display cameras, the individual views captured by different cameras of the plurality of cameras and associated with view location information indicating the location of the camera used to capture the individual view. In the example, the tablet captures multiple views of the user, each view being taken by one of the in-display cameras and providing a different perspective of the user. At 1020, one or more avatar parameters from the individual views of the video are determined. In the example, the tablet determines avatar parameters (head size, head orientation, eyebrow pose, mouth pose, left and right eye poses, etc.) for the user's avatar for each of the captured video views. At 1030, the avatar parameters for the one or more of the views and the view location information associated with the one or more views is transmitted to a second system. In the example, the tablet transmits the avatar parameters for one or more of the views of the user the second system.

In other embodiments, the method 1000 can comprise fewer, alternative, or more actions. For example, in some embodiments, the method 1000 can further comprise receiving information indicating a position of a feature of a user of a second system and selecting a view based at least in part on the received position information and the view location information associated with the views, and transmit the avatar parameters for the selected view to the second system. In yet other embodiments, the method 1000 can further cause the user's avatar as displayed to the second user to be shown on the display of the user's system as a feedback avatar.

FIG. 11 illustrates an exemplary authentication method. The method 1100 can be performed, for example, by a laptop with a display comprising in-display cameras that a user is attempting to log in to. At 1110, a user is prompted to touch one or more fingers, one or more thumbs, or a palm against the display. In the example, upon hitting a key on the laptop keyboard, the laptop wakes and presents an authentication screen that prompts the user to touch the laptop display with their index finger. At 1120, one or more fingerprints, one or more thumbprints or a palmprint is captured based on image sensor data generated by one or more of the in-display cameras. In the example, the user touches on of their index fingers against the display in response to the prompt and the laptop captures an image of the user's fingerprint using one or more of the in-display cameras. At 1130, the user is authenticated based at least in part on the captured one or more fingerprints, one or more thumbprints or a palmprint. In the example, the laptop extracts features from the captured fingerprint and compares them to a database of fingerprint features of users allowed to access the laptop. At 1140, a privilege is granted to the authenticated user. In the example, the authenticated user is granted access to the laptop.

Figure 12:
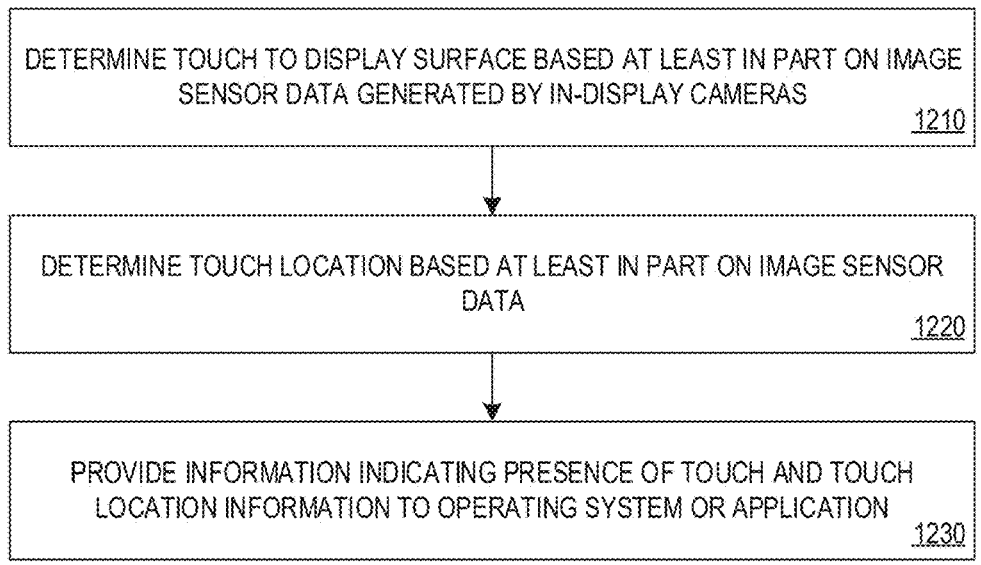
FIG. 12 illustrates an exemplary touch detection method.

FIG. 12 illustrates an exemplary touch detection method. The method 1200 can be performed, for example, by a laptop with a display comprising a plurality of in-display cameras that allow for a touch-capable display. At 1210, a touch to the surface of the display is determined based at least in part on image sensor data generated by one or more of the in-display cameras. In the example, the laptop determines that a user has touched the display based on image sensor data generated by the in-display cameras. At 1220, a touch location is determined based at least in part on the image sensor data. In the example, the laptop determines as the touch location the location of the camera that generated the image sensor data indicating the presence of a touch. At 1230, information indicating the presence of the touch and touch location information is provided to an operating system or an application. In the example, information indicating that the user has touched the laptop display surface and the location on the laptop display where the touch occurred are provided to the laptop operating system.

Figure 13:
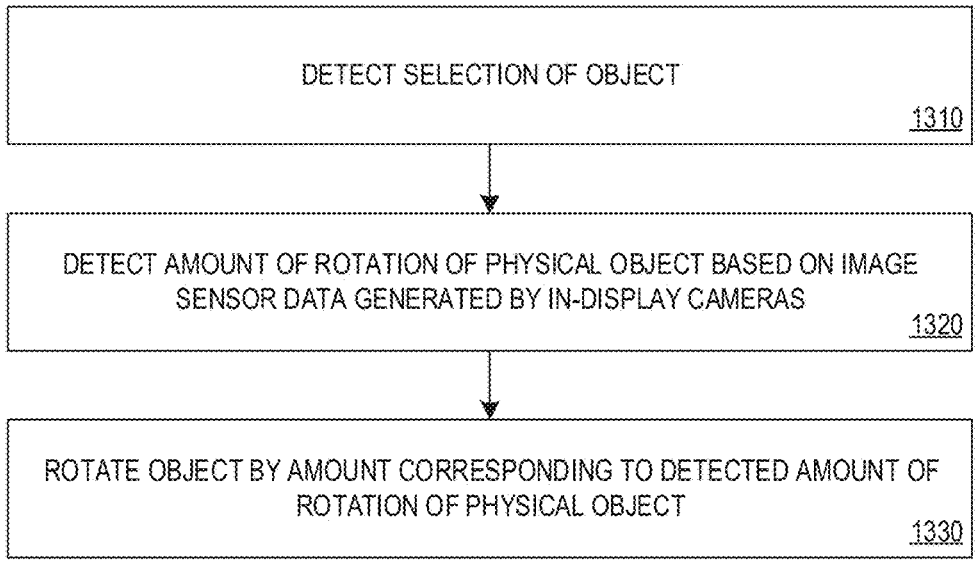
FIG. 13 illustrates an exemplary object rotation method.

FIG. 13 illustrates an exemplary object rotation method. The method 1300 can be performed, for example, by a laptop with a display comprising in-display cameras and operating a 3D CAD application in which a user is designing a piece of furniture. At 1310, selection of an object in an application operating on the system is detected. In the example, the user selects a cylindrical object in the CAD application with a stylus, the cylindrical object representing a leg to the piece of furniture. At 1320, an amount of rotation of a physical object based at least in part on image sensor data generated by one or more of the in-display cameras is detected. In the example, the laptop detects an amount of rotation of the stylus based on image sensor data generated by one or more of the laptop's in-display cameras. At 1340, the application rotates the object by an amount corresponding to the detected amount of rotation of the physical object. In the example, the laptop detects the user twisting the stylus 180 degrees and in response, rotates the cylindrical object by 180 degrees.

In other embodiments, the method 1300 can comprise fewer, alternative, or more actions. For example, in one embodiment, instead of rotating the selected object, the method 1300 can deform an object by an amount corresponding to the detected amount of rotation of the physical object. The deformation can be performed by the application keeping an end of the object stationary and rotating an opposite end by an amount corresponding to the detected amount of rotation of the physical object. In the example, in response to the user twisting the stylus 180 degrees instead of rotating the cylindrical object, the CAD application deforms the cylindrical object by twisting it about its longitudinal axis by 180 degrees.

FIG. 14 illustrates an exemplary object movement method. The method 1400 can be performed, for example, by a tablet with a display comprising a plurality of in-display cameras and executing a war strategy game. At 1410, the selection of an object in an application shown on a display of a system is detected by detecting a pinch gesture on a surface of the display based at least in part on image sensor data from one or more of the in-display cameras, wherein the pinch gesture has a pinch location and the selected object is located at or in the vicinity of the pinch location. In the example, a tablet user picks up a catapult in the game by pinching their fingers on the display at the position where the catapult in located to move it further away from a castle on the battlefield. At 1420, the appearance of the selected object is caused to change from an unselected appearance to a selected appearance in response to the selection of the object. In the example, the tablet causes the appearance of the catapult to change from a solid appearance to a semi-transparent appearance. At 1430, the pinched fingers are detected to move along a path from the pinch location to a destination location based at least in part on the image sensor data. At 1440, a portion of the path along which the pinched fingers are not in contact with the display is detected. In the example, the tablet detects the user's pinched fingers moving away from the tablet display surface at catapult's original location, along a path to a position further away from the castle, and back up against the surface of the tablet at the location where the catapult is to be placed. At 1450, the object is caused to move from the pinch location to the destination location on the display. In the example, the tablet causes the catapult to move from its original position to the position further away from the castle. At 1460, an unpinching gesture is detected on the display at the destination location. In the example, the user unpinches their fingers where the catapult is to be dropped and the unpinching is detected by the tablet. At 1470, the appearance of the object is caused to change from the selected appearance to the unselected appearance. In the example, the appearance of the catapult is caused to change from a semi-transparent appearance to an unselected solid appearance.

In other embodiments, the exemplary methods illustrated in FIGS. 7-14 can comprise fewer, alternative, or more actions than those shown and described above.

In-Display Thermal Sensors

Thermal sensors can also be located in the display area of a display. As used herein, the term "in-display thermal sensor" refers to any thermal sensor located within the display area of a display. An in-display thermal sensor can be located within the pixel area of a pixel in a manner similar to in-display cameras 420 and 421 shown in FIGS. 4A and 4B. In some embodiments, in-display thermal sensors can span across multiple pixels in a manner similar to in-display cameras 425 and 426 as shown in FIGS. 4C and 4D. In-display thermal sensors can be silicon diode temperature sensors, silicon FET (field-effect transistor) temperature sensors, or any other device capable of generating sensor data from which the temperature at the location of the thermal sensor can be determined.

In some embodiments, in-display thermal sensors can be discrete thermal sensors manufactured independently from pixel display elements and the discrete thermal sensors are attached to a display substrate after they are manufactured. In other embodiments, thermal sensors can be fabricated directly on a display substrate. In embodiments where thermal sensors are fabricated on a display substrate, the thermal sensors can reside at least partially within the display substrate. In-display thermal sensors can be incorporated into a display in a wide variety of numbers and arrangements. In-display thermal sensors can be arranged in a manner similar to the arrangement of in-display cameras shown in FIGS. 1 and 2A-2C. In some embodiments, thermal sensors are located on a back side of the display substrate.

In some embodiments, thermal sensor data generated by in-display thermal sensors can be provided to a display thermal processing module located in the display or external to the display. The display thermal management module can perform various actions based on thermal sensor data generated by the in-display thermal sensors, such as determining a display temperature for the display as a whole, for various portions of the display, or for individual pixels. The display thermal management module can also determine whether an overall temperature for the display, a portion of the display, or for individual pixels exceeds a temperature threshold.

In some embodiments, a display comprising in-display thermal sensors or a system communicatively coupled to such a display can determine that a display temperature based at least in part on display thermal sensor data generated by one or more in-display thermal sensors exceeds a display temperature threshold and take one or more actions to reduce the display temperature. For example, the display or system can reduce a refresh rate or a brightness of the display. The brightness of the overall display or of a region of the display can be reduced to reduce an overall temperature of the display or the temperature of a region of the display. In some embodiments, the display temperature threshold can be a pre-determined threshold, such as a threshold determined by a manufacturer of the display or system. In other embodiments, a display temperature threshold can be user-specified. For example, a user of a touch-enabled system can decide that they prefer to have a display temperature of a touch-enabled displayed that is cooler and set a display temperature threshold lower than default or manufacturer-determined values. Keeping the display temperature of a touch-enabled display below a threshold can result in a more pleasant user experience.

In some embodiments, a system comprising a display with in-display thermal sensors can adjust system performance based at least in part on display thermal sensor data generated by the in-display thermal sensors. For example, a system can comprise thermal sensors in addition to the display thermal sensors, such as thermal sensors integrated into individual system components (e.g., processors, memory, storage) or platform- or system-level thermal sensors. The thermal sensor data generated by the display thermal sensors and additional thermal sensors can be used to determine that the performance of one or more system components can be increased without the system exceeding a system performance threshold. System performance thresholds can be a temperature, power, or other performance metric threshold. The system can increase the performance of a system component by increasing its operating voltage, increasing its operating frequency, enabling a high-performance mode (e.g., a turbo mode), increase a display brightness or refresh rate, or through other actions.

A system can similarly take an action to reduce the performance of a system component if the system determines, based at least in part on the thermal sensor data provided by the display thermal sensors and the additional thermal sensors that a system performance metric (e.g., system temperature, system power consumption), a display performance metric (e.g., display temperature, display power consumption), or a component performance metric (e.g., component temperature, component power consumption) exceeds a system performance threshold, display performance threshold, or component performance threshold, respectively. In response, the system can take one or more actions to reduce the performance of the display or one or more of the additional system components. The system can decrease the performance of a system component by decrease its operating voltage, decrease its operating frequency, enabling a low-performance mode (e.g., a sleep mode or a hibernation mode), reduce a display brightness or refresh rate, or through other actions.

In embodiments comprising a display with micro-LEDs as the display elements, the display can be managed to account for the color degradation or brightness reduction that can occur in micro-LEDs due to aging or operating at higher temperatures. For example, a display with micro-LEDs or a system communicatively coupled to such a display can monitor a usage time for individual pixels or individual display elements within a pixel. The usage time for a pixel can be an amount of time one or more of its display elements is active or is active above a certain level. The system can monitor usage time for individual pixels, monitor an average usage time for pixels within a region of a display or the entire display and can correspondingly adjust the color or brightness of individual pixels, pixels within a region of a display, or for all pixels in a display. In some embodiments, the system can adjust the brightness of individual display elements within a pixel to account for aging or higher temperatures.

To account for brightness reduction in micro-LEDs that can occur from operating a micro-LED at higher temperatures, a display with micro-LEDs or a system communicatively coupled to such a display can monitor a usage temperature for individual pixels or individual display elements within a pixel, a usage temperature for pixels within a region of the display, or a usage temperature for pixels across the entire display. The usage temperature for a pixel can be the current temperature of a pixel or a measure of a pixel temperature (e.g., average, median) over a recent time period, which can be on the order of seconds, minutes, hours, or longer time periods. The system can adjust the brightness of individual pixels, pixels within a region of a display, or all pixels in a display to account for temperature-induced brightness degradation.

In some embodiments, a display with micro-LEDs as the display elements or a system communicatively coupled to such a display can account for manufacturing variations in color and brightness between micro-LEDs. For example, the variation of the color and brightness of individual pixels from a baseline color or brightness can determined. In some embodiments, a baseline color or brightness can be a color or brightness that manufactured micro-LEDs are expected to possess, or an average or median color or brightness based on measured color or brightness of micro-LEDs in a particular display. Performance variation information (e.g., color manufacturing variation, brightness manufacturing variation) for individual LEDs can be stored locally at the display, in a system communicatively coupled to the display, or remotely and the performance variation information can be used by the display or system to adjust the color or brightness of individual pixels. Performance variation information can indicate an absolute or relative measure of an LED's variation from baseline performance.

In some embodiments, in-display thermal sensors can be used to enable touch-sensitive displays without the need for a touchscreen. For example, a display with in-display thermal sensors or a system communicatively coupled to such a display can detect a touch location and determine the location of the touch on the display based on detecting a rise in temperature at a point on the display surface resulting from a touch to the display by a user's finger. The system can determine the presence of a touch to the display by determining that the display thermal sensor data for one or more display thermal sensors indicated that a temperature at the thermal sensor has risen above a threshold, has increased by a predetermined percentage or predetermined amount, or has increased by a predetermined percentage or predetermined amount within a predetermined amount of time.

Touch location determination using in-display thermal sensors can be done, for example, by using the location of the in-display thermal sensor that generated the display thermal sensor data indicating that a touch has been detected at the display as the touch location. If display thermal sensor data associated with multiple neighboring display thermal sensors indicate a touch, the touch location can be determined by determining the centroid of the locations of the multiple neighboring thermal sensors.

Displays comprising the in-display thermal sensors described herein have advantages over displays that do not comprise in-display thermal sensors. The incorporation of thermal sensors into the display area of a display can allow for improved control of the display temperature, improved control of system performance, the ability to compensate for the reduction in micro-LED performance due to age or higher operating temperatures, and thermal-based touch detection.

FIGS. 15-18 illustrate various methods that can be performed by systems or devices having a plurality of thermal sensors located on the front side of a display substrate of a display of the system or device and within the display area of the display, the display area defined by a plurality of pixels that are also located on the front side of the display substrate.

Figure 15:
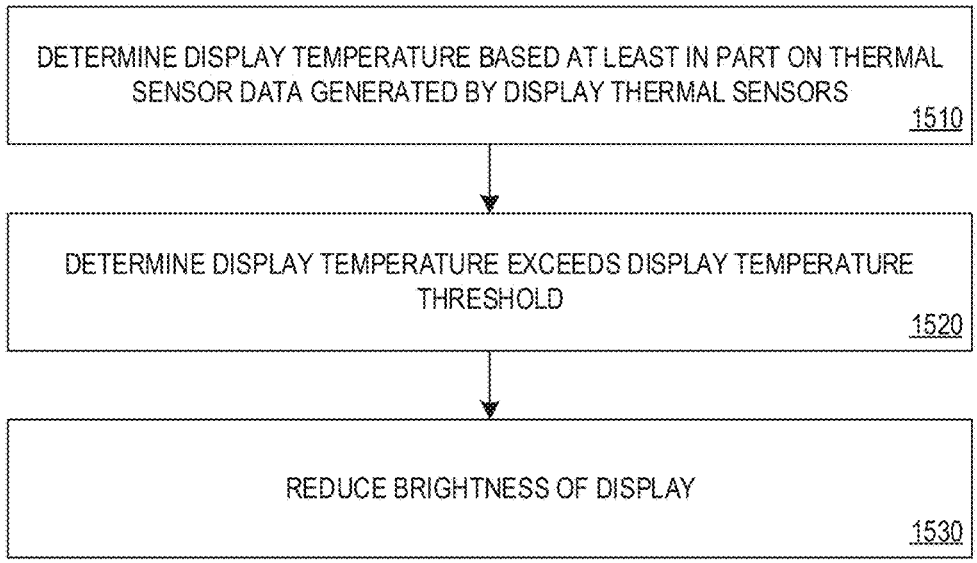
FIG. 15 illustrates an exemplary display temperature control method.

FIG. 15 illustrates an exemplary display temperature control method. At 1510 in method 1500, a display temperature is determined based at least in part on thermal sensor data generated by one or more in-display thermal sensors. At 1520, the display temperature is determined to exceed a display temperature threshold. At 1530, a brightness of the display as a whole or a region of the display is reduced in response to determining that the display temperature exceeds a display temperature threshold. In other embodiments of the method 1500, instead of reducing a brightness of the display, a refresh rate of the display can be reduced.

FIG. 16 illustrates an exemplary system performance management method. At 1610 of method 1600, a determination is made that performance of the display or one or more of the additional system components can be increased without exceeding a system performance threshold, based at least in part on display thermal sensor data generated by one or more in-display thermal sensors and additional thermal sensor data generated by one or more additional thermal sensors. At 1620, the performance of the display or at least one additional system components is increased. In some embodiments of the method 1600, the performance of the display can be increased by increasing a refresh rate or brightness of the display. In other embodiments of the method 1600, the performance of additional components can be increased by increasing an operating voltage or operating frequency of the component.

FIG. 17 illustrates an exemplary display performance adjustment method. At 1710 of the method 1700, a usage time is monitored for a monitored pixel in a display. At 1720, a brightness of one or more of the display elements of the monitored pixel is adjusted based at least in part on the usage time for the monitored pixel. In other embodiments of the method 1700, a color of the monitored pixel can be adjusted based on the usage time. In yet other embodiments, at 1710 usage temperature is monitored instead of a usage time and at 1720, a brightness of one or more display elements of the monitored pixel or a color of the monitored pixel is caused to be adjusted based at least in part on the usage temperature for the monitored pixel.

Figure 18:
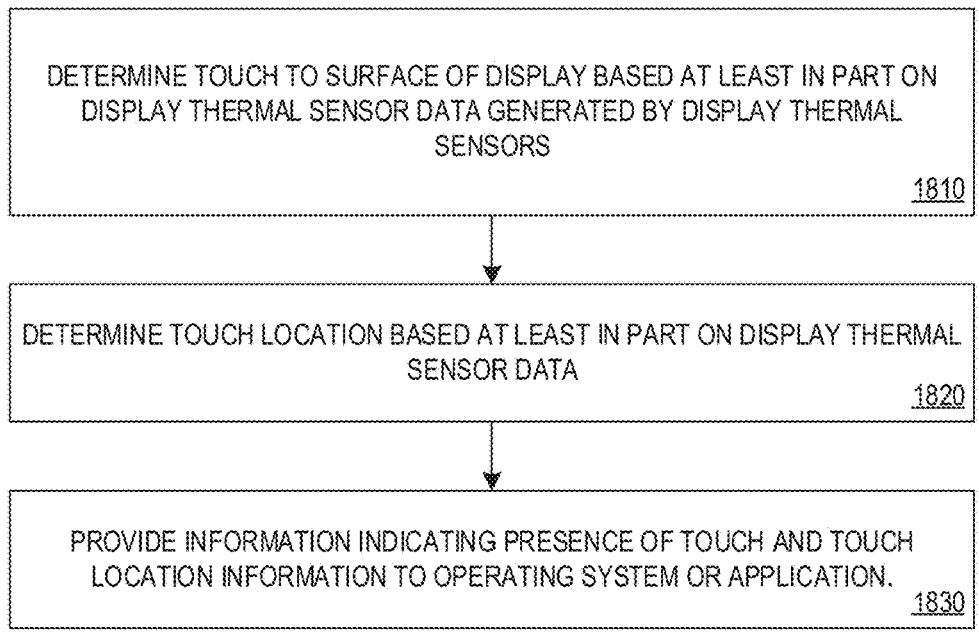
FIG. 18 illustrates an exemplary touch detection method.

FIG. 18 illustrates an exemplary touch detection method. At 1810 in the method 1800, a touch to the surface of the display is determined based at least in part on display thermal sensor data generated by one or more in-display thermal sensors. At 1820, a touch location is determined based at least in part on the display thermal sensor data. At 1830, information indicating the presence of the touch and the touch location information is provided to an operating system or an application.

In other embodiments, the exemplary methods illustrated in FIGS. 15-18 can comprise fewer, alternative, or more actions than those shown and described above.

Viewing Angle Adjustment Microassemblies

Figure 19A:
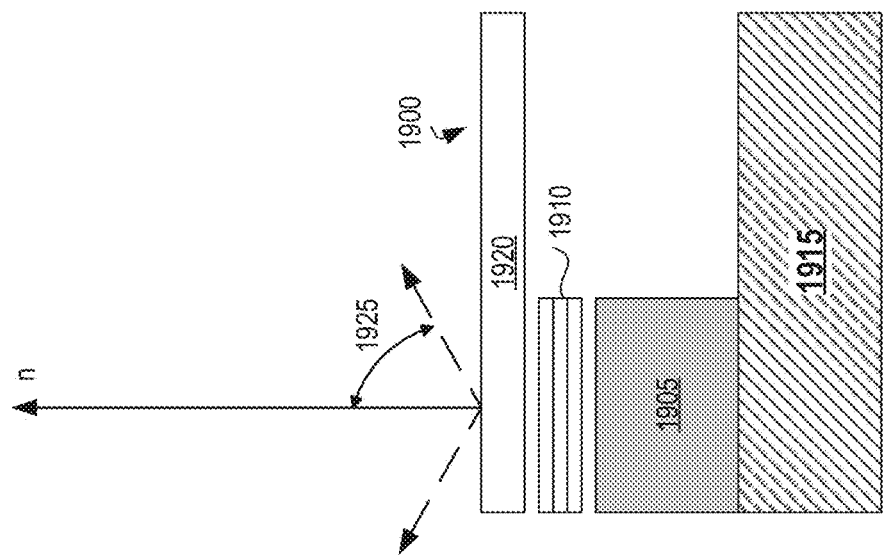
FIGS. 19A-19C illustrate simplified exemplary pixels with microlens assemblies capable of adjusting the viewing cone angle of individual pixels.
Figure 19B:
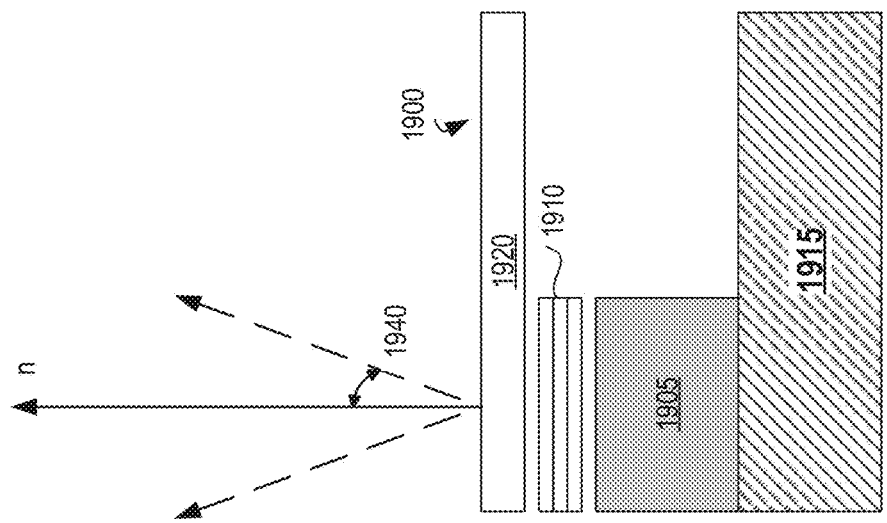
Figure 19C:
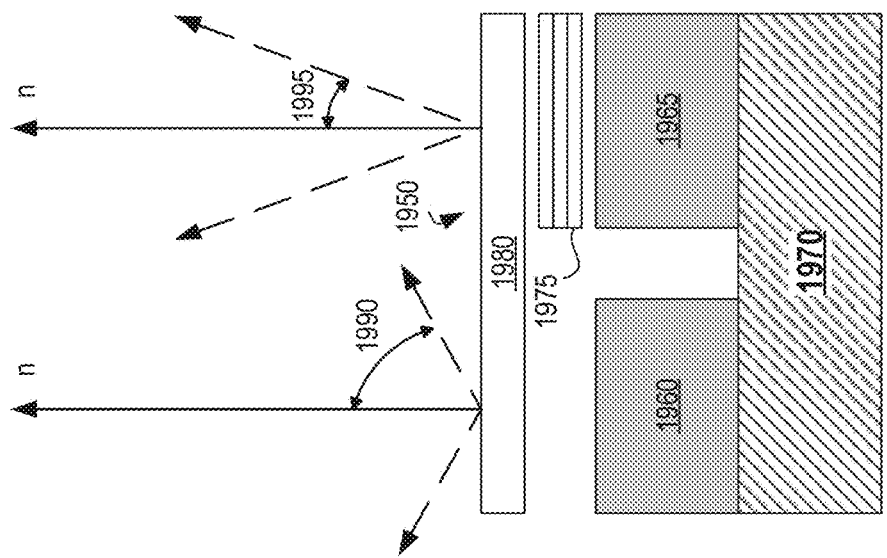

Microassemblies capable of adjusting viewing angles of a display can be incorporated into the display area. FIGS. 19A-19C illustrate simplified exemplary pixels with microlens assemblies capable of adjusting the viewing cone angle of individual pixels. FIG. 19A illustrates an exemplary pixel 1900 comprising display elements 1905, a microlens assembly 1910, a display substrate 1915, and a transparent display medium 1920. The microlens assembly 1910 comprises one or more microlenses that are collectively capable of adjusting a viewing cone angle 1925 for the pixel. The viewing cone for a display, a portion of a display, or a pixel comprises the directions from which displayed content can readily be seen by a user (e.g., without any distortion or artifacts). The viewing cone angle 1925 for the pixel 1900 is measured from a normal extending from a surface of the transparent display medium 1920.

The microlens assembly 1910 acts as a collimating lens. In a first mode of operation, the microlens assembly allows for a viewing cone with a viewing cone angle greater than that in a second mode of operation. The microlens assembly is capable of changing the viewing cone angle by adjusting the relative positions of one or more lenses in the microlens assembly. Individual microlenses within the microlens assembly can be adjusted via MEMS-based actuators or by other approaches. FIG. 19B shows the pixel 1900 with the microlens array 1910 adjusted to reduce the angle of the viewing cone to a reduced viewing cone angle 1940.

FIG. 19C illustrates an exemplary pixel 1950 comprising a first set of display elements 1960, a second set of display elements 1965, a display substrate 1970, a microlens assembly 1975, and a transparent display medium 1980. The pixel 1950 is capable of producing light with two viewing cones having different viewing cone angles. In a first mode of operation, the first set of display elements 1960 are active and the pixel has a wider viewing cone with a viewing cone angle 1990. In a second mode of operation, the second set of display elements 1965 are active and the pixel has a narrower viewing cone with a viewing cone angle 1995.

FIG. 20A illustrates a simplified top view of a pixel array with an adjustable viewing angle. The pixel array 2000 is located on a microassembly capable of adjusting the viewing angle of the pixel array by physically tilting the array. The pixel array 2000 can be a portion of the pixels in a display area and a display substrate can comprise multiple pixel arrays. FIGS. 20B-D illustrate simplified side views of a pixel array located on a microassembly that can adjust the viewing angle of the pixel array. FIG. 20B comprises the pixel array 2000 located on a microassembly 2010 capable of adjusting the viewing angle of the pixel array. The microassembly 2010 is located on top of display substrate 2020. In some embodiments, a pixel array 2000 can be located on top of and adjacent to the display substrate with the microassembly located underneath the display assembly.

The microassemblies capable of adjusting the viewing angle of a pixel array can be implemented via MEMS-based actuators or by any other method. In some embodiments, the microassemblies can alter the viewing angle of the pixel array in both the x- and y-directions by tilting the pixel array. In embodiments where the microassemblies are located under the pixel array and the display substrate, the microassembly tilts both the pixel array and the corresponding display substrate portion (not shown in FIGS. 20B-D). FIGS. 20B-20D show adjustment of the x-component of the viewing angle of the pixel array 2000. The viewing angle is the angle between a normal vector 2040 extending from the pixel array 2000 and a normal vector 2050 extending from a surface of the display 2055. FIG. 2B shows the pixel array 2000 with no viewing angle adjustment and a viewing angle of zero. FIG. 2C shows the x-component of the viewing angle adjusted in a first direction to a first viewing angle value 2060 and FIG. 2D shows the x-component of the viewing angle adjusted in the opposite direction to a second viewing angle 2070. The microassembly 2010 can similarly adjust the y-component of the viewing angle of the pixel array 2000.

Microassemblies capable of adjusting the viewing angle of one or more pixels can be controlled by a microassembly controller located in the display or external to the display. In some embodiments, the microassembly controller can receive information indicating which microassemblies are to be adjusted and by how much the viewing angle is to be adjusted in the x- and y-directions for each microassembly. In other embodiments, the microassembly controller can receive information indicating what portion of a display needs to have viewing angles adjusted and determine which microassemblies need to be adjusted. In other embodiments, the microassembly controller receives a position in front of a display to which one or more pixel arrays are to be oriented and determines the viewing angle adjustment that needs to be applied to the appropriate microassemblies. Different microassemblies can adjust their associated pixels or pixel arrays to different viewing angles.

The pixel array 2000 shown in FIGS. 20A-D illustrates just one pixel array size that can be located on a microassembly. Pixel arrays having fewer or more pixels than those shown in pixel array 2000 can be located on individual microcontrollers. In some embodiments, individual pixels can be controlled by individual microassemblies.

FIGS. 19A-19C and 20A-20D illustrate exemplary ways to restrict the viewability of content shown on a display through the use of microassemblies, i.e., microlens assemblies capable of narrowing the viewing cone and microassemblies capable of adjusting the viewing angle of pixels. Being able to restrict the viewability of content shown on a display can provide for increased security for the content being shown or increased privacy for a user. Narrowing the viewing cone or adjusting the viewing angle of pixels displaying sensitive content can decrease the likelihood that someone other than the user sitting directly in front of the display can view the content being displayed. Thus, in some embodiments, the ability to restrict the viewability of content shown on a display can allow for a privacy mode wherein content shown on a display is shown with reduced viewability and a normal mode wherein content is shown with normal viewability (i.e., non-reduced viewability). In other embodiments, more than two viewability modes can be provided, with each mode having a different level of viewability. For example, a system can have three levels of viewability (e.g., normal, secret, top secret) with each level having its own level of viewability.

In some embodiments, not all pixels have associated microassemblies for adjusting their viewing cone angle or viewing angle. For example, a display can contain one or more pixels that do not have a corresponding microlens assembly or are not located on a microassembly capable of adjusting the pixel viewing angle.

In some embodiments, the viewability of displayed content can be reduced based on user selection. For example, a user can select reduced viewability for displayed content by selecting a window or by changing an operating system display setting. In some embodiments the display is touch-enabled, and a user can select content for reduced visibility by touching the display. For example, a user can touch the display where a window is displaying sensitive content and the system can reduce the viewability of the window's contents in response to the touch. In some embodiments, a user touching the screen can result in reduced viewability for all information displayed on a display. In some embodiments, an image of the user's fingerprint can be captured when the user touches the screen using in-display cameras as described herein and the user is authenticated based on the captured fingerprint before the content is shown to the user with reduced viewability.

In some embodiments, the location of the computing device can be used as a factor in determining whether content is to be shown with reduced viewability. For example, a device can automatically reduce the viewability of all or a portion of a display if the device determines that it is located outside the vicinity of one or more user-designated private locations, such as the user's home or workplace. In another example, the device can restrict viewability if it determines that it is in a public location. A device can determine if it is in a public location by, for example accessing a local or remote map or geographical database from which it can determine that the device is in a public location, such as an airport, shopping mall, or sporting venue.

In some embodiments, a device can determine whether content is to be displayed with restricted viewability based on the content to be displayed. For example, prior to displaying a document, a device can search the contents of the document for one or more sensitive information keywords or phrases (e.g., "secret information", "confidential", "top secret information") and display the document with reduced viewability if any of the sensitive information keywords or phrases are found in the document. In some embodiments, the device can present a prompt to the user that they may want to view a document with reduced viewability based on the contents of the document prior to display the document.

In some embodiments, the device can also consider the location within the document of the sensitive information keywords or phrases as a factor in deciding whether to automatically present content with reduced viewability. For example, a device can automatically display a document with reduced viewability if it determines that sensitive information keywords or phrases are located in the header or footer of a document. In some embodiments, metadata information within a file can be examined to determine whether to display content with reduced viewability. For example, a device can display content in a file with reduced viewability if its metadata information indicates that a security setting is set above a normal security level, that the file is a private file, that a viewability setting is set a reduced level, etc. In other examples, the device can search content for one or more sensitive information images and cause the content to be displayed with reduced viewability if the content contains one or more of the sensitive information images.

In some embodiments, a device can select content to be displayed with reduced visibility based in part on where a user is looking at on a display. For example, one or more cameras located in a display or a computing device can capture an image of a user's eyes, determine an eye gaze location within the display area based on the captured image, and reduce the viewability of content being shown at the eye gaze location. In some embodiments, the content displayed with reduced viewability changes as a user looks to different areas of the display. In some embodiments, the remainder of the content being displayed can be kept sensitive by reducing its viewability in other matters. For example, the content shown with reduced viewability can be shown with a normal level of brightness and the remainder of the content shown on the display can be shown with a reduced brightness to keep the remainder of the content private.

Content displayed with reduced viewability can have its viewability increased. For example, a user can provide an indication that reduced viewability for content is to be turned off or that the content is to be displayed with an increased level of viewability. In some embodiments, the device can increase viewability of content automatically. For example, a device can automatically display content in a non-restricted viewability mode upon determining that the device has returned to a user-designated private location or in response to determining that the device's location information indicates that it is no longer in a public location based on information accessed from a local or remote database.

FIGS. 21-22 illustrate various methods that can be performed by systems or devices having microassemblies capable of adjusting the viewing cone angle or viewing angle. Such systems or devices comprise a display or are communicatively coupled to a display comprising a display substrate. The display substrate comprises a front side, a plurality of pixels located on the front side of the display substrate, the plurality of pixels defines a display area, and the individual pixels comprise one or more display elements.

FIG. 21 is a first exemplary viewing angle adjustment method. At 2110 in a method 2100, content to be displayed on a display of a computing system with reduced viewability is determined. The display comprises a plurality of microlens assemblies, the individual microlens assemblies being located above the display elements of pixels of the display and capable of adjusting a pixel's viewing cone angle. At 2120, the microassemblies located above a first set of the pixels located in an area on the display within which the content is to be displayed reduces viewability of the first set pixels by reducing their viewing cone angle.

FIG. 22 is a second exemplary viewing angle adjustment method. At 2210 in a method 2200, an indication is received from a user that content is to be displayed with reduced viewability. The display comprises a plurality of microlens assemblies, the individual microlens assemblies being located above the display elements of pixels of the display and capable of adjusting a pixel's viewing cone angle. At 2220, the microlens assemblies located above a first set of the pixels located in an area on the display within which the content is to be displayed reduces viewability of the first set pixels by reducing their viewing cone angle.

Displays comprising microassemblies capable of adjusting the viewing cone angle or viewing angle of pixels have advantages over displays that lack such microassemblies. These displays allow for a user to dynamically select contact shown on a display for restricted viewability without the need to attach a physical privacy or security filter. The microassemblies described herein allow for a portion of the shown content to be displayed with restricted viewability, whereas a physical filter typically reduces the viewability of the entire display. In addition, content can be selected to be shown with restricted viewability automatically by a device based on the device's location, the contents of the content to be displayed, by tracking a user's gaze, or other factors.

Figure 23:
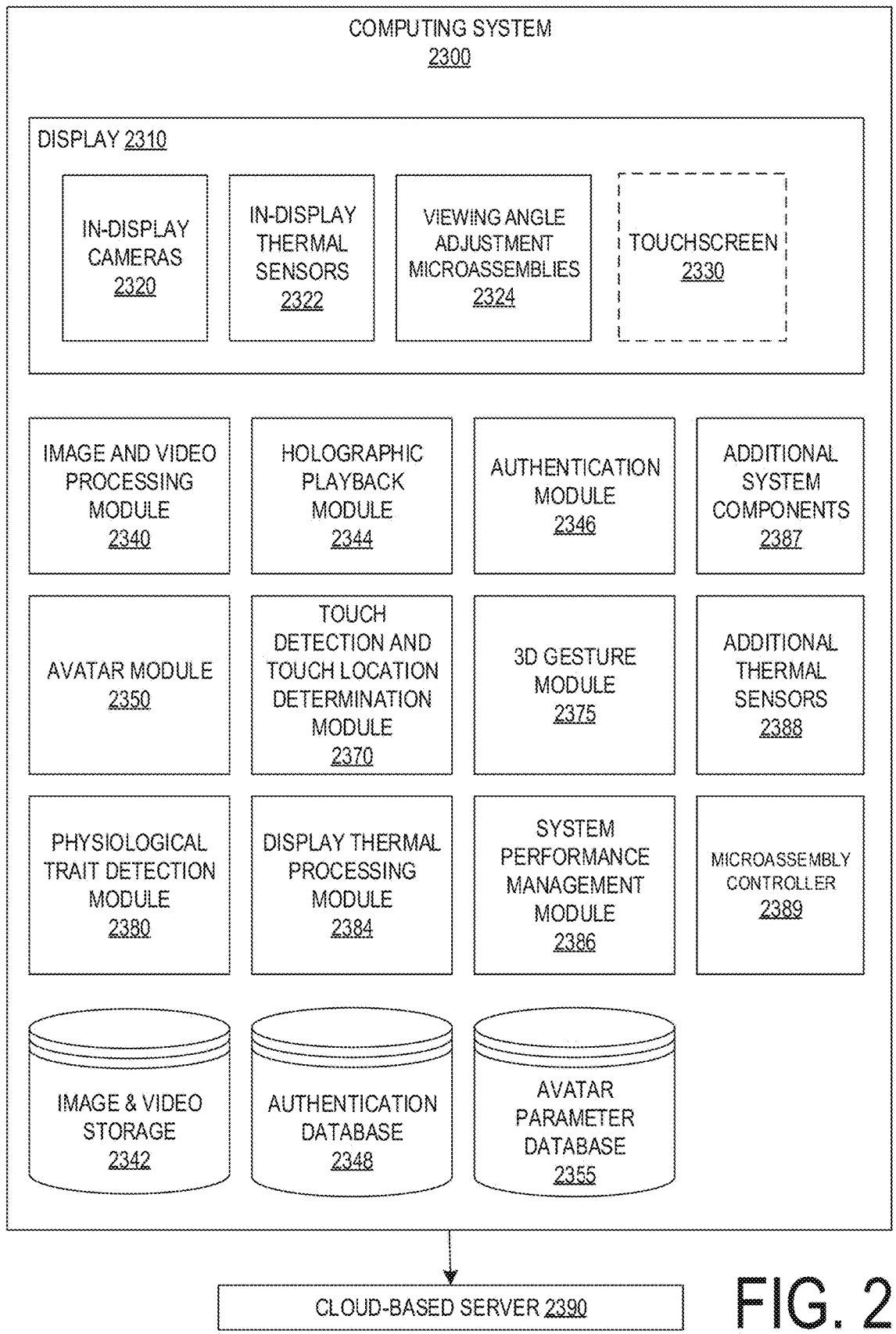
FIG. 23 illustrates an exemplary computing system.

FIG. 23 illustrates an exemplary computing system with in-display cameras. The system 2300 comprises a display 2310 comprising in-display cameras 2320, in-display thermal sensors 2322, viewing angle adjustment microassemblies 2324 or a combination thereof. The display 2320 can also include a touchscreen 2330. The cameras 2320, thermal sensors 2322, and viewing angle adjustment microassemblies 2324 are located in the display area of the display 2310 and can be any in-display cameras, in-display thermal sensor or microassemblies described or referenced herein. The touchscreen 2330 can be present in systems where touch capabilities are not provided by the in-display cameras 2320 and can be any kind of touchscreen described or referenced herein.

The system 2300 further comprises one or more modules, databases, and stores. An image and video processing module 2340 can generate images and videos from image sensor data provided by the in-display cameras 2320 or perform processing on images or videos provided to the module 2340 from any of the in-display cameras 2320. The image and video processing module 2340 can generate composite images or videos from image sensor data generated by the in-display cameras 2320, generate high-resolution images or videos based on image sensor data, create images or videos with a new depth of focus from images or videos with other depths of focus, and extract print features from captured fingerprints, thumbprints, and palmprints. The image and video storage 2342 can contain any images or videos described or referenced herein, such as composite images and videos, multiple views that comprise holographic images or videos (i.e., their constituent views), and original views of images and videos with multiple depths of fields.

A holographic playback module 2344 can track the position of a feature of a user viewing the display 2310, select a view of a holographic image or video based on the tracked position of the viewer's feature and view location information for holographic image or video views, and cause the selected holographic view to be shown on the display 2310. An authentication module 2346 can authenticate a user based on captured fingerprint, thumbprint, or palmprint or characteristics extracted from such prints by comparing the captured prints or print characteristics against an authentication database 2348. The database 2348 comprises prints or print characteristics information for users who can be granted a privilege, such as access to a system, an application, system resource, or content. An avatar module 2350 can extract facial features of a user and convert the facial features into avatar parameters that are transmitted to a remote system to animate the user's avatar on the remote system's display. The avatar module 2350 can extract facial features and convert them into avatar parameters for a holographic avatar and send avatar parameters for one or more views of the user to the remote system. The avatar module can further cause a feedback avatar to be displayed at the display 2310. Avatar parameters can be stored in an avatar parameter database 2355.

A touch detection and touch location determination module 2370 can provide for touch capabilities using the in-display cameras 2320. The module 2370 can detect a touch to the surface of the display 2310 using the in-display cameras 2320 and determine the location of the touch on the surface. A 3D gesture module 2375 can detect 3D gestures made in front of the display 2310, such as a twist gesture of a stylus or other object. The 3D gesture module 2375 can also detect 3D gestures that start or end with a touch to the display, such as pick-up-move-place and pick-up-and-drop gestures. A physiological trait detection module 2380 can determine the values of physiological traits (heart rate, heart rate variability, respiratory rate, blood pressure, etc.) of a user using one or more of the in-display cameras 2320.

A display thermal process module 2384 can process display thermal sensor data to determine a temperature at an individual thermal sensor, a temperature for a region of the display, or an overall temperature for the display. The display thermal process module 2384 can determine whether a display temperature has exceeded a threshold and adjust the performance of the display (e.g., by adjusting a refresh rate of brightness of the display) to lower the display temperature. The module 2384 can further adjust the brightness or color of a pixel or individual display elements within a pixel to account for color or brightness degradation due to aging or an increased operating temperature.

A system performance management module 2386 can adjust the performance of the display 2310 or additional system components 2387 based on display thermal sensor data provided by the in-display thermal sensors 2322 and thermal sensor data provided by one or more additional thermal sensors 2388. The module 2386 can increase the performance of the display 2310 or one of the additional system components 2387 if the module 2386 determines that such an increase will not cause the system 2300 to exceed performance thresholds. The system performance management module 2386 can also reduce the performance of the display 2310 or one of the addition system components 2388 if the module 2386 determines that a system performance threshold has been exceeded based at least in part of display thermal sensor data provided by the in-display thermal sensors 2322 and the thermal sensor data provided by the additional thermal sensors 2388. The microassembly controller 2389 can control microlens assemblies to adjust the viewing cone angle of a pixel or microassemblies located under individual pixels or pixel arrays to adjust their viewing angle.

In some embodiments, any of the modules in FIG. 23 or combinations thereof can be located in the display 2310. The computing system 2300 can further comprise one or more computer-readable media that stores instructions to cause the image and video processing module 2340, the holographic playback module 2344, the authentication module 2346, the avatar module 2350, the touch detection and location determination module 2370, the 3D gesture module 2375, and the physiological trait detection module 2380 to carry out their functionalities. These computer-readable media can be located in and/or external to the display 2310.

FIG. 23 illustrates one example of a set of modules that can be included in a computing system or device. In other embodiments, a computing system or device can have more or fewer modules than those shown in FIG. 23. Moreover, separate modules can be combined into a single module, and a single module can be split into multiple modules. Further, any of the modules shown in FIG. 23 can be part of the operating system of the computing system 2300, one or more software applications independent of the operating system, or operate at another software layer. The modules shown in FIG. 23 can be implemented in software, hardware, firmware or combinations thereof. A computer device or system referred to as being programmed to perform a method can be programmed to perform the method via software, hardware, firmware or combinations thereof.

Although the display 2310 is shown in FIG. 23 as being part of the computing system 2300, any of the displays described or referenced herein can be referred to as a system. Further, in some embodiments, any of the data, images, videos, or other information stored, generated, or access by the modules, stores, or databases illustrated in FIG. 23 as being located in the system 2300, can be located at a remote device, such as a cloud-based server 2390. The cloud-based server 2390 can be accessed by the system 2300 over any type of network or internetwork connection (or series of connections), such as the Internet.

The technologies, techniques, and embodiments described herein can be performed by any of a variety of computing devices, including mobile devices (e.g., smartphones, handheld computers, laptops, notebooks, tablets, media players, portable gaming consoles, cameras), non-mobile devices (e.g., desktop computers, servers, stationary gaming consoles, set-top boxes, televisions) and embedded devices (e.g., devices incorporated into a vehicle, home or place of business). As used herein, the term "computing devices" includes computing systems and includes devices comprising multiple discrete physical components.

Figure 24:
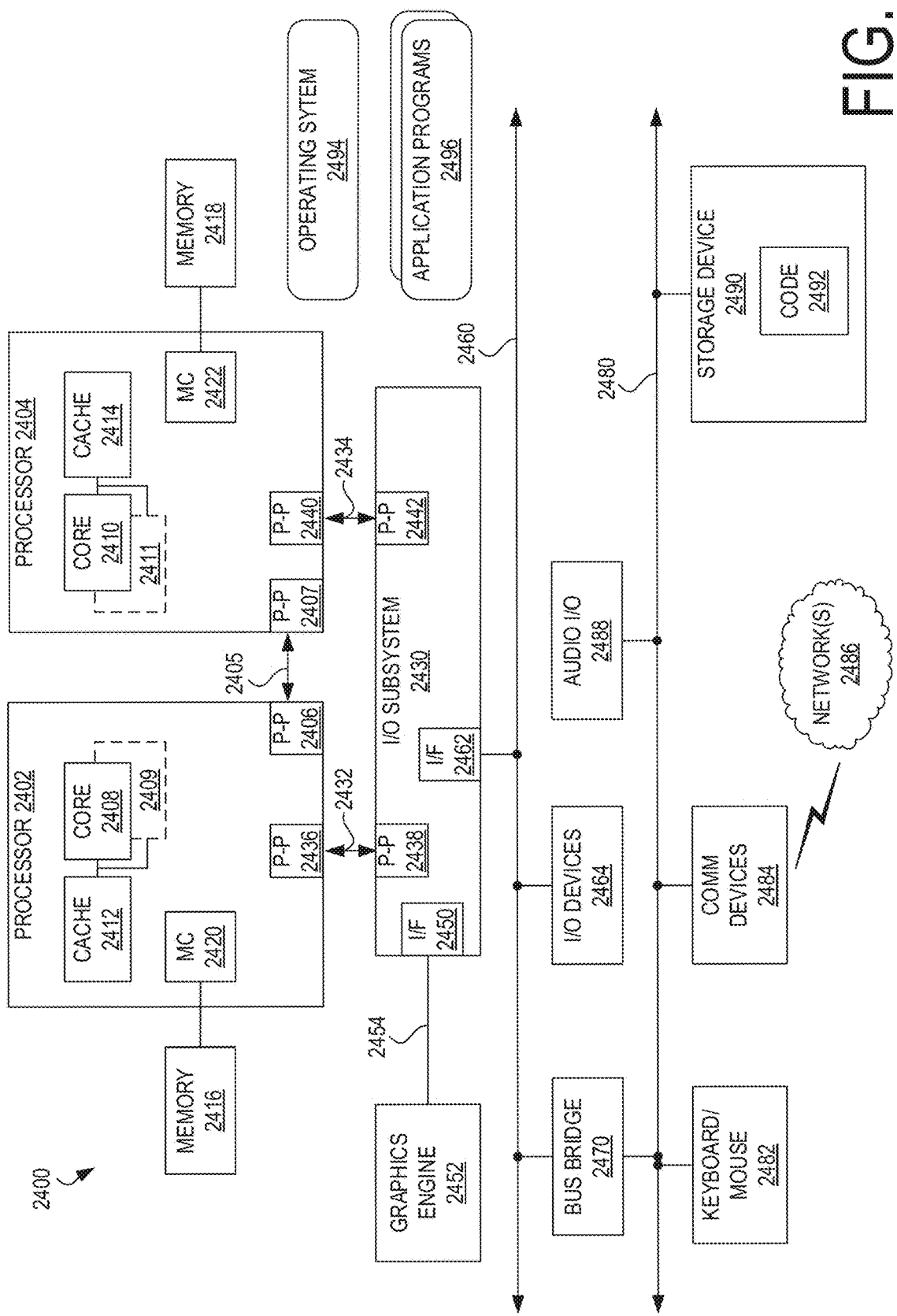
FIG. 24 is a block diagram of an exemplary computing device in which technologies described herein may be implemented.

FIG. 24 is a block diagram of an exemplary computing device in which technologies described herein may be implemented. Generally, components shown in FIG. 24 can communicate with other shown components, although not all connections are shown, for ease of illustration. The device 2400 is a multiprocessor system comprising a first processor 2402 and a second processor 2404 and is illustrated as comprising point-to-point (P-P) interconnects. For example, a point-to-point (P-P) interface 2406 of the processor 2402 is coupled to a point-to-point interface 2407 of the processor 2404 via a point-to-point interconnection 2405. It is to be understood that any or all of the point-to-point interconnects illustrated in FIG. 24 can be alternatively implemented as a multi-drop bus, and that any or all buses illustrated in FIG. 24 could be replaced by point-to-point interconnects.

As shown in FIG. 24, the processors 2402 and 2404 are multicore processors. Processor 2402 comprises processor cores 2408 and 2409, and processor 2404 comprises processor cores 2410 and 2411. Processor cores 2408-2411 can execute computer-executable instructions in a manner similar to that discussed below in connection with FIG. 12, or in other manners.

Processors 2402 and 2404 further comprise at least one shared cache memory 2412 and 2414, respectively. The shared caches 2412 and 2414 can store data (e.g., instructions) utilized by one or more components of the processor, such as the processor cores 2408-2409 and 2410-2411. The shared caches 2412 and 2414 can be part of a memory hierarchy for the device 2400. For example, the shared cache 2412 can locally store data that is also stored in a memory 2416 to allow for faster access to the data by components of the processor 2402. In some embodiments, the shared caches 2412 and 2414 can comprise multiple cache layers, such as level 1 (L1), level 2 (L2), level 3 (L3), level 4 (L4), and/or other caches or cache layers, such as a last level cache (LLC).

Although the device 2400 is shown with two processors, the device 2400 can comprise any number of processors. Further, a processor can comprise any number of processor cores. A processor can take various forms such as a central processing unit, a controller, a graphics processor, an accelerator (such as a graphics accelerator or digital signal processor (DSP)) or a field programmable gate array (FPGA). A processor in a device can be the same as or different from other processors in the device. In some embodiments, the device 2400 can comprise one or more processors that are heterogeneous or asymmetric to a first processor, accelerator, FPGA, or any other processor. There can be a variety of differences between the processing elements in a system in terms of a spectrum of metrics of merit including architectural, microarchitectural, thermal, power consumption characteristics and the like. These differences can effectively manifest themselves as asymmetry and heterogeneity amongst the processors in a system. In some embodiments, the processors 2402 and 2404 reside in the same die package.

Processors 2402 and 2404 further comprise memory controller logic (MC) 2420 and 2422. As shown in FIG. 24, MCs 2420 and 2422 control memories 2416 and 2418 coupled to the processors 2402 and 2404, respectively. The memories 2416 and 2418 can comprise various types of memories, such as volatile memory (e.g., dynamic random access memories (DRAM), static random access memory (SRAM)) or non-volatile memory (e.g., flash memory). While MCs 2420 and 2422 are illustrated as being integrated into the processors 2402 and 2404, in alternative embodiments, the MCs can be logic external to a processor and can comprise one or more layers of a memory hierarchy.

Processors 2402 and 2404 are coupled to an Input/Output (I/O) subsystem 2430 via P-P interconnections 2432 and 2434. The point-to-point interconnection 2432 connects a point-to-point interface 2436 of the processor 2402 with a point-to-point interface 2438 of the I/O subsystem 2430, and the point-to-point interconnection 2434 connects a point-to-point interface 2440 of the processor 2404 with a point-to-point interface 2442 of the I/O subsystem 2430. Input/Output subsystem 2430 further includes an interface 2450 to couple I/O subsystem 2430 to a graphics engine 2452, which can be a high-performance graphics engine. The I/O subsystem 2430 and the graphics engine 2452 are coupled via a bus 2454. Alternately, the bus 2454 could be a point-to-point interconnection.

Input/Output subsystem 2430 is further coupled to a first bus 2460 via an interface 2462. The first bus 2460 can be a Peripheral Component Interconnect (PCI) bus, a PCI Express bus, another third generation I/O interconnection bus or any other type of bus.

Various I/O devices 2464 can be coupled to the first bus 2460. A bus bridge 2470 can couple the first bus 2460 to a second bus 2480. In some embodiments, the second bus 2480 can be a low pin count (LPC) bus. Various devices can be coupled to the second bus 2480 including, for example, a keyboard/mouse 2482, audio I/O devices 2488 and a storage device 2490, such as a hard disk drive, solid-state drive or other storage devices for storing computer-executable instructions (code) 2492. The code 2492 can comprise computer-executable instructions for performing technologies described herein. Additional components that can be coupled to the second bus 2480 include communication device(s) 2484, which can provide for communication between the device 2400 and one or more wired or wireless networks 2486 (e.g. Wi-Fi, cellular or satellite networks) via one or more wired or wireless communication links (e.g., wire, cable, Ethernet connection, radio-frequency (RF) channel, infrared channel, Wi-Fi channel) using one or more communication standards (e.g., IEEE 802.11 standard and its supplements).

The device 2400 can comprise removable memory such as flash memory cards (e.g., SD (Secure Digital) cards), memory sticks, Subscriber Identity Module (SIM) cards). The memory in device 2400 (including caches 2412 and 2414, memories 2416 and 2418 and storage device 2490) can store data and/or computer-executable instructions for executing an operating system 2494 and application programs 2496. Example data includes web pages, text messages, images, sound files, video data, biometric thresholds for particular users or other data sets to be sent to and/or received from one or more network servers or other devices by the device 2400 via one or more wired or wireless networks, or for use by the device 2400. The device 2400 can also have access to external memory (not shown) such as external hard drives or cloud-based storage.

The operating system 2494 can control the allocation and usage of the components illustrated in FIG. 24 and support one or more application programs 2496. The application programs 2496 can include common mobile computing device applications (e.g., email applications, calendars, contact managers, web browsers, messaging applications) as well as other computing applications and utilities, such as a virtual keyboard.

The device 2400 can support various input devices, such as a touchscreen, microphones, camera, physical keyboard, virtual keyboard, proximity sensor and trackball, and one or more output devices, such as a speaker and a display. Other possible input and output devices include piezoelectric and other haptic I/O devices. Any of the input or output devices can be internal to, external to or removably attachable with the device 2400. External input and output devices can communicate with the device 2400 via wired or wireless connections.

In addition, the computing device 2400 can provide one or more natural user interfaces (NUIs). For example, the operating system 2494 or applications 2496 can comprise speech recognition logic as part of a voice user interface that allows a user to operate the device 2400 via voice commands. Further, the device 2400 can comprise input devices and logic that allows a user to interact with the device 2400 via a body, hand or face gestures. For example, a user's hand gestures can be detected and interpreted to provide input to a gaming application.

The device 2400 can further comprise one or more communication components 2484. The components 2484 can comprise wireless communication components coupled to one or more antennas to support communication between the device 2400 and external devices. The wireless communication components can support various wireless communication protocols and technologies such as Near Field Communication (NFC), Wi-Fi, Bluetooth, 4G Long Term Evolution (LTE), Code Division Multiplexing Access (CDMA), Universal Mobile Telecommunication System (UMTS) and Global System for Mobile Telecommunication (GSM). In addition, the wireless modems can support communication with one or more cellular networks for data and voice communications within a single cellular network, between cellular networks, or between the mobile computing device and a public switched telephone network (PSTN).

The device 2400 can further include at least one input/output port (which can be, for example, a USB, IEEE 1394 (FireWire), Ethernet and/or RS-232 port) comprising physical connectors; a power supply; a satellite navigation system receiver, such as a GPS receiver; a gyroscope; an accelerometer; a proximity sensor; and a compass. A GPS receiver can be coupled to a GPS antenna. The device 2400 can further include one or more additional antennas coupled to one or more additional receivers, transmitters and/or transceivers to enable additional functions.

It is to be understood that FIG. 24 illustrates only one exemplary computing device architecture. Computing devices based on alternative architectures can be used to implement technologies described herein. For example, instead of the processors 2402 and 2404, and the graphics engine 2452 being located on discrete integrated circuits, a computing device can comprise an SoC (system-on-a-chip) integrated circuit incorporating multiple processors, a graphics engine and additional components. Further, a computing device can connect elements via bus or point-to-point configurations different from that shown in FIG. 24. Moreover, the illustrated components in FIG. 24 are not required or all-inclusive, as shown components can be removed and other components added in alternative embodiments.

Figure 25:
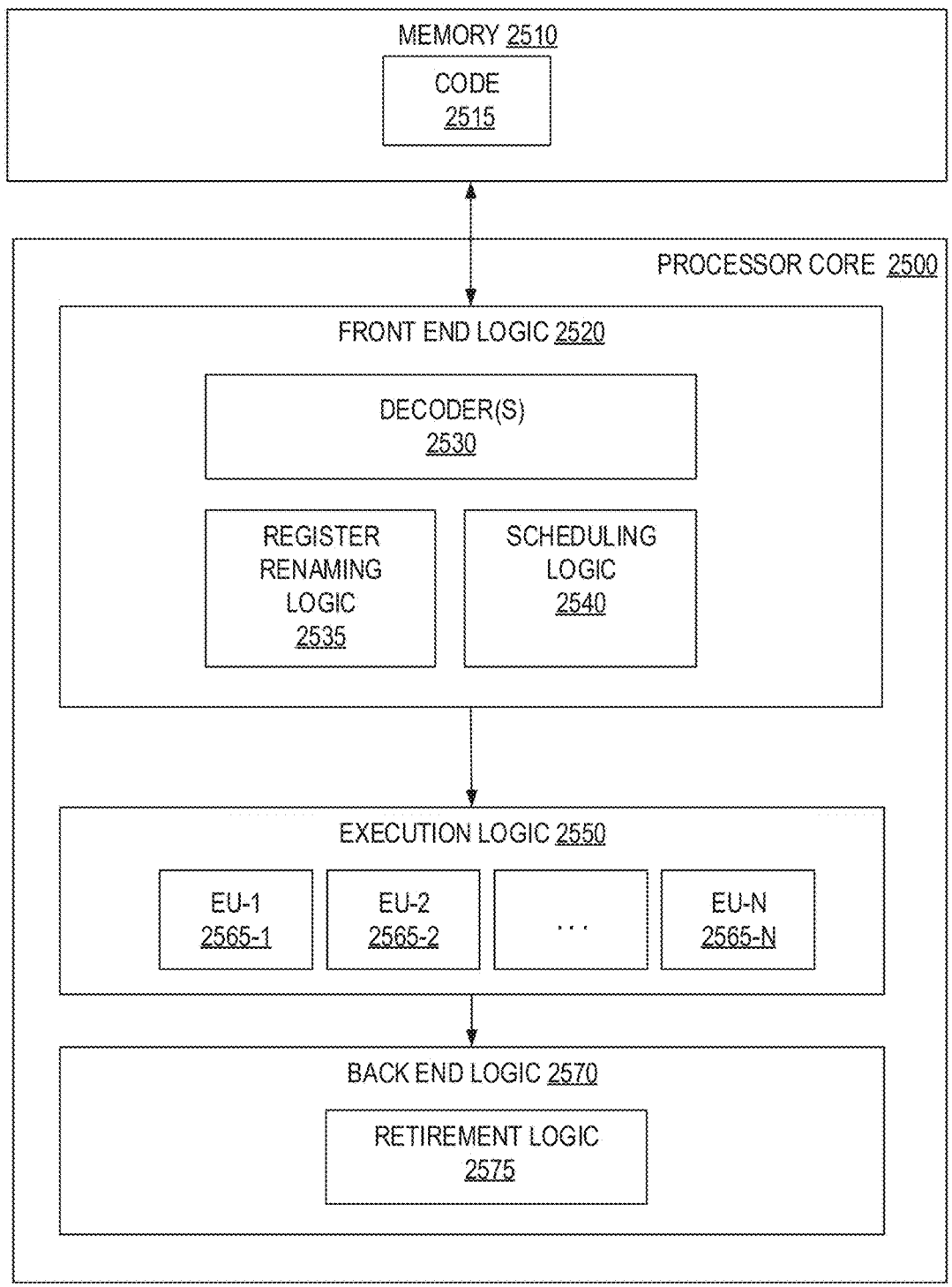
FIG. 25 is a block diagram of an exemplary processor core that can execute instructions as part of implementing technologies described herein.

FIG. 25 is a block diagram of an exemplary processor core 2500 to execute computer-executable instructions as part of implementing technologies described herein. The processor core 2500 can be a core for any type of processor, such as a microprocessor, an embedded processor, a digital signal processor (DSP) or a network processor. The processor core 2500 can be a single-threaded core or a multi-threaded core in that it may include more than one hardware thread context (or "logical processor") per core.

FIG. 25 also illustrates a memory 2510 coupled to the processor 2500. The memory 2510 can be any memory described herein or any other memory known to those of skill in the art. The memory 2510 can store computer-executable instruction 2515 (code) executable by the processor core 2500.

The processor core comprises front-end logic 2520 that receives instructions from the memory 2510. An instruction can be processed by one or more decoders 2530. The decoder 2530 can generate as its output a micro operation such as a fixed width micro operation in a predefined format, or generate other instructions, microinstructions, or control signals, which reflect the original code instruction. The front-end logic 2520 further comprises register renaming logic 2535 and scheduling logic 2540, which generally allocate resources and queues operations corresponding to converting an instruction for execution.

The processor core 2500 further comprises execution logic 2550, which comprises one or more execution units (EUs) 2565-1 through 2565-N. Some processor core embodiments can include a number of execution units dedicated to specific functions or sets of functions. Other embodiments can include only one execution unit or one execution unit that can perform a particular function. The execution logic 2550 performs the operations specified by code instructions. After completion of execution of the operations specified by the code instructions, back-end logic 2570 retires instructions using retirement logic 2575. In some embodiments, the processor core 2500 allows out of order execution but requires in-order retirement of instructions. Retirement logic 2570 can take a variety of forms as known to those of skill in the art (e.g., re-order buffers or the like).

The processor core 2500 is transformed during execution of instructions, at least in terms of the output generated by the decoder 2530, hardware registers and tables utilized by the register renaming logic 2535, and any registers (not shown) modified by the execution logic 2550. Although not illustrated in FIG. 25, a processor can include other elements on an integrated chip with the processor core 2500. For example, a processor may include additional elements such as memory control logic, one or more graphics engines, I/O control logic and/or one or more caches.

As used in any embodiment herein, the term "module" refers to logic that may be implemented in a hardware component or device, software or firmware running on a processor, or a combination thereof, to perform one or more operations consistent with the present disclosure. Software may be embodied as a software package, code, instructions, instruction sets and/or data recorded on non-transitory computer-readable storage mediums. Firmware may be embodied as code, instructions or instruction sets and/or data that are hard-coded (e.g., nonvolatile) in memory devices. As used in any embodiment herein, the term "circuitry" can comprise, for example, singly or in any combination, hard-wired circuitry, programmable circuitry such as computer processors comprising one or more individual instruction processing cores, state machine circuitry, and/or firmware that stores instructions executed by programmable circuitry. Modules described herein may, collectively or individually, be embodied as circuitry that forms a part of one or more devices. Thus, any of the modules can be implemented as circuitry, such as continuous itemset generation circuitry, entropy-based discretization circuitry, etc. A computer device referred to as being programmed to perform a method can be programmed to perform the method via software, hardware, firmware or combinations thereof.

Any of the disclosed methods can be implemented as computer-executable instructions or a computer program product. Such instructions can cause a computer or one or more processors capable of executing computer-executable instructions to perform any of the disclosed methods. Generally, as used herein, the term "computer" refers to any computing device or system described or mentioned herein, or any other computing device. Thus, the term "computer-executable instruction" refers to instructions that can be executed by any computing device described or mentioned herein, or any other computing device.

The computer-executable instructions or computer program products, as well as any data created and used during implementation of the disclosed technologies, can be stored on one or more tangible or non-transitory computer-readable storage media, such as optical media discs (e.g., DVDs, CDs), volatile memory components (e.g., DRAM, SRAM), or non-volatile memory components (e.g., flash memory, solid state drives, chalcogenide-based phase-change non-volatile memories). Computer-readable storage media can be contained in computer-readable storage devices such as solid-state drives, USB flash drives, and memory modules. Alternatively, the computer-executable instructions may be performed by specific hardware components that contain hardwired logic for performing all or a portion of disclosed methods, or by any combination of computer-readable storage media and hardware components.

The computer-executable instructions can be part of, for example, a dedicated software application or a software application that is accessed via a web browser or other software application (such as a remote computing application). Such software can be read and executed by, for example, a single computing device or in a network environment using one or more networked computers. Further, it is to be understood that the disclosed technology is not limited to any specific computer language or program. For instance, the disclosed technologies can be implemented by software written in C++, Java, Perl, JavaScript, Adobe Flash, or any other suitable programming language. Likewise, the disclosed technologies are not limited to any particular computer or type of hardware.

Furthermore, any of the software-based embodiments (comprising, for example, computer-executable instructions for causing a computer to perform any of the disclosed methods) can be uploaded, downloaded or remotely accessed in a variety of manners. For example, such instructions can be uploaded, downloaded or remotely accessed using the Internet, the World Wide Web, an intranet, cable (including fiber optic cable), magnetic communications, electromagnetic communications (including RF, microwave, and infrared communications), and electronic communications.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrase "at least one of A, B or C" can mean A; B; C; A and B; A and C; B and C; or A, B, and C.

The disclosed methods, apparatuses and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Theories of operation, scientific principles or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

The following examples pertain to additional embodiments of technologies disclosed herein.

Example 1 is a computing system comprising: a display comprising a display substrate, the display substrate comprising a front side; a plurality of pixels located on the front side of the display substrate, the plurality of pixels defining a display area; and a plurality of cameras located on the front side of the display substrate and within the display area.

Example 2 is the computing system of Example 1, wherein at least one of the cameras comprises an image sensor, one or more microlenses, and an aperture.

Example 3 is the computing system of Example 1, wherein at least one of the plurality of cameras comprises a metalens.

Example 4 is the computing system of Example 1, further comprising: at least one processor; and one or more computer-readable media comprising instructions stored thereon that when executed causes the at least one processor to generate a composite image from image sensor data generated by two or more of the cameras.

Example 5 is the computing system of Example 4, wherein the instructions stored on the one or more computer-readable media further cause the at least one processor to: store the composite image; and display the composite image on the display.

Example 6 is the computing system of Example 4, wherein the composite image has a resolution greater than the highest resolution of an image capable of being generated by any of the individual cameras within the two or more cameras.

Example 7 is the computing system of Example 1, further comprising: at least one processor; and one or more computer-readable media comprising instructions stored thereon that when executed causes the at least one processor to generate a composite video from the image sensor data generated by two or more of the cameras.

Example 8 is the computing system of Example 7, wherein the composite video has a resolution greater than the highest resolution video capable being generated by any of the individual cameras within the one or more cameras.

Example 9 is the computing system of Example 1, further comprising: a housing; at least one processor; and one or more computer-readable media, wherein the at least one processor, the display, and the one or more computer-readable media are located within the housing.

Example 10 is the computing system of Example 1, further comprising: a first housing that contains the display; and a second housing that contains at least one processor and one or more computer-readable media, wherein the first housing is communicatively coupled to the second housing.

Example 11 is the computing system of Example 1, wherein individual of the pixels occupy a pixel area and at least one of the cameras is located within the pixel area occupied by one of the pixels.

Example 12 is the computing system of Example 1, wherein at least one of the cameras spans multiple pixels.

Example 13 is the computing system of Example 1, wherein the plurality of pixels comprise micro-LEDs.

Example 14 is the computing system of Example 1, wherein the plurality of pixels comprise organic LEDs.

Example 15 is the computing system of Example 1, wherein the plurality of cameras comprises two of more groups of cameras, wherein cameras in individual groups have the same depth of field and cameras in different groups have different depths of field.

Example 16 is the computing system of Example 15, further comprising: at least one processor; and one or more computer-readable media comprising instructions stored thereon that when executed causes the at least one processor to: capture a plurality of original versions of an image, the individual original versions of the image based on image sensor data generated by one or more cameras in one of the camera groups, the individual original versions of the image having a depth of field different from the depths of field of the other original versions of the image; and store the original versions of the image.

Example 17 is the computing system of Example 16, wherein the instructions stored on the one or more computer-readable media further cause the at least one processor to: generate a new version of the image based on one or more of the original versions of the image, the new version having a new depth of field that is different from the depths of field of the original versions of the image; and store the new version of the image.

Example 18 is the computing system of Example 17, wherein the instructions stored on the one or more computer-readable media further cause the at least one processor to: receive a user selection of an object in one of the original versions of the image; and determine the new depth of field based at least in part on the selected object.

Example 19 is the computing system of Example 15, further comprising: at least one processor; and one or more computer-readable media comprising instructions stored thereon that when executed causes the at least one processor to: capture a plurality of original versions of a video, the individual original versions of the video based on image sensor data generated by one or more cameras in one of the camera groups, the individual original versions of the video having a depth of field different from the depths of field of the other original versions of the video; and store the original versions of the video.

Example 20 is the computing system of Example 19, wherein the instructions stored on the one or more computer-readable media further cause the at least one processor to: generate a new version of the video based on one or more original versions of the video, the new version having a new depth of field that is different from the depths of field of the original versions of the video; and store the new version of the video.

Example 21 is the computing system of Example 20, wherein the instructions stored on the one or more computer-readable media further cause the at least one processor to: receive a user selection of an object in one of the original versions of the video; and determine the new depth of field based at least in part on the selected object.

Example 22 is the computing system of Example 1, further comprising: at least one processor; and one or more computer-readable media comprising instructions stored thereon that when executed causes the at least one processor to: capture a plurality of views, the plurality of views defining a holographic image or video, individual of the views captured by one or more different cameras from the plurality of cameras, the individual views having associated view location information indicating the location of the one or more cameras that captured the individual view; and store the plurality of views of the holographic image or video and the view location information associated with the views of the holographic image or video.

Example 23 is the computing system of Example 22, wherein the instructions stored on the one or more computer-readable media further cause the at least one processor to: track a user feature based on image sensor data generated by at least one of the plurality of the cameras; determine a position of the user feature; select a view of the plurality of views of the holographic image or video based at least on the determined position of the tracked user feature and the view location information associated with the plurality of views of the image of video; and cause the selected view of the holographic image or video to be shown on the display.

Example 24 is the computing system of Example 23, wherein the plurality of view of a holographic image or video is a plurality of views of a holographic video, the instructions stored on the one or more computer-readable media to further cause the at least one processor to transmit the plurality of views of the holographic video to a second system.

Example 25 is the computing system of Example 23, wherein the plurality of view of a holographic image or video is a plurality of views of a holographic video, the instructions stored on the one or more computer-readable media further cause the at least one processor to: receive information from a second system indicating a tracked position of a feature of a user of the second system; select one of the views of the plurality of views of the holographic video based at least on the information indicating the tracked position of the feature of the user of second system and the view location information associated with at least one of the plurality of views of the holographic video; and transmit the selected view of the holographic video to the second system.

Example 26 is the computing system of Example 25, wherein the instructions stored on the one or more computer-readable media further cause the at least one processor to cause the selected view of the holographic video to be shown on the display as a feedback view.

Example 27 is a computing system comprising: a display; one or more sensors; at least one processor; and one or more computer-readable media comprising instructions stored thereon that when executed causes the at least one processor to: track a user feature based on sensor data generated by the one or more sensors; determine a position of the user feature; select a view of a holographic image or video, the holographic image or video comprising a plurality of views and associated with view location information for the individual views, the selecting the view of the holographic image or video based at least in part on the position of the user feature and the view location information associated with one or more of the views of the holographic image or video; and cause the selected view of the holographic image or video to be shown on the display.

Example 28 is the computing system of Example 27 wherein the one or more sensors are in-display cameras.

Example 29 is the computing system of Example 28 wherein the system is a head-mounted display.

Example 30 is the computing system of Example 1, further comprising: at least one processor; and one or more computer-readable media comprising instructions stored thereon that when executed causes the at least one processor to: capture a plurality of views of a video, individual of the views comprising image sensor data generated by one of the cameras of the plurality of cameras, the individual views captured by different cameras of the plurality of cameras, the individual views associated with view location information indicating the location of the camera used to capture the individual view; determine one or more avatar parameters for an avatar from the individual views of the video; and transmit the avatar parameters for the one or more of the views to a second system.

Example 31 is the computing system of Example 30, wherein the instructions stored on the one or more computer-readable media further cause the at least one processor to transmit the view location information associated with the one or more views transmitted to the second system.

Example 32 is the computing system of Example 30, wherein to determine one or more avatar parameters for the avatar from the individual views of the video comprises, for individual of the views, extracting one or more facial features from the individual view and converting the one or more facial features to the avatar parameters for the individual view.

Example 33 is the computing system of Example 30, wherein the instructions stored on the one or more computer-readable media further cause the at least one processor to: receive information indicating a tracked position of a feature of a user of the second system; and select a view of the plurality of views of the video based at least on the information indicating the tracked position of the feature of the user and the view location information associated with the plurality of views of the video; and wherein to transmit the avatar parameters for the one or more views to the second system comprises transmitting the avatar parameters for the selected view.

Example 34 is the computing system of Example 30, wherein the instructions stored on the one or more computer-readable media further cause the at least one processor to cause the avatar to be shown on the display as a feedback avatar.

Example 35 is a computing system comprising: a display; one or more sensors; at least one processor; and one or more computer-readable media comprising instructions stored thereon that when executed causes the at least one processor to: track a user feature based on sensor data generated by the one or more sensors; determine a position of the user feature; select a view of a holographic avatar, the holographic avatar comprising avatar parameters for one or more holographic avatar views and associated with view location information indicating a location within a capturing display the individual views of the holographical avatar were captured, the selecting the view of the holographic avatar based at least in part on the position of the user feature and the view location information associated with one or more views of the holographic avatar; and cause the selected view of the holographic avatar to be shown on the display.

Example 36 is the computing system of Example 35 wherein the one or more sensors are in-display cameras.

Example 37 is the computing system of Example 1, further comprising: at least one processor; and one or more computer-readable media comprising instructions stored thereon that when executed causes the at least one processor to: prompt a user to touch one or more fingers, one or more thumbs, or a palm against the display; capture one or more fingerprints, one or more thumbprints or a palmprint based at least in part on image sensor data generated by one or more of the cameras; authenticate the user based at least in part on the one or more fingerprints, the one or more thumbprints or the palmprint; and grant a privilege to the user.

Example 38 is the computing system of Example 37, wherein the prompt does not include an instruction for the user to touch a specific part of the display.

Example 39 is the computing system of Example 37, wherein the instructions stored on the one or more computer-readable media further cause the at least one processor to: determine a touch to the surface of the display based at least in part on second image sensor data generated by the one or more of the cameras; determine a touch location based at least in part on the second image sensor data; and cause one or more pixels located at or in the vicinity of the touch location to emit light; wherein to capture the one or more fingerprints, the one or more thumbprints or the palmprint based on the image sensor data comprises capturing the one or more fingerprints, the one or more thumbprints, or the palmprint at the touch location.

Example 40 is the computing system of Example 39, wherein the one or more fingerprints, one or more thumbprints, and/or a palmprint is a palmprint.

Example 41 is the computing system of Example 39, wherein the privilege is access to the system.

Example 42 is the computing system of Example 39, wherein the privilege is access to content.

Example 43 is the computing system of Example 1, wherein the display further comprises a surface, the system further comprising: at least one processor; and one or more computer-readable media comprising instructions stored thereon that when executed causes the at least one processor to: determine a touch to the surface of the display based at least in part on image sensor data generated by one or more of the cameras; determine a touch location based at least in part on the image sensor data; and provide information indicating the presence of the touch and the touch location information to an operating system or an application.

Example 44 is the computing system of Example 43, wherein the image sensor data indicates an amount of infrared light received at the one or more cameras.

Example 45 is the computing system of Example 43, wherein to determine the touch to the surface of the display comprises determining that an amount of light received at the one or more cameras has dropped below a threshold.

Example 46 is the computing system of Example 44, wherein to determine the touch to the surface of the display comprises determining that an amount of light received at the one or more cameras has dropped by a predetermined percentage or a predetermined amount.

Example 47 is the computing system of Example 43, wherein to determine the touch to the surface of the display comprises determining that an amount of light received at the one or more cameras has dropped by a predetermined percentage or a predetermined amount within a predetermined amount of time.

Example 48 is the computing system of Example 43, wherein to determine the touch location comprises determining the touch location based at least in part on the location of one of the one or more cameras within the display.

Example 49 is the computing system of Example 43, wherein to determine the location of the touch based at least in part on the location within the display of the one or more cameras comprising determining a centroid of the locations of the one or more cameras within the display as the touch location.

Example 50 is the computing system of Example 1, further comprising: at least one processor; and one or more computer-readable media comprising instructions stored thereon that when executed causes the at least one processor to: detect selection of an object in an application operating on the system; detect an amount of rotation of a physical object located in front of the display based at least on image sensor data generated by one or more of the cameras; and rotate the object in the application by an amount corresponding to the detected amount of rotation of the physical object.

Example 51 is the computing system of Example 1, further comprising: at least one processor; and one or more computer-readable media comprising instructions stored thereon that when executed causes the at least one processor to: detect selection of an object in an application operating on the system; detect an amount of rotation of a physical object located in front of the display based at least on image sensor data generated by one or more of the cameras; and deform the object in the application by keeping an end of the object in the application stationary and rotating an opposite end of the object in the application by an amount corresponding to the detected amount of rotation of the physical object.

Example 52 is the computing system of Example 1, further comprising: at least one processor; and one or more computer-readable media comprising instructions stored thereon that when executed causes the at least one processor to: detect the selection of an object shown on the display by detecting a pinch gesture on the display based at least in part on image sensor data generated by the cameras, the selected object located at or in the vicinity of a pinch location of the pinch gesture; cause the appearance of the selected object to change from an unselected appearance to a selected appearance in response to the selection of the object; detect the pinched fingers moving along a path from the pinch location to a destination location based at least in part on the image sensor data; detect a portion of the path along which the pinched fingers are not in contact with the display; cause the object to move on the display from the pinch location to the destination location; detect an unpinching gesture on the display at the destination location; and cause the appearance of the object to change from the selected appearance to the unselected appearance.

Example 53 is the computing system of Example 52, wherein to cause the object to move on the display from the pinch location to the destination location comprises moving the object along the portion of the path without the object interacting with other objects in the application that are also located along the portion of the path.

Example 54 is the computing system of Example 1, wherein the display further comprises a surface, the system further comprising: at least one processor; and one or more computer-readable media comprising instructions stored thereon that when executed causes the at least one processor to: detect the selection of an object in an application shown on the display by detecting a pinch gesture on the display based at least in part on image sensor data from one or more of the cameras, wherein the pinch gesture has a pinch location, the selected object located at or in the vicinity of the pinch location; detect the pinched fingers moving away from the display surface; detect the unpinching of the pinched fingers; determine a distance from the display surface at which the pinched fingers were unpinched; and generate a response in the application in response to detecting the unpinching of the pinched fingers, a magnitude of the response corresponding to the distance from the surface of the display at which the pinched fingers were unpinched.

Example 55 is the computing system of Example 1, further comprising: at least one processor; and one or more computer-readable media comprising instructions stored thereon that when executed causes the at least one processor to: determine a value of a physiological trait based at least in part on image sensor data generated by one or more of the cameras; and providing information to a user based on the physiological traits.

Example 56 is the computing system of Example 55, wherein the one or more physiological traits comprise at least one of a heart rate, a heart rate variability, and a respiratory rate.

Example 57 is an image or video generation method comprising: generating a composite image or video from image sensor data generated by two or more cameras of a plurality of cameras located on the front side of a display substrate of a display of a computing system, the display comprising a plurality of pixels located on the front side of the display substrate, the plurality of pixels defining a display area, the one or more cameras located within the display area; and storing the composite image or video.

Example 58 is the image or video generation method of example 57, wherein at least one of the cameras comprises an image sensor, one or more microlenses, and an aperture.

Example 59 is the image or video generation method of example 57, wherein at least one of the plurality of cameras comprises a metalens.

Example 60 is the image or video generation method of example 57, wherein the composite image or video is a composite image and the composite image has a resolution greater than the highest resolution image capable of being generated by any of the individual cameras within the one or more cameras.

Example 61 is the image or video generation method of example 57, wherein the composite image or video is a composite video and the composite video has a resolution greater than the highest resolution video capable of being generated by any of the individual cameras within the one or more cameras.

Example 62 is a method comprising: capturing a plurality of original versions of an image or video, the individual original versions of the image or video based on image sensor data generated by one or more cameras in one of a group of cameras in a plurality of cameras, the plurality of cameras located on the front side of a display substrate of a display of a computing system, the display comprising a plurality of pixels located on the front side of the display substrate, the plurality of pixels defining a display area, the one or more cameras located within the display area in one of the camera groups, the individual original versions of the image or video having a depth of field different from the depths of field of the other original versions of the image; and storing the original versions of the image or video.

Example 63 is the method of claim 62, further comprising: generating a new version of the image or video based on one or more of the original versions of the image or video, the new version having a new depth of field that is different from the depths of field of the original versions of the image or video; and storing the new version of the image or video.

Example 64 is the method of example 63, further comprising: receiving a user selection of an object in one of the original versions of the image or video; and determining the new depth of field based at least in part on the selected object.

Example 65 is a holographic recording method comprising: capturing a plurality of views, the plurality of views defining a holographic image or video, individual of the views captured by one or more different cameras of a plurality of cameras located on the front side of a display substrate of a display, the display comprising a plurality of pixels located on the front side of the display substrate, the plurality of pixels defining a display area, the one or more cameras located within the display area, individual of the views having associated view location information indicating the location of the one or more cameras that captured the individual view; and storing the plurality of views of the holographic image or video and the view location information associated with the views of the holographic image or video.

Example 66 is the holographic recording method of example 65, further comprising: tracking a user feature based on image sensor data generated by at least one of the plurality of the cameras; determining a position of the user feature; selecting a view of the plurality of views of the holographic image or video based at least on the determined position of the tracked user feature and the view location information associated with the plurality of views of the image of video; and causing the selected view of the holographic image or video to be shown on the display.

Example 67 is the holographic recording method of example 66, wherein the plurality of views of a holographic image or video is a plurality of views of a holographic video, the method further comprising transmitting the plurality of views of the holographic video to a second system.

Example 68 is the holographic recording method of example 66, wherein the plurality of view of a holographic image or video is a plurality of views of a holographic video, the method further comprising: receiving information from a second system indicating a tracked position of a feature of a user of the second system; selecting one of the views of the plurality of views of the holographic video based at least on the information indicating a tracked position of the feature of the user of second system and the view location information associated with at least one of the plurality of views of the holographic video; and transmitting the selected view of the holographic video to the second system.

Example 69 is the holographic recording method of example 68, further comprising causing the selected view of the holographic video to be shown on the display as a feedback view.

Example 70 is a holographic playback method comprising: tracking a user feature based on sensor data generated by one or more sensors; determining a position of the user feature; selecting a view of a holographic image or video, the holographic image or video comprising a plurality of views, individual of the views having associated view location information indicating the location of the one or more cameras that captured the individual view, the selecting the view of the holographic image or video based at least in part on the position of the user feature and the view location information associated with one or more of the views of the holographic image or video; and causing the selected view of the holographic image or video to be shown on a display.

Example 71 is the holographic playback method of example 70 wherein the one or more sensors are in-display cameras.

Example 72 is a holographic avatar method, comprising: capturing a plurality of views of a video, individual of the views comprising image sensor data generated by one of the cameras of a plurality of cameras located on the front side of a display substrate of a display of a computing system, the display comprising a plurality of pixels located on the front side of the display substrate, the plurality of pixels defining a display area, the one or more cameras located within the display area, the individual views captured by different cameras of the plurality of cameras, the individual views associated with view location information indicating the location of the camera used to capture the individual view; determining one or more avatar parameters from the individual views of the video; and transmitting the avatar parameters for the one or more of the views and the view location information associated with the one or more views to a second system.

Example 73 is the holographic avatar method of example 72, wherein to determine one or more avatar parameters for the avatar from the individual views of the video comprises, for individual of the views, extracting one or more facial features from the individual view and converting the one or more facial features to the avatar parameters for the individual view.

Example 74 is the holographic avatar method of claim 73, further comprising: receiving information indicating a position of a feature of a user of the second system; and selecting a view of the plurality of views of the video based at least on the information indicating the tracked position of the feature of the user and the view location information associated with the plurality of views of the video; and wherein to transmit the avatar parameters for the one or more views to the second system comprises transmitting the avatar parameters for the selected view.

Example 75 is the holographic avatar method of example 72, wherein the instructions stored on the one or more computer-readable media further cause the at least one processor to cause the avatar to be shown on the display as a feedback avatar.

Example 76 is a holographic playback method comprising: tracking a user feature based on sensor data generated by one or more sensors; determining a position of the user feature; selecting a view of a holographic avatar, the holographic avatar comprising avatar parameters for one or more holographic avatar views, the individual views of the holographic avatar associated with view location information indicating a location within a capturing display the individual views of the holographical avatar were captured, the selecting the view of the holographic avatar based at least in part on the position of the user feature and view location information associated with one or more views of the holographic avatar; and causing the selected view of the holographic avatar to be shown on a display.

Example 77 is the holographic playback method of example 76 wherein the one or more sensors are in-display cameras.

Example 78 is an authentication method comprising: prompting a user to touch one or more fingers, one or more thumbs, or a palm against the display; capturing one or more fingerprints, one or more thumbprints or a palmprint based at least in part on image sensor data generated by one or more cameras of a plurality of cameras located on the front side of a display substrate of a display of a computing system, the display comprising a plurality of pixels located on the front side of the display substrate, the plurality of pixels defining a display area, the one or more cameras located within the display area; authenticating the user based at least in part on the captured one or more fingerprints, one or more thumbprints or a palmprint; and granting a privilege to the user.

Example 79 is the authentication method of example 78, wherein the prompt does not include an instruction for the user to touch a specific part of the display.

Example 80 is the authentication method of example 78, wherein the one or more fingerprints, the one or more thumbprints, or the palmprint are two or more fingerprints.

Example 81 is the authentication method of example 78, wherein the one or more fingerprints, one or more thumbprints, and/or a palmprint is a palmprint.

Example 82 is the authentication method of example 78, wherein the privilege is access to an application.

Example 83 is the authentication method of example 78, further comprising: determining a touch to the surface of the display based at least in part on image sensor data generated by one or more of the cameras; determining a touch location based at least in part on the image sensor data; and causing one or more pixels located at or in the vicinity of the touch location to emit light; wherein to capture one or more fingerprints, thumbprints and/or a palmprint based on image sensor data generated by one or more of the cameras comprises capturing the one or more fingerprints, thumbprints and/or a palmprint at the touch location.

Example 84 is the authentication method of example 78, wherein the privilege is access to content.

Example 85 is a touch detection method comprising: determining a touch to the surface of a display of a computing system based at least in part on image sensor data generated by one or more cameras of a plurality of cameras located on the front side of a display substrate of the display of the computing system, the display comprising a plurality of pixels located on the front side of the display substrate, the plurality of pixels defining a display area, the one or more cameras located within the display area; determining a touch location based at least in part on the image sensor data; and providing information indicating the presence of the touch and the touch location information to an operating system or an application.

Example 86 is the touch detection method of example 85, wherein the image sensor data indicates an amount of infrared light received at the one or more cameras.

Example 87 is the touch detection method of example 85, wherein to determine the touch to the surface of the display comprises determining that an amount of light received at the one or more cameras has dropped below a threshold.

Example 88 is the touch detection method of example 85, wherein to determine the touch to the surface of the display comprises determining that an amount of light received at the one or more cameras has dropped by a predetermined percentage or a predetermined amount.

Example 89 is the touch detection method of example 85, wherein to determine the touch to the surface of the display comprises determining that an amount of light received at the one or more cameras has dropped by a predetermined percentage or a predetermined amount within a predetermined amount of time.

Example 90 is the touch detection method of example 85, wherein to determine the touch location comprises determining the touch location based at least in part on the location of one of the one or more cameras within the display.

Example 91 is the touch detection method of example 85, wherein to determine the location of the touch based at least in part on the location within the display of the one or more cameras comprising determining a centroid of the locations of the one or more cameras within the display as the touch location.

Example 92 is an object rotation method, comprising: detecting selection of an object in an application operating on the system; detecting an amount of rotation of a physical object located in front of the screen based at least in part on image sensor data generated by one or more of cameras of a plurality of cameras located on the front side of a display substrate of a display of a computing system, the display comprising a plurality of pixels located on the front side of the display substrate, the plurality of pixels defining a display area, the one or more cameras located within the display area; and rotating the object in the application by an amount corresponding to the detected amount of rotation of the physical object.

Example 93 is an object deformation method comprising: detecting selection of an object in an application operating on the system; detecting an amount of rotation of a physical object located in front of the display based at least on image sensor data generated by one or more cameras of a plurality of cameras located on the front side of a display substrate of a display of a computing system, the display comprising a plurality of pixels located on the front side of the display substrate, the plurality of pixels defining a display area, the one or more cameras located within the display area; and deforming the object in the application by keeping an end of the object in the application stationary and rotating an opposite end of the object in the application by an amount corresponding to the detected amount of rotation of the physical object.

Example 94 is an object movement method comprising: detecting the selection of an object shown on a surface of a display of a computing system by detecting a pinch gesture on the display based at least in part on image sensor data generated a plurality of cameras located on the front side of a display substrate of a display, the display comprising a plurality of pixels located on the front side of the display substrate, the plurality of pixels defining a display area, the one or more cameras located within the display area, the selected object located at or in the vicinity of a pinch location of the pinch gesture; causing the appearance of the selected object to change from an unselected appearance to a selected appearance in response to the selection of the object; detecting the pinched fingers moving along a path from the pinch location to a destination location based at least in part on the image sensor data; detecting a portion of the path along which the pinched fingers are not in contact with the display; causing the object to move from the pinch location to the destination location on the display; detecting an unpinching gesture on the display at the destination location; and causing the appearance of the object to change from the selected appearance to the unselected appearance.

Example 95 is the object movement method of example 94, wherein the instructions stored on the one or more computer-readable media further cause the at least one processor to move the object along the portion of the path without the object interacting with other objects in the application that are also located along the portion of the path.

Example 96 is an object movement method comprising: detecting the selection of an object in an application shown on the display by detecting a pinch gesture on the display based at least in part on image sensor data from one or more of cameras of a plurality of cameras located on the front side of a display substrate of a display of a computing system, the display comprising a plurality of pixels located on the front side of the display substrate, the plurality of pixels defining a display area, the one or more cameras located within the display area, wherein the pinch gesture has a pinch location, the selected object located at or in the vicinity of the pinch location; detecting the pinched fingers moving away from the display surface; detecting the unpinching of the pinched fingers; determining a distance from the display surface at which the pinched fingers were unpinched; and generating a response in the application in response to detecting the unpinching of the pinched fingers, a magnitude of the response corresponding to the distance from the display surface at which the pinched fingers were unpinched.

Example 97 is a physiological trait detection method, further comprising: determining the value of one or more physiological traits based at least in part on image sensor data generated by one or more cameras of a plurality of cameras located on the front side of a display substrate of a display, the display comprising a plurality of pixels located on the front side of the display substrate, the plurality of pixels defining a display area, the one or more cameras located within the display area; and providing information to a user based on the value of the one or more physiological traits.

Example 98 is the physiological trait detection method of example 97, wherein the one or more physiological traits comprise at least one of a heart rate, a heart rate variability, and a respiratory rate.

Example 99 is one or more computer-readable media having instructions stored thereon that when executed cause one or more processors to perform the method of any of the claims 57-98.

Example 100 is an apparatus comprising means to perform a method as claimed in any of the preceding examples.

Example 101 is a computing system comprising: a display comprising a display substrate, the display substrate comprising a front side; a plurality of pixels located on the front side of the display substrate, the plurality of pixels defining a display area; and an image capturing means for capturing images and video, the image capturing means located on the front side of the display substrate and within the display area.

Example 102 is the computing system of Example 101, further comprising: at least one processor; and one or more computer-readable media comprising instructions stored thereon that when executed causes the at least one processor to: generate a composite image from image sensor data generated by the image capturing means; store the composite image; and display the composite image on the display.

Example 103 is the computing system of Example 101, wherein the composite image has a resolution greater than the highest resolution image capable of being generated by any of the individual cameras within the one or more cameras.

Example 104 is the computing system of Example 101, further comprising: a housing; at least one processor; and one or more computer-readable media, wherein the at least one processor, the display, and the one or more computer-readable media are located within the housing.

Example 105 is the computing system of Example 101, further comprising: a first housing that contains the display; and a second housing that contains at least one processor and one or more computer-readable media, wherein the first housing is communicatively coupled to the second housing.

Example 106 is the computing system of Example 101, wherein the plurality of pixels comprise micro-LEDs.

Example 107 is the computing system of Example 101, wherein the plurality of pixels comprise organic LEDs.

Example 108 is the computing system of Example 101, further comprising: at least one processor; and one or more computer-readable media comprising instructions stored thereon that when executed causes the at least one processor to: capture a plurality of original versions of an image, the individual original versions of the image based on image sensor data generated by the image capturing means, the individual original versions of the image having a depth of field different from the depths of field of the other original versions of the image; and store the original versions of the image.

Example 109 is the computing system of Example 108, wherein the instructions stored on the one or more computer-readable media further cause the at least one processor to: generate a new version of the image based on one or more of the original versions of the image, the new version having a new depth of field that is different from the depths of field of the original versions of the image; and store the new version of the image.

Example 110 is the computing system of Example 109, wherein the instructions stored on the one or more computer-readable media further cause the at least one processor to: receive a user selection of an object in one of the original versions of the image; and determine the new depth of field based at least in part on the selected object.

Example 111 is the computing system of Example 101, further comprising: at least one processor; and one or more computer-readable media comprising instructions stored thereon that when executed causes the at least one processor to: capture a plurality of views, the plurality of views defining a holographic image or video, individual of the views captured by the image capturing means, the individual views having associated view location information indicating the location within the display at which the individual views were captured by the imaging means; and store the plurality of views of the holographic image or video and the view location information associated with the views of the holographic image or video.

Example 112 is the computing system of Example 111, wherein the instructions stored on the one or more computer-readable media further cause the at least one processor to: track a user feature based on image sensor data generated by the imaging means; determine a position of the user feature; select a view of the plurality of views of the holographic image or video based at least on the determined position of the tracked user feature and the view location information associated with the plurality of views of the image of video; and cause the selected view of the holographic image or video to be shown on the display.

Example 113 is the computing system of Example 112, wherein the plurality of view of a holographic image or video is a plurality of views of a holographic video, the instructions stored on the one or more computer-readable media to further cause the at least one processor to transmit the plurality of views of the holographic video to a second system.

Example 114 is the computing system of Example 112, wherein the plurality of view of a holographic image or video is a plurality of views of a holographic video, the instructions stored on the one or more computer-readable media further cause the at least one processor to: receive information from a second system indicating a tracked position of a feature of a user of the second system; select one of the views of the plurality of views of the holographic video based at least on the information indicating a tracked position of the feature of the user of second system and the view location information associated with at least one of the plurality of views of the holographic video; and transmit the selected view of the holographic video to the second system.

Example 115 is the computing system of Example 114, wherein the instructions stored on the one or more computer-readable media further cause the at least one processor to cause the selected view of the holographic video to be shown on the display as a feedback view.

Example 116 is the computing system of Example 101, further comprising: at least one processor; and one or more computer-readable media comprising instructions stored thereon that when executed causes the at least one processor to: capture a plurality of views of a video, individual of the views comprising image sensor data generated by the imaging means, the individual views having associated view location information indicating the location within the display at which the individual views were captured by the imaging means; determine one or more avatar parameters for an avatar from the individual views of the video; and transmit the avatar parameters for the one or more of the views to a second system.

Example 117 is the computing system of Example 116, wherein the instructions stored on the one or more computer-readable media further cause the at least one processor to transmit the view location information associated with the one or more views transmitted to the second system.

Example 118 is the computing system of Example 116, wherein to determine one or more avatar parameters for the avatar from the individual views of the video comprises, for individual of the views, extracting one or more facial features from the individual view and converting the one or more facial features to the avatar parameters for the individual view.

Example 119 is the computing system of Example 116, wherein the instructions stored on the one or more computer-readable media further cause the at least one processor to: receive information indicating a tracked position of a feature of a user of the second system; and select a view of the plurality of views of the video based at least on the information indicating the tracked position of the feature of the user and the view location information associated with the plurality of views of the video; and wherein to transmit the avatar parameters for the one or more views to the second system comprises transmitting the avatar parameters for the selected view.

Example 120 is the computing system of Example 116, wherein the instructions stored on the one or more computer-readable media further cause the at least one processor to cause the avatar to be shown on the display as a feedback avatar.

Example 121 is the computing system of Example 101, further comprising: at least one processor; and one or more computer-readable media comprising instructions stored thereon that when executed causes the at least one processor to: prompt a user to touch one or more fingers, one or more thumbs, or a palm against the display; capture one or more fingerprints, one or more thumbprints, or a palmprint based on image sensor data generated by the imaging means; authenticate the user based at least on the captured one or more fingerprints, the one or more thumbprints, or a palmprint; and grant a privilege to the user.

Example 122 is the computing system of Example 121, wherein the prompt does not include an instruction for the user to touch a specific part of the display.

Example 123 is the computing system of Example 121, wherein the one or more fingerprints, the one or more thumbprints, or the palmprint are two or more fingerprints.

Example 124 is the computing system of Example 121, wherein the one or more fingerprints, one or more thumbprints, and/or a palmprint is a palmprint.

Example 125 is the computing system of Example 121, wherein the privilege is access to the system.

Example 126 is the computing system of Example 101, wherein the display further comprises a surface, the system further comprising: at least one processor; and one or more computer-readable media comprising instructions stored thereon that when executed causes the at least one processor to: determine a touch to the surface of the display based at least in part on image sensor data generated by the imaging means; determine a touch location based at least in part on the image sensor data; and provide information indicating the presence of the touch and the touch location information to an operating system or an application.

Example 127 is the computing system of Example 126, wherein the image sensor data indicates an amount of infrared light received at the one or more cameras.

Example 128 is the computing system of Example 126, wherein to determine the touch to the surface of the display comprises determining that an amount of light received at the one or more cameras has dropped below a threshold.

Example 129 is the computing system of Example 126, wherein to determine the touch to the surface of the display comprises determining that an amount of light received at the one or more cameras has dropped by a predetermined percentage or a predetermined amount.

Example 130 is the computing system of Example 126, wherein to determine the touch to the surface of the display comprises determining that an amount of light received at the one or more cameras has dropped by a predetermined percentage or a predetermined amount within a predetermined amount of time.

Example 131 is the computing system of Example 126, wherein to determine the touch location comprises determining the touch location based at least in part on the location of one of the one or more cameras within the display.

Example 132 is the computing system of Example 126, wherein to determine the location of the touch based at least in part on the location within the display of the one or more cameras comprising determining a centroid of the locations of the one or more cameras within the display as the touch location.

Example 133 is the computing system of Example 101, further comprising: at least one processor; and one or more computer-readable media comprising instructions stored thereon that when executed causes the at least one processor to: detect selection of an object in an application operating on the system; detect an amount of rotation of a physical object located in front of the display based at least on image sensor data generated by the imaging means; and rotate the object in the application by an amount corresponding to the detected amount of rotation of the physical object.

Example 134 is the computing system of Example 101, further comprising: at least one processor; and one or more computer-readable media comprising instructions stored thereon that when executed causes the at least one processor to: detect selection of an object in an application operating on the system; detect an amount of rotation of a physical object located in front of the display based at least on image sensor data generated by the imaging means; and deform the object in the application by keeping an end of the object in the application stationary and rotating an opposite end of the object in the application by an amount corresponding to the detected amount of rotation of the physical object.

Example 135 is the computing system of Example 101, further comprising: at least one processor; and one or more computer-readable media comprising instructions stored thereon that when executed causes the at least one processor to: detect the selection of an object shown on the display by detecting a pinch gesture on the display based at least in part on image sensor data generated by the imaging means, the selected object located at or in the vicinity of a pinch location of the pinch gesture; cause the appearance of the selected object to change from an unselected appearance to a selected appearance in response to the selection of the object; detect the pinched fingers moving along a path from the pinch location to a destination location based at least in part on the image sensor data; detect a portion of the path along which the pinched fingers are not in contact with the display; cause the object to move on the display from the pinch location to the destination location; detect an unpinching gesture on the display at the destination location; and cause the appearance of the object to change from the selected appearance to the unselected appearance.

Example 136 is the computing system of Example 135, wherein to cause the object to move on the display from the pinch location to the destination location comprises moving the object along the portion of the path without the object interacting with other objects in the application that are also located along the portion of the path.

Example 137 is the computing system of Example 101, wherein the display further comprises a surface, the system further comprising: at least one processor; and one or more computer-readable media comprising instructions stored thereon that when executed causes the at least one processor to: detect the selection of an object in an application shown on the display by detecting a pinch gesture on the display based at least in part on image sensor data from the imaging means, wherein the pinch gesture has a pinch location, the selected object located at or in the vicinity of the pinch location; detect the pinched fingers moving away from the display surface; detect the unpinching of the pinched fingers; determine a distance from the display surface at which the pinched fingers were unpinched; and generate a response in the application in response to detecting the unpinching of the pinched fingers, a magnitude of the response corresponding to the distance from the surface of the display at which the pinched fingers were unpinched.

Example 138 is the computing system of Example 101, further comprising: at least one processor; and one or more computer-readable media comprising instructions stored thereon that when executed causes the at least one processor to: determine the value of one or more physiological traits based at least in part on image sensor data generated by the imaging means; and providing information to a user based on the value of the one or more physiological traits.

Example 139 is the computing system of Example 138, wherein the one or more physiological traits comprise at least one of a heart rate, a heart rate variability, or a respiratory rate.

Example 140 is a computing system comprising: a display comprising a display substrate, the display substrate comprising a front side; a plurality of pixels located on the front side of the display substrate, the plurality of pixels defining a display area; and a plurality of display thermal sensors located on the front side of the display substrate and within the display area.

Example 141 is the computing system of Example 140, further comprising: at least one processor; and one or more computer-readable media comprising instructions stored thereon that when executed causes the at least one processor to: determine a display temperature based at least in part on thermal sensor data generated by one or more of the display thermal sensors; determine that the display temperature exceeds a display temperature threshold; and reduce a refresh rate of the display in response to determining that the display temperature exceeds a display temperature threshold.

Example 142 is the computing system of Example 140, further comprising: at least one processor; and one or more computer-readable media comprising instructions stored thereon that when executed causes the at least one processor to: determine a display temperature based at least in part on thermal sensor data generated by one or more of the display thermal sensors; determine that the display temperature exceeds a display temperature threshold; and reduce a brightness of the display in response to determining that the display temperature exceeds a display temperature threshold.

Example 143 is the computing system of Example 140, further comprising: at least one processor; and one or more computer-readable media comprising instructions stored thereon that when executed causes the at least one processor to: determine a display temperature based at least in part on thermal sensor data generated by one or more of the display thermal sensors; determine that the display temperature exceeds a display temperature threshold; and reduce a brightness of a portion of the display in response to determining that the display temperature exceeds a display temperature threshold.

Example 144 is the computing system of Example 140, further comprising: one or more additional thermal sensors; and one or more additional system components, the additional system components comprising at least one processor and one or more computer-readable media, the one or more computer-readable media comprising instructions stored thereon that when executed causes the at least one processor to: determine, based at least in part on display thermal sensor data generated by one or more of the display thermal sensors and additional thermal sensor data generated by one or more of the additional thermal sensors, that performance of the display or at least one of the additional system components can be increased without the computing system exceeding a system performance threshold; and increase the performance of the display or the at least one additional system components.

Example 145 is the computing system of Example 144, wherein to increase the performance of the display or the at least one additional system components comprises increasing the operating voltage of the at least one additional system components.

Example 146 is the computing system of Example 144, wherein to increase the performance of the display or the at least one additional system components comprises increasing the operating frequency of the at least one additional system components.

Example 147 is the computing system of Example 144, wherein to increase the performance of the display or the at least one additional system components comprises causing an increase in a brightness of the display.

Example 148 is the computing system of Example 144, wherein to increase the performance of the display or the at least one additional system components comprises causing an increase in a refresh rate of the display.

Example 149 is the computing system of Example 140, further comprising: one or more additional thermal sensors; and one or more additional system components, the additional system components comprising at least one processor and one or more computer-readable media, the one or more computer-readable media comprising instructions stored thereon that when executed causes the at least one processor to: determine, based at least in part on display thermal sensor data generated by one or more of the display thermal sensors and thermal sensor data generated by one or more of the additional thermal sensors that a system performance metric of the computing system exceeds a system performance threshold, a display performance metric of the display exceeds a display performance threshold, or a component performance metric of one of the additional system components exceeds a component performance threshold; and reduce the performance of the display or at least one of the additional system components.

Example 150 is the computing system of Example 149, wherein to reduce the performance of the display or the at least one additional system components comprises reducing the operating voltage of the at least one additional system components.

Example 151 is the computing system of Example 149, wherein to reduce the performance of the display or the at least one additional system components reducing the operating frequency of the at least one additional system components.

Example 152 is the computing system of Example 149, wherein to reduce the performance of the display or the at least one additional system components comprises causing a reduction in a brightness of the display.

Example 153 is the computing system of Example 149, wherein to reduce the performance of the display or the at least one additional system components comprises causing a reduction in a refresh rate of the display.

Example 154 is the computing system of Example 140, further comprising: at least one processor; and one or more computer-readable media, the one or more computer-readable media comprising instructions stored thereon that when executed causes the at least one processor to: monitor a usage time for a monitored pixel of the plurality of pixels, the monitored pixel comprising a plurality of display elements; and adjust a brightness of one or more of the display elements based at least in part on the usage time for the monitored pixel.

Example 155 is the computing system of Example 140, further comprising: at least one processor; and one or more computer-readable media, the one or more computer-readable media comprising instructions stored thereon that when executed causes the at least one processor to: monitor a usage temperature for at least one of the pixels, the usage temperature based at least in part on display thermal sensor data generated by the display thermal sensors, the monitored pixel comprising a plurality of display elements; and adjust a brightness of one or more of the display elements based at least in part on the usage temperature for the monitored pixel.

Example 156 is the computing system of Example 140, further comprising: at least one processor; and one or more computer-readable media, the one or more computer-readable media comprising instructions stored thereon that when executed causes the at least one processor to: retrieve a brightness manufacturing variation for a first pixel of the plurality of pixels, the first pixel comprising a plurality of display elements; and adjust a brightness of one or more of the display elements based at least in part on the brightness manufacturing variation when the first pixel is active.

Example 157 is the computing system of Example 140, further comprising: at least one processor; and one or more computer-readable media, the one or more computer-readable media comprising instructions stored thereon that when executed causes the at least one processor to: monitor a usage time for a monitored pixel of the plurality of pixels, the monitored pixel comprising a plurality of display elements; and adjust a brightness of one or more of the display elements based at least in part on the usage time for the monitored pixel.

Example 158 is the computing system of Example 140, further comprising: at least one processor; and one or more computer-readable media, the one or more computer-readable media comprising instructions stored thereon that when executed causes the at least one processor to: monitor a usage temperature for at least one of the pixels, the usage temperature based at least in part on display thermal sensor data generated by the display thermal sensors, the monitored pixel comprising a plurality of display elements; and adjust a color of one or more of the display elements based at least in part on the usage temperature for the monitored pixel.

Example 159 is the computing system of Example 140, the system further comprising: at least one processor; and one or more computer-readable media, the one or more computer-readable media comprising instructions stored thereon that when executed causes the at least one processor to: retrieve a color manufacturing variation for a first pixel of the plurality of pixels, the first pixel comprising a plurality of display elements; and adjust a color of one or more of the display elements based at least in part on the color manufacturing variation when the first pixel is active.

Example 160 is the computing system of Example 140, wherein the display further comprises a surface, the system further comprising: at least one processor; and one or more computer-readable media comprising instructions stored thereon that when executed causes the at least one processor to: determine a touch to the surface of the display based at least in part on display thermal data generated by one or more of the display thermal sensors; determine a touch location based at least in part on the display thermal sensor data; and provide information indicating the presence of the touch and the touch location information to an operating system or an application.

Example 161 is the computing system of Example 160, wherein to determine the touch to the surface of the display based at least in part on display thermal data generated by one or more of the display thermal sensors comprises determining that a temperature at one of the display thermal sensors has risen above a threshold.

Example 162 is the computing system of Example 160, wherein to determine the touch to the surface of the display based at least in part on display thermal data generated by one or more of the display thermal sensors comprises determining that a temperature at one of the display thermal sensors has increased by a predetermined percentage or a predetermined amount.

Example 163 is the computing system of Example 160, wherein to determine the touch to the surface of the display based at least in part on display thermal data generated by one or more of the display thermal sensors comprises determining that a temperature of one of the display thermal sensors has increased by a predetermined percentage or a predetermined amount within a predetermined amount of time.

Example 164 is the computing system of Example 160, wherein to determine the touch location based at least in part on the display thermal sensor data comprises determining the touch location based at least in part on the location of one of the display thermal sensors within the display.

Example 165 is the computing system of Example 160, wherein to determine the touch location based at least in part on the display thermal sensor data comprises determining as the touch location a centroid of the locations of one or more display thermal sensors within the display.

Example 166 is the computing system of Example 140, further comprising: a housing; at least one processor; and one or more computer-readable media, wherein the at least one processor, the display, and the one or more computer-readable media are located within the housing.

Example 167 is the computing system of Example 140, further comprising: a first housing that contains the display; and a second housing that contains at least one processor and one or more computer-readable media, wherein the first housing is communicatively coupled to the second housing.

Example 168 is the computing system of Example 140, wherein individual of the pixels occupy a pixel area and at least one of the display thermal sensors is located within the pixel area occupied by one of the pixels.

Example 169 is the computing system of Example 140, wherein at least one of the display thermal sensors spans multiple pixels.

Example 170 is the computing system of Example 140, wherein the plurality of pixels comprises micro-LEDs.

Example 171 is the computing system of Example 140, wherein the plurality of pixels comprises organic LEDs.

Example 172 is a display temperature control method comprising: determining a display temperature based at least in part on thermal sensor data generated by one or more display thermal sensors of a plurality of display thermal sensors located on the front side of a display substrate of a display of a computing system, the display comprising a plurality of pixels located on the front side of the display substrate, the plurality of pixels defining a display area, the one or more display thermal sensors located within the display area; determining that the display temperature exceeds a display temperature threshold; and reducing a refresh rate of the display in response to determining that the display temperature exceeds a display temperature threshold.

Example 173 is a display temperature control method comprising: determining a display temperature based at least in part on thermal sensor data generated by one or more display thermal sensors of a plurality of display thermal sensors located on the front side of a display substrate of a display of a computing system, the display comprising a plurality of pixels located on the front side of the display substrate, the plurality of pixels defining a display area, the one or more display thermal sensors located within the display area; determining that the display temperature exceeds a display temperature threshold; and reducing a brightness of the display in response to determining that the display temperature exceeds a display temperature threshold.

Example 174 is a display temperature control method comprising: determining a display temperature based at least in part on thermal sensor data generated by one or more display thermal sensors of a plurality of display thermal sensors located on the front side of a display substrate of a display of a computing system, the display comprising a plurality of pixels located on the front side of the display substrate, the plurality of pixels defining a display area, the one or more display thermal sensors located within the display area; determining that the display temperature exceeds a display temperature threshold; and reducing a brightness of a portion of the display in response to determining that the display temperature exceeds a display temperature threshold.

Example 175 is a system performance management method comprising: determining, based at least in part on i) display thermal sensor data generated by one or more display thermal sensors of a plurality of display thermal sensors located on the front side of a display substrate of a display of a computing system, the display comprising a plurality of pixels located on the front side of the display substrate, the plurality of pixels defining a display area, the one or more display thermal sensors located within the display area and ii) additional thermal sensor data generated by one or more additional thermal sensors, that performance of the display or one or more of the additional system components can be increased without exceeding one or more system performance thresholds; and increasing the performance of the display or the one or more additional system components.

Example 176 is the system performance management method of Example 175, wherein to increase the performance of the display or the one or more of the additional system components comprises increasing the operating voltage of the one or more additional system components.

Example 177 is the system performance management method of Example 175, wherein to increase the performance of the display or the one or more of the additional system components comprises increasing the operating frequency of the one or more additional system components.

Example 178 is the system performance management method of Example 175, wherein to increase the performance of the display or the one or more of the additional system components comprises causing an increase in a brightness of the display.

Example 179 is the system performance management method of Example 175, wherein to increase the performance of the display or the one or more of the additional system components comprises causing an increase in a refresh rate of the display.

Example 180 is a system performance management method comprising: determining, based at least in part on i) display thermal sensor data generated by one or more display thermal sensors of a plurality of display thermal sensors located on the front side of a display substrate of a display of a computing system, the display comprising a plurality of pixels located on the front side of the display substrate, the plurality of pixels defining a display area, the one or more display thermal sensors located within the display area and ii) additional thermal sensor data generated by one or more additional thermal sensors, that performance of the display or one or more of the additional system components can be increased without exceeding one or more system performance thresholds; and increasing the performance of the display or the one or more additional system components.

Example 181 is the system performance management method of Example 180, wherein to reduce the performance of the display or the one or more additional system components comprises reducing the operating voltage of the one or more additional system components.

Example 182 is the system performance management method of Example 180, wherein to reduce the performance of the display or the one or more additional system components reducing the operating frequency of the one or more additional system components.

Example 183 is the system performance management method of Example 180, wherein to reduce the performance of the display or the one or more additional system components comprises causing a reduction in a brightness of the display.

Example 184 is the system performance management method of Example 180, wherein to reduce the performance of the display or the one or more additional system components comprises causing a reduction in a refresh rate of the display.

Example 185 is a display performance adjustment method comprising: monitoring a usage time for a monitored pixel of a plurality of pixels located on a front of a display substrate of a display of a computing system, the monitored pixel comprising a plurality of display elements; and causing a brightness of one or more of the display elements of the monitored pixel to be adjusted based at least in part on the usage time for the monitored pixel.

Example 186 is a display performance adjustment method comprising: monitoring a usage temperature for a monitored pixel of a plurality of pixels located on a front of a display substrate of a display of a computing system, the plurality of pixels defining a display area, the display further comprising a plurality of display thermal sensors located on the front side of the display substrate, the monitored pixel comprising a plurality of display elements; and causing a brightness of one or more of the display elements of the monitored pixel to be adjusted based at least in part on the usage temperature for the monitored pixel.

Example 187 is a display performance adjustment method comprising: retrieving a brightness manufacturing variation for a first pixel of the plurality of pixels located on a front of a display substrate of a display of a computing system, the first pixel comprising a plurality of display elements; and causing a brightness of one or more of the display elements to be adjusted based at least in part on the brightness manufacturing variation when the first pixel is active.

Example 188 is a display performance adjustment method comprising: monitoring a usage time for a monitored pixel of a plurality of pixels located on a front of a display substrate of a display of a computing system; and cause a color of the monitored pixel to be adjusted based at least in part on the usage time for the monitored pixel.

Example 189 is a display performance adjustment method comprising: monitoring a usage temperature for a monitored pixel of a plurality of pixels located on a front of a display substrate of a display of a computing system, the plurality of pixels defining a display area, the display further comprising a plurality of display thermal sensors located on the front side of the display substrate; and cause a color of the monitored pixel to be adjusted based at least in part on the usage temperature for the monitored pixel.

Example 190 is a display performance adjustment method comprising: retrieve a color manufacturing variation for a first pixel of the plurality of pixels located on a front of a display substrate of a display of a computing system, the first pixel comprising one or more display elements; and cause a color of one or more of the display elements to be adjusted based at least in part on the color manufacturing variation when the first pixel is active.

Example 191 is a touch detection method comprising: determining a touch to the surface of the display based at least in part on display thermal sensor data generated by one or more display thermal sensors of a plurality of display thermal sensors located on the front side of a display substrate of a display of a computing system, the display comprising a plurality of pixels located on the front side of the display substrate, the plurality of pixels defining a display area, the one or more display thermal sensors located within the display area; determining a touch location based at least in part on the display thermal sensor data; and providing information indicating the presence of the touch and the touch location information to an operating system or an application.

Example 192 is the touch detection method of Example 191, wherein to determine the touch to the surface of the display based at least in part on display thermal data generated by one or more of the display thermal sensors comprises determining that a temperature at one of the display thermal sensors has risen above a threshold.

Example 193 is the touch detection method of Example 191, wherein to determine the touch to the surface of the display based at least in part on display thermal data generated by one or more of the display thermal sensors comprises determining that a temperature at one of the display thermal sensors has increased by a predetermined percentage or a predetermined amount.

Example 194 is the touch detection method of Example 191, wherein to determine the touch to the surface of the display based at least in part on display thermal data generated by one or more of the display thermal sensors comprises determining that a temperature of one of the display thermal sensors has increased by a predetermined percentage or a predetermined amount within a predetermined amount of time.

Example 195 is the touch detection method of Example 191, wherein to determine the touch location based at least in part on the display thermal sensor data comprises determining the touch location based at least in part on the location of one of the display thermal sensors within the display.

Example 196 is the touch detection method of Example 191, wherein to determine the touch location based at least in part on the display thermal sensor data comprises determining as the touch location a centroid of the locations of one or more of the display thermal sensors within the display.

Example 197 is one or more computer-readable media having instructions stored thereon that when executed cause one or more processors to perform the method of any of the claims 172-197.

Example 198 is an apparatus comprising means to perform a method as claimed in any of the claims 172-197.

Example 199 is a computing system comprising: a display comprising a display substrate, the display substrate comprising a front side; a plurality of pixels located on the front side of the display substrate, the plurality of pixels defining a display area; and a display thermal sensing means for generating display thermal data, the display thermal sensing means located on the front side of the display substrate and within the display area.

Example 200 is the computing system of Example 199, further comprising: at least one processor; and one or more computer-readable media comprising instructions stored thereon that when executed causes the at least one processor to: determine a display temperature based at least in part on the display thermal data; determine that the display temperature exceeds a display temperature threshold; and reduce a refresh rate of the display in response to determining that the display temperature exceeds a display temperature threshold.

Example 201 is the computing system of Example 199, further comprising: at least one processor; and one or more computer-readable media comprising instructions stored thereon that when executed causes the at least one processor to: determine a display temperature based at least in part on the display thermal data; determine that the display temperature exceeds a display temperature threshold; and reduce a brightness of the display in response to determining that the display temperature exceeds a display temperature threshold.

Example 202 is the computing system of Example 199, further comprising: one or more additional thermal sensors; and one or more additional system components, the additional system components comprising at least one processor and one or more computer-readable media, the one or more computer-readable media comprising instructions stored thereon that when executed causes the at least one processor to: determine, based at least in part on the display thermal data and additional thermal data generated by one or more of the additional thermal sensors, that performance of the display or at least one of the additional system components can be increased without exceeding one or more system performance thresholds; and increase the performance of the display or the at least one additional system components.

Example 203 is the computing system of Example 202, wherein to increase the performance of the display or the at least one of the additional system components comprises increasing the operating voltage of the at least one of the additional system components.

Example 204 is the computing system of Example 202, wherein to increase the performance of the display or the at least one of the additional system components comprises increasing the operating frequency of the at least one of the additional system components.

Example 205 is the computing system of Example 202, wherein to increase the performance of the display or the at least one of the additional system components comprises causing an increase in a brightness of the display.

Example 206 is the computing system of Example 202, wherein to increase the performance of the display or the at least one of the additional system components comprises causing an increase in a refresh rate of the display.

Example 207 is the computing system of Example 199, further comprising: one or more additional thermal sensors; and one or more additional system components, the additional system components comprising at least one processor and one or more computer-readable media, the one or more computer-readable media comprising instructions stored thereon that when executed causes the at least one processor to: determine, based at least in part on the display thermal data and thermal data generated by one or more of the additional thermal sensors that a system performance metric of the computing system exceeds one or more system performance thresholds; and reduce the performance of the display or one or more of the additional system components.

Example 208 is the computing system of Example 207, wherein to reduce the performance of the display or the one or more additional system components comprises reducing the operating voltage of the one or more additional system components.

Example 209 is the computing system of Example 207, wherein to reduce the performance of the display or the one or more additional system components reducing the operating frequency of the one or more additional system components.

Example 210 is the computing system of Example 207, wherein to reduce the performance of the display or the one or more additional system components comprises causing a reduction in a brightness of the display.

Example 211 is the computing system of Example 207, wherein to reduce the performance of the display or the one or more additional system components comprises causing a reduction in a refresh rate of the display.

Example 212 is the computing system of Example 199, further comprising: at least one processor; and one or more computer-readable media, the one or more computer-readable media comprising instructions stored thereon that when executed causes the at least one processor to: monitor a usage temperature for at least one of the pixels, the usage temperature based at least in part on display thermal sensor data generated by the display thermal sensors, the monitored pixel comprising a plurality of display elements; and cause a brightness of one or more of the display elements to be adjusted based at least in part on the usage temperature for the monitored pixel.

Example 213 is the computing system of Example 199, further comprising: at least one processor; and one or more computer-readable media, the one or more computer-readable media comprising instructions stored thereon that when executed causes the at least one processor to: monitor a usage temperature for at least one of the pixels, the usage temperature based at least in part on display thermal sensor data generated by the display thermal sensors, the monitored pixel comprising a plurality of display elements; and cause a color of one or more of the display elements to be adjusted based at least in part on the usage temperature for the monitored pixel.

Example 214 is the computing system of Example 199, wherein the display further comprises a surface, the system further comprising: at least one processor; and one or more computer-readable media comprising instructions stored thereon that when executed causes the at least one processor to: determine a touch to the surface of the display based at least in part on the display thermal data; determine a touch location based at least in part on the display thermal data; and provide information indicating the presence of the touch and the touch location information to an operating system or an application.

Example 215 is the computing system of Example 214, wherein to determine the touch to the surface of the display based at least in part on the display thermal data comprises determining that a display temperature has risen above a threshold.

Example 216 is the computing system of Example 214, wherein to determine the touch to the surface of the display based at least in part on the display thermal data comprises determining that a display temperature has increased by a predetermined percentage or a predetermined amount.

Example 217 is the computing system of Example 214, wherein to determine the touch to the surface of the display based at least in part on display thermal data comprises determining that a display temperature has increased by a predetermined percentage or a predetermined amount within a predetermined amount of time.

Example 218 is computing system comprising: a display comprising a display substrate, the display substrate comprising a front side; a plurality of pixels located on the front side of the display substrate, individual of the pixels comprising one or more display elements; and a plurality of microassemblies, individual of the microassemblies comprising a microlens assembly located above the display elements of one of the pixels, the microlens assemblies capable of adjusting a viewing cone angle of the pixel.

Example 219 is the computing system of Example 218, further comprising: at least one processor; and one or more computer-readable media comprising instructions stored thereon that when executed causes the at least one processor to: determine content to be displayed with reduced viewability; and cause the microassemblies located above a first set of the pixels located in an area within which the content is to be displayed to reduce viewability of the first set pixels by reducing their viewing cone angle.

Example 220 is a computing system comprising: a display comprising a display substrate, the display substrate comprising a front side; a plurality of pixels located on the front side of the display substrate; and a plurality of microassemblies, individual of the microassemblies having one or more of the pixels located thereon and capable of adjusting a viewing angle of the one or more pixels located thereon.

Example 221 is the computing system of Example 220, further comprising: at least one processor; and one or more computer-readable media comprising instructions stored thereon that when executed causes the at least one processor to: determine content to be displayed with reduced viewability; and cause the microassemblies corresponding to a first set of the pixels located in an area on the display within which the display context is to be displayed to reduce viewability of the first set pixels by adjusting their viewing angle.

Example 222 is the computing system of Example 219 or 221, wherein the instructions stored on the one or more computer-readable media further cause the at least one processor to determine a location of the computing device, wherein to determine the content to be displayed with reduced viewability comprises determining the content to be displayed with reduced viewability based at least in part on the location of the device.

Example 223 is the computing system of Example 219 or 221, wherein the instructions stored on the one or more computer-readable media further cause the at least one processor to determine a location of the computing device, wherein to determine that content to be displayed with reduced viewability comprises determining that the device is not in the vicinity of one or more user-designated private locations.

Example 224 is the computing system of Example 219 or 221, wherein to determine content to be displayed with reduced viewability comprises: searching the content for one or more sensitive information keywords or phrases; and determining the content to be displayed with reduced viewability if the content contains at least one of the sensitive information keywords of phrases.

Example 225 is the computing system of Example 219 or 221, wherein to determine content to be displayed with reduced viewability comprises: searching the content for one or more sensitive information images; and determining the content to be displayed with reduced viewability if the display contains at least one of the sensitive information images.

Example 226 is the computing system of Example 219 or 221, the pixels defining a display area, the computing system further comprising one or more cameras, wherein the instructions stored on the one or more computer-readable media further cause the at least one processor to: capture an image of a user with the one or more cameras; and determine an eye gaze location within the display area based at least in part on the image; and wherein to determine content to be displayed with reduced viewability comprises identifying the content as being located at the eye gaze location.

Example 227 is the computing system of Example 226 wherein the one or more cameras are in-display cameras.

Example 228 is the computing system of Example 226, wherein the instructions stored on the one or more computer-readable media further cause the at least one processor to: capture a second image of the user with the one or more cameras; determine a second eye gaze location within the display area based on the second image; determine second content to be displayed with reduced viewability based at least in part on the second eye gaze location; and cause the microlens assemblies located above a second set of the pixels located in a second area within which the second content is to be displayed to reduce viewability of the second set of pixels by reducing their viewing cone angle.

Example 229 is the computing system of Example 218, further comprising: at least one processor; and one or more computer-readable media comprising instructions stored thereon that when executed causes the at least one processor to: receive an indication from a user that content is to be displayed with reduced viewability; and cause the microlens assemblies located above a first set of the pixels located in an area within which the content is to be displayed to reduce viewability of the first set pixels by reducing their viewing cone angle.

Example 230 is the computing system of Example 229, wherein the receiving the indication from the user that content is to be displayed with reduced viewability further comprises: detecting a touch to the display; determining a touch location of the touch on the display; and determining the content based at least in part on the touch location.

Example 231 is the computing system of Example 229, wherein the receiving the indication from the user that content is to be displayed with reduced viewability further comprises: detecting a touch to the display; capturing an image of a user fingerprint in response to the detecting the touch to the display; and authenticating the user based at least in part on the fingerprint; wherein the content is displayed with reduced viewability in response to the user being authenticated.

Example 232 is a viewing angle adjustment method comprising: determine content to be displayed with reduced viewability on a display of a computing system, the display comprising a display substrate, the display substrate comprising a front side, a plurality of pixels located on the front side of the display substrate, the plurality of pixels defining a display area, individual of the pixels comprising one or more display elements, the display further comprising a plurality of microassemblies, individual of the microassemblies comprising a microlens assembly located above the display elements of one of the pixels, the microlens assemblies capable of adjusting a viewing cone angle; and cause the microassemblies located above a first set of the pixels located in an area on the display within which the content is to be displayed to reduce viewability of the first set pixels by reducing their viewing cone angle.

Example 233 is a viewing angle adjustment method comprising: determine content to be displayed with reduced viewability on a display of a computing system, the display comprising a display substrate, the display substrate comprising a front side, a plurality of pixels located on the front side of the display substrate, the plurality of pixels defining a display area, individual of the pixels comprising one or more display elements, the display further comprising a plurality of microassemblies, wherein one or more of the pixels are located on individual of the microassemblies, individual of the microassemblies capable of adjusting a viewing angle of the pixels located thereon; and cause the microassemblies corresponding to a first set of the pixels located in an area within which the display context is to be displayed to reduce viewability of the first set pixels by adjusting their viewing angle.

Example 234 is the viewing angle adjustment method of Example 232 or 233, wherein to determine the content to be displayed with reduced viewability comprises determining the content to be displayed with reduced viewability based at least in part on the location of the device.

Example 235 is the viewing angle adjustment method of Example 232 or 233, wherein to determine content to be displayed with reduced viewability comprises determining that the device is not in the vicinity of one or more user-designated private locations.

Example 236 is the viewing angle adjustment method of Example 232 or 233, wherein to determine content to be displayed with reduced viewability comprises: searching the content for one or more sensitive information keywords or phrases; and determining the content is to be displayed with reduced viewability if the content contains at least one of the sensitive information keywords of phrases.

Example 237 is the viewing angle adjustment method of Example 232 or 233, wherein to determine content to be displayed with reduced viewability comprises: searching the content for one or more sensitive information images; and determining the content is to be displayed with reduced viewability if the display contains at least one of the sensitive information images.

Example 238 is the viewing angle adjustment method of 232 or 233, the computing system further comprising one or more cameras, the method further comprising: capturing an image of a user with the one or more cameras; and determining an eye gaze location within the display area based at least in part on the image; and wherein to determine content to be display with reduced viewability comprises identifying the content as being located at the eye gaze location.

Example 239 is the viewing angle adjustment method of Example 238, the method further comprising: capturing a second image of the user with the one or more cameras; determining a second eye gaze location within the display area based on the second image; determining second content to be displayed with reduced viewability based at least in part on the second eye gaze location; and causing the microlens assemblies located above a second set of the pixels located in a second area on the display within which the second content is to be displayed to reduce viewability of the second set of pixels by reducing their viewing cone angle or viewing angle.

Example 240 is a viewing angle adjustment method comprising: receiving an indication from a user that content is to be displayed with reduced viewability, the display comprising a display substrate, the display substrate comprising a front side, a plurality of pixels located on the front side of the display substrate, the plurality of pixels defining a display area, individual of the pixels comprising one or more display elements, the display further comprising a plurality of microassemblies, individual of the microassemblies comprising a microlens assembly located above the display elements of one of the pixels, the microlens assemblies capable of adjusting a viewing cone angle; and causing the microlens assemblies located above a first set of the pixels located in an area within which the content is to be displayed to reduce viewability of the first set pixels by reducing their viewing cone angle.

Example 241 is the viewing angle adjustment method of Example 240, wherein the receiving the indication from the user that content is to be displayed with reduced viewability further comprises: detecting a touch to the display; determining a touch location of the touch on the display; and determining the content based at least in part on the touch location.

Example 242 is the viewing angle adjustment method of Example 240, wherein the receiving the indication from the user that content is to be displayed with reduced viewability further comprises: detecting a touch to the display; capturing an image of a user fingerprint in response to the detecting the touch to the display; and authenticating the user based at least in part on the fingerprint; and wherein the content is displayed with reduced viewability in response to the user being authenticated.

Example 243 is one or more computer-readable media having instructions stored thereon that when executed cause one or more processors to perform the method of any of the Examples 232-242.

Example 244 is an apparatus comprising means to perform a method as claimed in any of the claims 232-242.

Example 245 is a computing system comprising: a display comprising a display substrate, the display substrate comprising a front side; a plurality of pixels located on the front side of the display substrate, the plurality of pixels defining a display area, individual of the pixels comprising one or more display elements; and a viewing angle adjustment means for adjusting a viewing cone angle.

Example 246 is the computing system of Example 247, further comprising: at least one processor; and one or more computer-readable media comprising instructions stored thereon that when executed causes the at least one processor to: determine content to be displayed with reduced viewability; and cause the viewing angle adjustment to reduce the viewability of the content.

Example 247 is the computing system of Example 246, wherein the instructions stored on the one or more computer-readable media further cause the at least one processor to determine a location of the computing device, wherein to determine the content to be displayed with reduced viewability comprises determining the content to be displayed with reduced viewability based at least in part on the location of the device.

Example 248 is the computing system of Example 246, wherein the instructions stored on the one or more computer-readable media further cause the at least one processor to determine a location of the computing device, wherein to determine the content to be displayed with reduced viewability comprises determining that the device is not in the vicinity of one or more user-designated private locations.

Example 249 is the computing system of Example 246, wherein to determine content to be displayed with reduced viewability comprises: searching the content for one or more sensitive information keywords or phrases; and determining the content is to be displayed with reduced viewability if the content contains at least one of the sensitive information keywords of phrases.

Example 250 is the computing system of Example 246, wherein to determine content to be displayed with reduced viewability comprises: searching the content for one or more sensitive information images; and determining the content is to be displayed with reduced viewability if the display contains at least one of the sensitive information images.

Example 251 is the computing system of Example 246, further comprising one or more cameras, wherein the instructions stored on the one or more computer-readable media further cause the at least one processor to: capture an image of a user with the one or more cameras; and determine an eye gaze location within the display area based at least in part on the image; and wherein to determine content to be displayed with reduced viewability comprises identifying the content as being located at the eye gaze location.

Example 252 is the computing system of Example 251 wherein the one or more cameras are in-display cameras.

Example 253 is the computing system of Example 251, wherein the instructions stored on the one or more computer-readable media further cause the at least one processor to: capture a second image of the user with the one or more cameras; determine a second eye gaze location within the display area based on the second image; determine second content to be displayed with reduced viewability based at least in part on the second eye gaze location; and cause the microlens assemblies located above a second set of the pixels located in a second area within which the second content is to be displayed to reduce viewability of the second set of pixels by reducing their viewing cone angle.

Example 254 is the computing system of Example 245, further comprising: at least one processor; and one or more computer-readable media comprising instructions stored thereon that when executed causes the at least one processor to: receive an indication from a user that content is to be displayed with reduced viewability; and cause the viewing angle adjustment means to reduce the viewing of the content.

We claim:

1. A computing system comprising:
   a display comprising a display substrate, the display substrate comprising a front side;
   a plurality of pixels located on the front side of the display substrate;
   a plurality of display thermal sensors located on the front side of the display substrate and located within the plurality of pixels, wherein individual of the pixels comprise one or more display elements and occupy a pixel area comprising an amount of the pixel area occupied by the one or more display elements and a black matrix space not occupied by the one or more display elements, wherein one of the display thermal sensors is located in the black matrix space of one of the pixels;
   at least one processor; and
   one or more computer-readable media, the one or more computer-readable media comprising instructions stored thereon that, when executed, cause the at least one processor to:
      monitor a usage time for a monitored pixel of the plurality of pixels; and
      adjust a brightness of one of the one or more display elements of the monitored pixel based at least in part on the usage time for the monitored pixel.

2. The computing system of claim 1,
   wherein the instructions, when executed, further cause the at least one processor to:
   determine a display temperature based at least in part on thermal sensor data generated by one or more of the display thermal sensors;
   determine that the display temperature exceeds a display temperature threshold; and
   reduce a refresh rate of the display in response to determining that the display temperature exceeds the display temperature threshold.

3. The computing system of claim 1,
   wherein the instructions, when executed, further cause the at least one processor to:
   determine a display temperature based at least in part on thermal sensor data generated by one or more of the display thermal sensors;
   determine that the display temperature exceeds a display temperature threshold; and
   reduce a brightness of the display in response to determining that the display temperature exceeds the display temperature threshold.

4. The computing system of claim 1,
   wherein the instructions, when executed, further cause the at least one processor to:
   determine a display temperature based at least in part on thermal sensor data generated by one or more of the display thermal sensors;
   determine that the display temperature exceeds a display temperature threshold; and
   reduce a brightness of a portion of the display in response to determining that the display temperature exceeds the display temperature threshold.

5. The computing system of claim 1, further comprising:
   one or more additional thermal sensors; and
   one or more additional system components;
   wherein the additional system components comprises the at least one processor and the one or more computer-readable media, the instructions, when executed, further cause the at least one processor to:
   determine, based at least in part on display thermal sensor data generated by one or more of the display thermal sensors and additional thermal sensor data generated by at least one of the additional thermal sensors, that performance of the display or at least one of the additional system components can be increased without the computing system exceeding a system performance threshold; and
   increase the performance of the display or the at least one additional system component.

6. The computing system of claim 5, wherein to increase the performance of the display or the at least one additional system component comprises increasing an operating voltage or an operating frequency of the at least one of the additional system components.

7. The computing system of claim 5, wherein to increase the performance of the display or the at least one additional system component comprises causing an increase in a brightness of the display or a refresh rate of the display.

8. The computing system of claim 1,
   wherein the monitored pixel is a first monitored pixel, wherein the instructions, when executed, further cause the at least one processor to:
   monitor a usage temperature for a second monitored pixel of the plurality of pixels, the usage temperature based at least in part on display thermal sensor data generated by the display thermal sensors; and
   adjust a brightness of one of the display elements of the second monitored pixel based at least in part on the usage temperature for the second monitored pixel.

9. The computing system of claim 1,
   wherein the instructions, when executed, further cause the at least one processor to:
   retrieve a color manufacturing variation for a first pixel of the plurality of pixels, the first pixel comprising a plurality of display elements; and
   adjust a color of one or more of the plurality of display elements based at least in part on the color manufacturing variation when the first pixel is active.

10. The computing system of claim 1, further comprising a housing,
    wherein the at least one processor, the display, and the one or more computer-readable media are located within the housing.

11. The computing system of claim 1, further comprising:
a first housing that contains the display; and
a second housing that contains the at least one processor and the one or more computer-readable media, wherein the first housing is communicatively coupled via one or more wired connections to the second housing.

12. A display performance adjustment method comprising:
monitoring, by at least one processor of a computing system, a usage temperature for a monitored pixel of a plurality of pixels located on a front side of a display substrate of a display, the display further comprising a plurality of display thermal sensors located on the front side of the display substrate, individual of the pixels comprising one or more display elements and occupying a pixel area comprising an amount of the pixel area occupied by the one or more display elements and a black matrix space not occupied by the one or more display elements, the usage temperature based on one or more of the plurality of display thermal sensors, one of the display thermal sensors located in the black matrix space of one of the pixels; and
causing, by the at least one processor of the computing system, a color of one or more of the display elements of the monitored pixel to be adjusted based at least in part on the usage temperature for the monitored pixel.

13. The computing system of claim 1, wherein one of the display thermal sensors is a silicon diode temperature sensor.

14. A computing system comprising:
a display comprising a display substrate, the display substrate comprising a front side;
a plurality of pixels located on the front side of the display substrate;
a plurality of display thermal sensors located on the front side of the display substrate and located within the plurality of pixels, wherein individual of the plurality of pixels comprise one or more display elements and occupy a pixel area comprising an amount of the pixel area occupied by the one or more display elements and a black matrix space not occupied by the one or more display elements, wherein one of the plurality of display thermal sensors is located in the black matrix space of one of the plurality of pixels;
at least one processor; and
one or more computer-readable media, the one or more computer-readable media comprising instructions stored thereon that, when executed, cause the at least one processor to:
monitor a usage temperature for a monitored pixel of the plurality of pixels, the usage temperature based at least in part on display thermal sensor data generated by one or more display thermal sensors of the plurality of display thermal sensors; and
adjust a color of one of the one or more display elements of the monitored pixel based at least in part on the usage temperature for the monitored pixel.

15. The computing system of claim 14, wherein the display thermal sensor data generated by the one or more display thermal sensors of the plurality of display thermal sensors is first display thermal sensor data generated by one or more first display thermal sensors of the plurality of display thermal sensors, wherein the instructions, when executed, further cause the at least one processor to:
determine a display temperature based at least in part on second thermal sensor data generated by one or more second display thermal sensors of the plurality of display thermal sensors;
determine that the display temperature exceeds a display temperature threshold; and
reduce a refresh rate of the display in response to determining that the display temperature exceeds the display temperature threshold.

16. The computing system of claim 14, wherein the display thermal sensor data generated by the one or more display thermal sensors of the plurality of display thermal sensors is first display thermal sensor data generated by one or more first display thermal sensors of the plurality of display thermal sensors, wherein the instructions, when executed, further cause the at least one processor to:
determine a display temperature based at least in part on second thermal sensor data generated by one or more second display thermal sensors of the plurality of display thermal sensors;
determine that the display temperature exceeds a display temperature threshold; and
reduce a brightness of the display in response to determining that the display temperature exceeds the display temperature threshold.

17. The computing system of claim 14, wherein the display thermal sensor data generated by the one or more display thermal sensors of the plurality of display thermal sensors is first display thermal sensor data generated by one or more first display thermal sensors of the plurality of display thermal sensors, wherein the instructions, when executed, further cause the at least one processor to:
determine a display temperature based at least in part on second thermal sensor data generated by one or more second display thermal sensors of the plurality of display thermal sensors; and
determine that the display temperature exceeds a display temperature threshold; and
reduce a brightness of a portion of the display in response to determining that the display temperature exceeds the display temperature threshold.

18. The computing system of claim 14, wherein the display thermal sensor data generated by the one or more display thermal sensors of the plurality of display thermal sensors is first display thermal sensor data generated by one or more first display thermal sensors of the plurality of display thermal sensors, the computing system further comprising:
one or more additional thermal sensors; and
one or more additional system components, the one or more additional system components comprising the at least one processor and the one or more computer-readable media, the instructions, when executed, further cause the at least one processor to:
determine, based at least in part on second display thermal sensor data generated by one or more second display thermal sensors of the plurality of display thermal sensors and additional thermal sensor data generated by at least one of the one or more additional thermal sensors, that performance of the display or at least one of the one or more additional system components can be increased without the computing system exceeding a system performance threshold; and
increase the performance of the display or at least one of the one or more additional system components.

19. The computing system of claim 18, wherein to increase the performance of the display or the at least one of the one or more additional system components comprises increasing an operating voltage or an operating frequency of the at least one of the one or more additional system components.

20. The computing system of claim 18, wherein to increase the performance of the display or the at least one of the one or more additional system components comprises causing an increase in a brightness of the display or a refresh rate of the display.

21. The computing system of claim 14, wherein the display thermal sensor data generated by the one or more display thermal sensors of the plurality of display thermal sensors is first display thermal sensor data generated by one or more first display thermal sensors of the plurality of display thermal sensors, wherein the instructions, when executed, further cause the at least one processor to:
monitor a usage temperature for a monitored pixel of the plurality of pixels, the usage temperature based at least in part on second display thermal sensor data generated by one or more second display thermal sensors of the plurality of display thermal sensors; and
adjust a brightness of one or more of the one or more display elements of the monitored pixel based at least in part on the usage temperature for the monitored pixel.

22. The computing system of claim 14, further comprising a housing, wherein the at least one processor, the display, and the one or more computer-readable media are located within the housing.

23. The computing system of claim 14, further comprising:
a first housing that contains the display; and
a second housing that contains at least one processor and one or more computer-readable media, wherein the first housing is communicatively coupled via one or more wired connections to the second housing.

* * * * *